(12) United States Patent
Wakabayashi et al.

(10) Patent No.: US 9,077,919 B2
(45) Date of Patent: *Jul. 7, 2015

(54) SOLID-STATE IMAGING DEVICE, IMAGING DEVICE, ELECTRONIC EQUIPMENT, A/D CONVERTER AND A/D CONVERSION METHOD

(71) Applicant: Sony Corporation, Tokyo (JP)

(72) Inventors: Hayato Wakabayashi, Tokyo (JP); Masaru Kikuchi, Kanagawa (JP); Hiroshi Iwasa, Kanagawa (JP); Yuuki Yamagata, Kanagawa (JP)

(73) Assignee: SONY CORPORATION (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/244,482

(22) Filed: Apr. 3, 2014

(65) Prior Publication Data

US 2014/0211055 A1    Jul. 31, 2014

Related U.S. Application Data

(63) Continuation of application No. 13/936,563, filed on Jul. 8, 2013, now Pat. No. 8,743,254, which is a continuation of application No. 12/994,035, filed as application No. PCT/JP2009/060223 on Jun. 4, 2009, now Pat. No. 8,502,899.

(30) Foreign Application Priority Data

Jun. 6, 2008  (JP) .................................. 2008-149168

(51) Int. Cl.
*H04N 5/357*   (2011.01)
*H04N 5/335*   (2011.01)
(Continued)

(52) U.S. Cl.
CPC ............... *H04N 5/357* (2013.01); *H04N 5/335* (2013.10); *H03M 1/0658* (2013.01);
(Continued)

(58) Field of Classification Search
CPC ............................... H04N 5/335; H04N 3/155
USPC ........................................................ 348/302
See application file for complete search history.

(56) References Cited

U.S. PATENT DOCUMENTS

2004/0021787 A1* 2/2004 Cho ............................. 348/308
2007/0008206 A1* 1/2007 Tooyama et al. ............. 341/155

FOREIGN PATENT DOCUMENTS

JP        2008-067357        3/2008

OTHER PUBLICATIONS

Official Action (with English translation) for Korean Patent Application No. 10-2010-7026571 mailed Apr. 27, 2015, 9 pages.

*Primary Examiner* — Twyler Haskins
*Assistant Examiner* — Fayez Bhuiyan
(74) *Attorney, Agent, or Firm* — Sheridan Ross P.C.

(57) ABSTRACT

In a reference signal comparison AD conversion scheme, a reference signal SLP_ADC and each of P and D phases of a pixel signal voltage Vx are compared. A count clock CKcnt1 is counted based on the comparison result. The counting result data is converted into signal data Dsig, i.e., the difference between the P and D phases, which is also subjected to CDS. At this time, the n-bit AD conversion is performed on each of the P and D phases of the pixel signal voltage Vx, followed by summation for digital integration. This prevents any possible detrimental effects that may be caused by summation in the analog domain. Although the signal data becomes W times greater, noise will likely become $\sqrt{W}$ times greater. This alleviates the problem of random noise resulting from AD conversion such as quantizing noise and circuit noise that do not exist in the analog domain, thus reducing the noise.

20 Claims, 31 Drawing Sheets

(51) Int. Cl.
*H03M 1/06* (2006.01)
*H03M 1/10* (2006.01)
*H04N 5/378* (2011.01)
*H03M 1/34* (2006.01)
*H03M 1/08* (2006.01)
*H04N 5/3745* (2011.01)
*H03M 1/12* (2006.01)
*H03M 1/56* (2006.01)
*H03M 1/74* (2006.01)

(52) U.S. Cl.
CPC ........... *H03M 1/1023* (2013.01); *H03M 1/123* (2013.01); *H03M 1/129* (2013.01); *H03M 1/56* (2013.01); *H03M 1/745* (2013.01); *H04N 5/378* (2013.01); *H03M 1/34* (2013.01); *H03M 1/08* (2013.01); *H04N 5/37455* (2013.01)

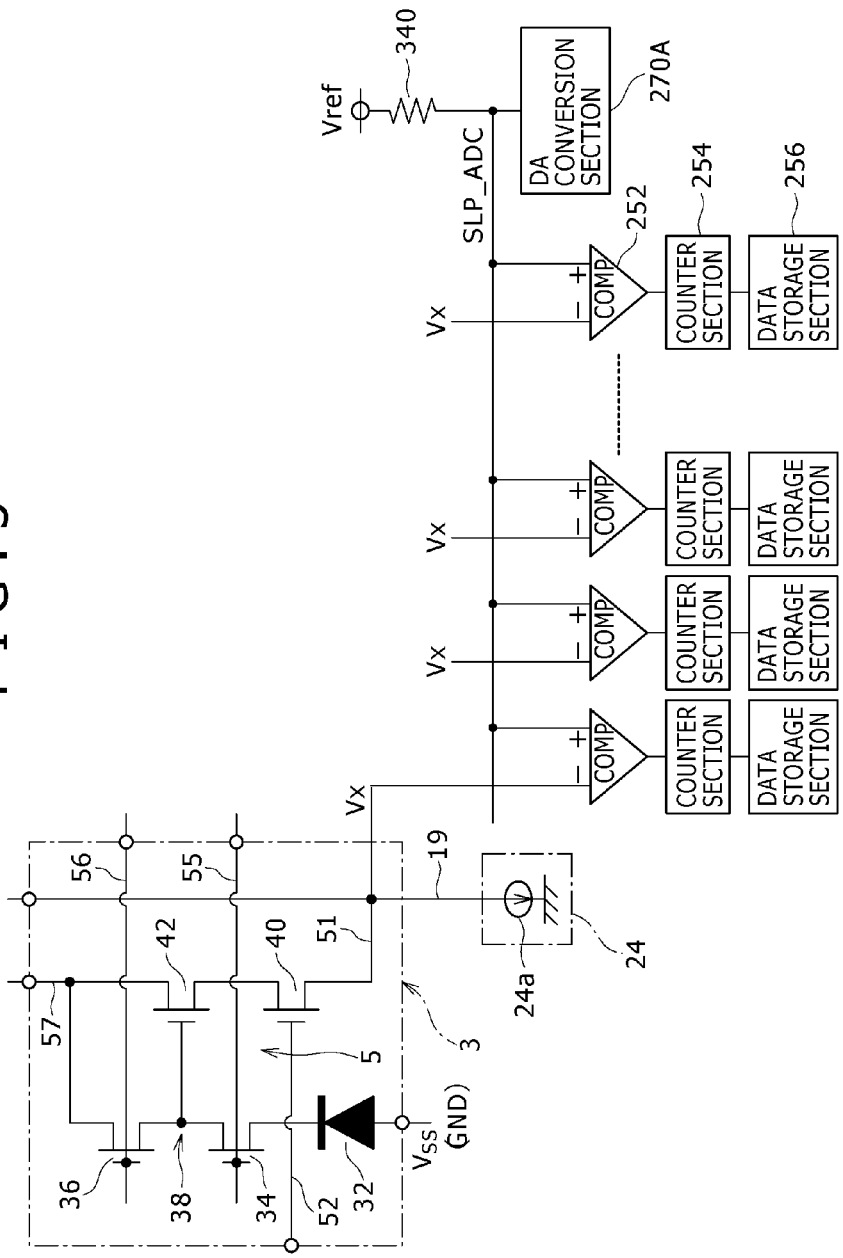

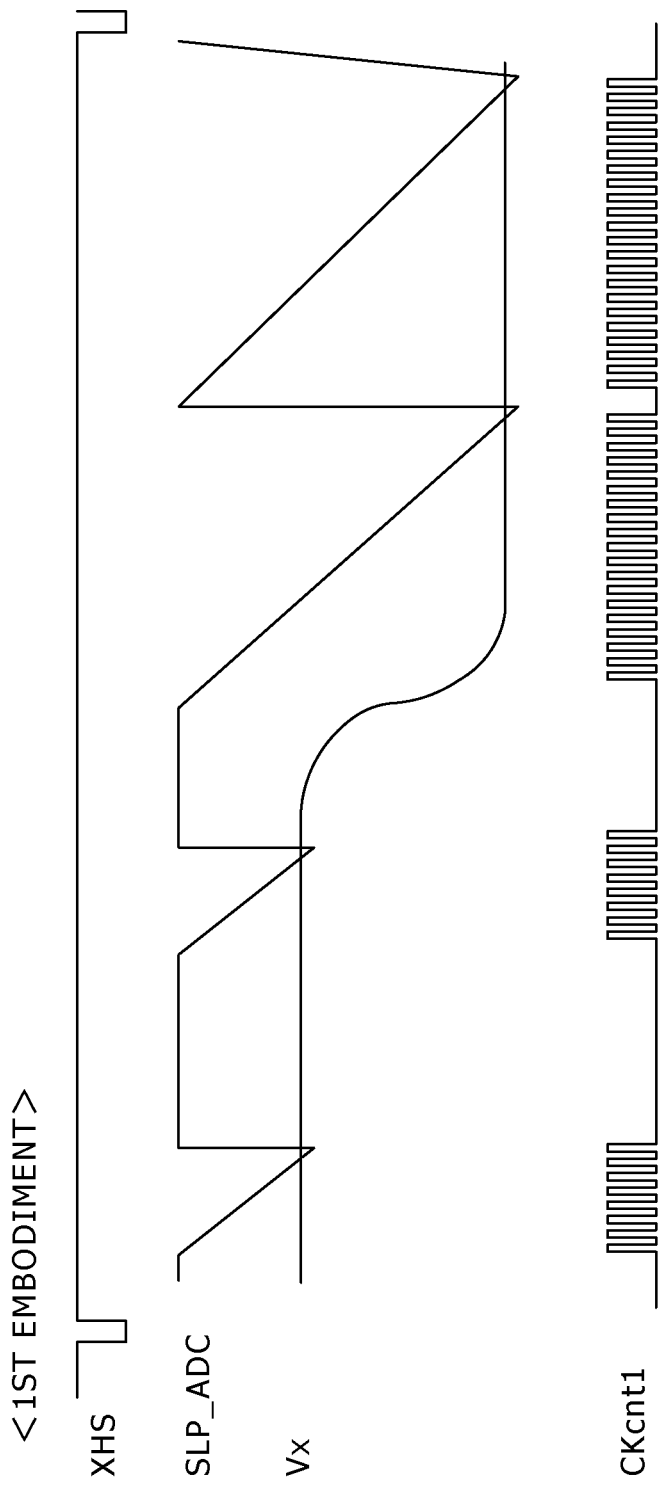

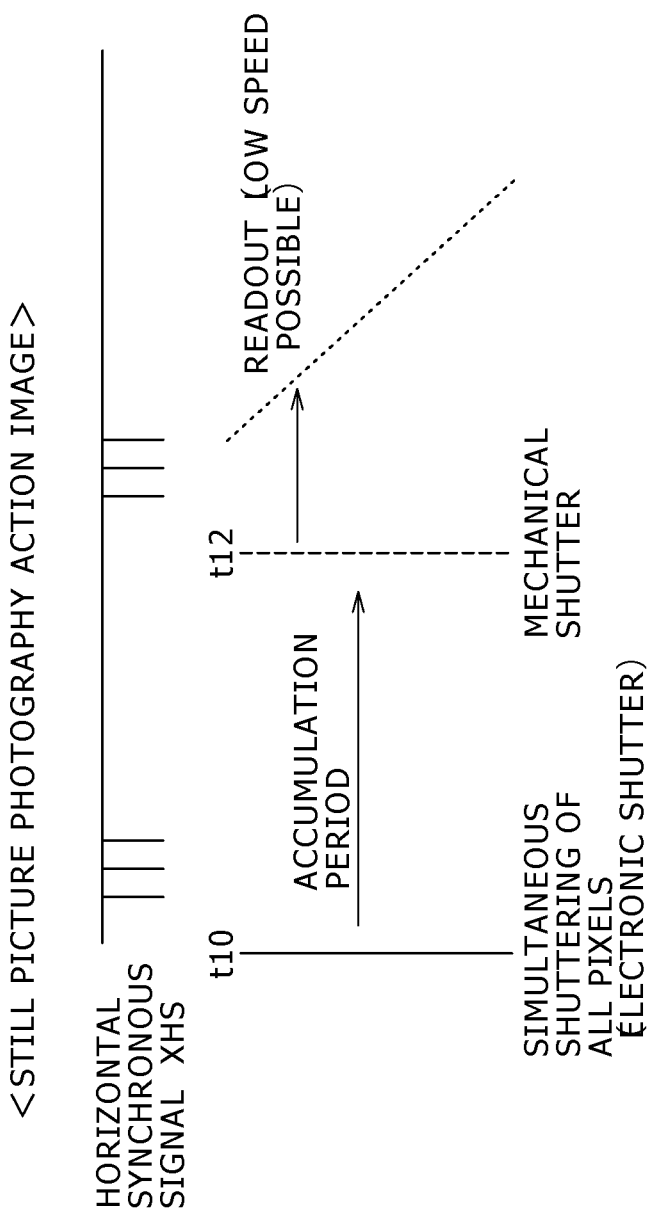

FIG. 5A
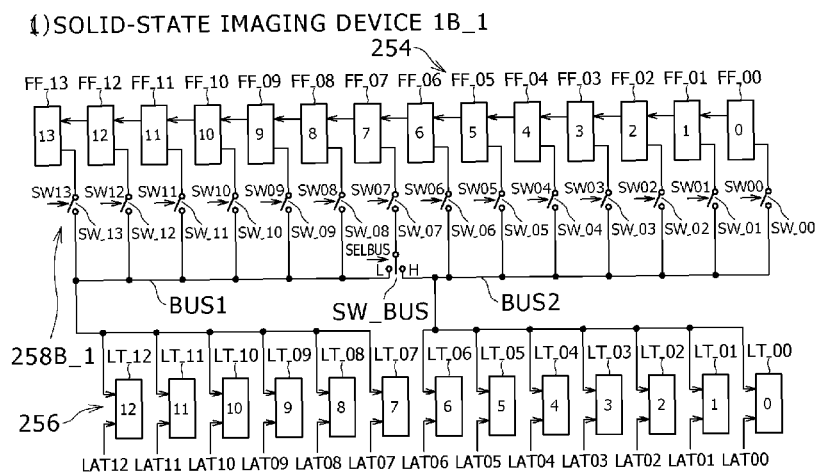
1) SOLID-STATE IMAGING DEVICE 1B_1
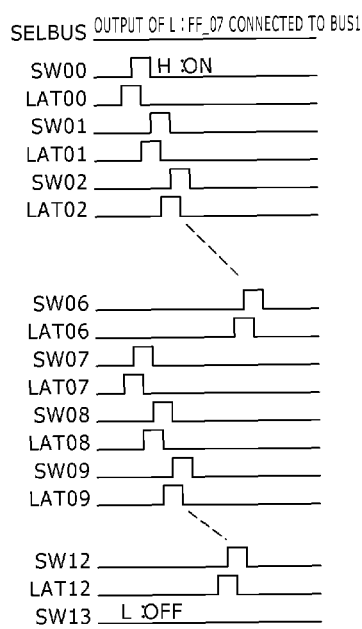
2-1) NORMAL OPERATION
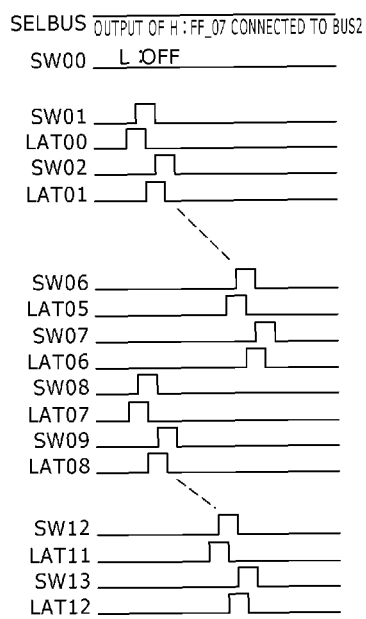
2-2) TWO-TIME SUMMATION AD CONVERSION

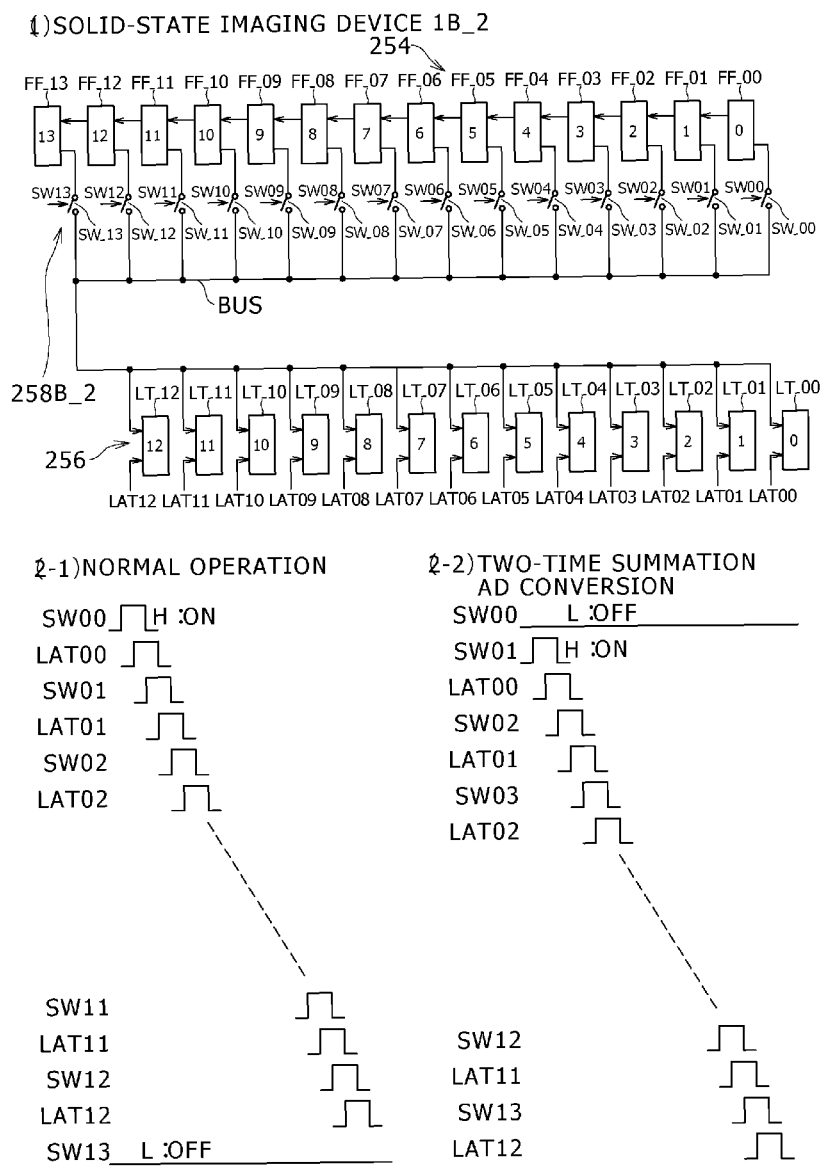

FIG.6A
<3RD EMBODIMENT>
1) GENERATION OF REFERENCE SIGNAL SLP_ADC
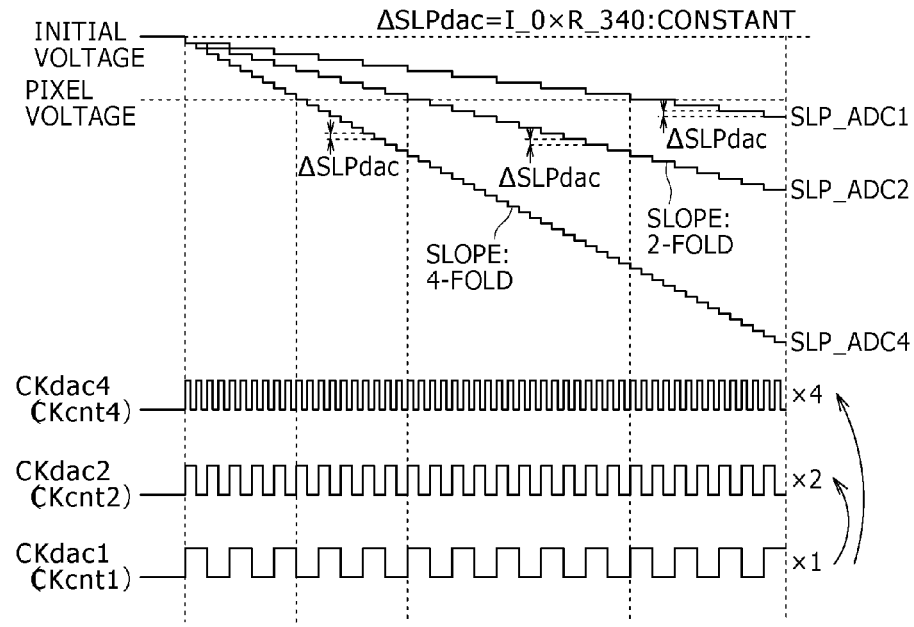
2) OVERALL OPERATION
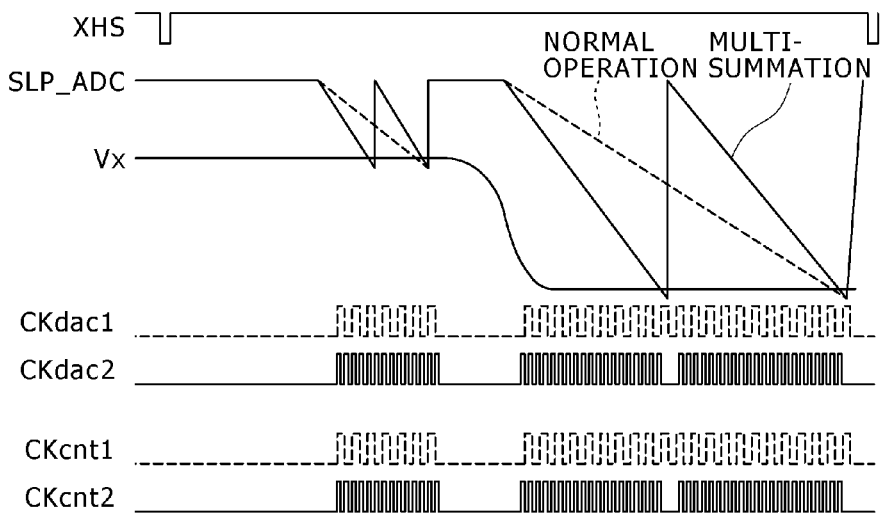

FIG. 7B
<4TH EMBODIMENT>
1) GENERATION OF REFERENCE SIGNAL SLP_ADC
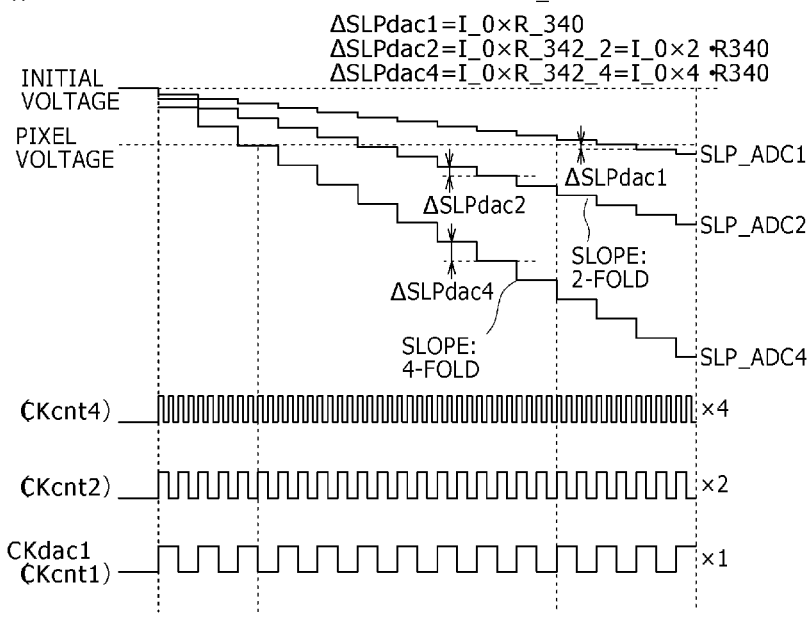
$\Delta SLPdac1 = I\_0 \times R\_340$
$\Delta SLPdac2 = I\_0 \times R\_342\_2 = I\_0 \times 2 \cdot R340$
$\Delta SLPdac4 = I\_0 \times R\_342\_4 = I\_0 \times 4 \cdot R340$
2) OVERALL OPERATION
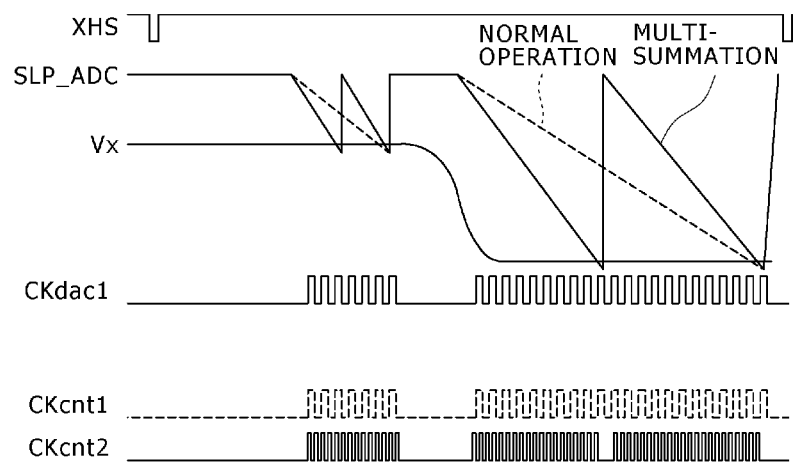

F I G . 8
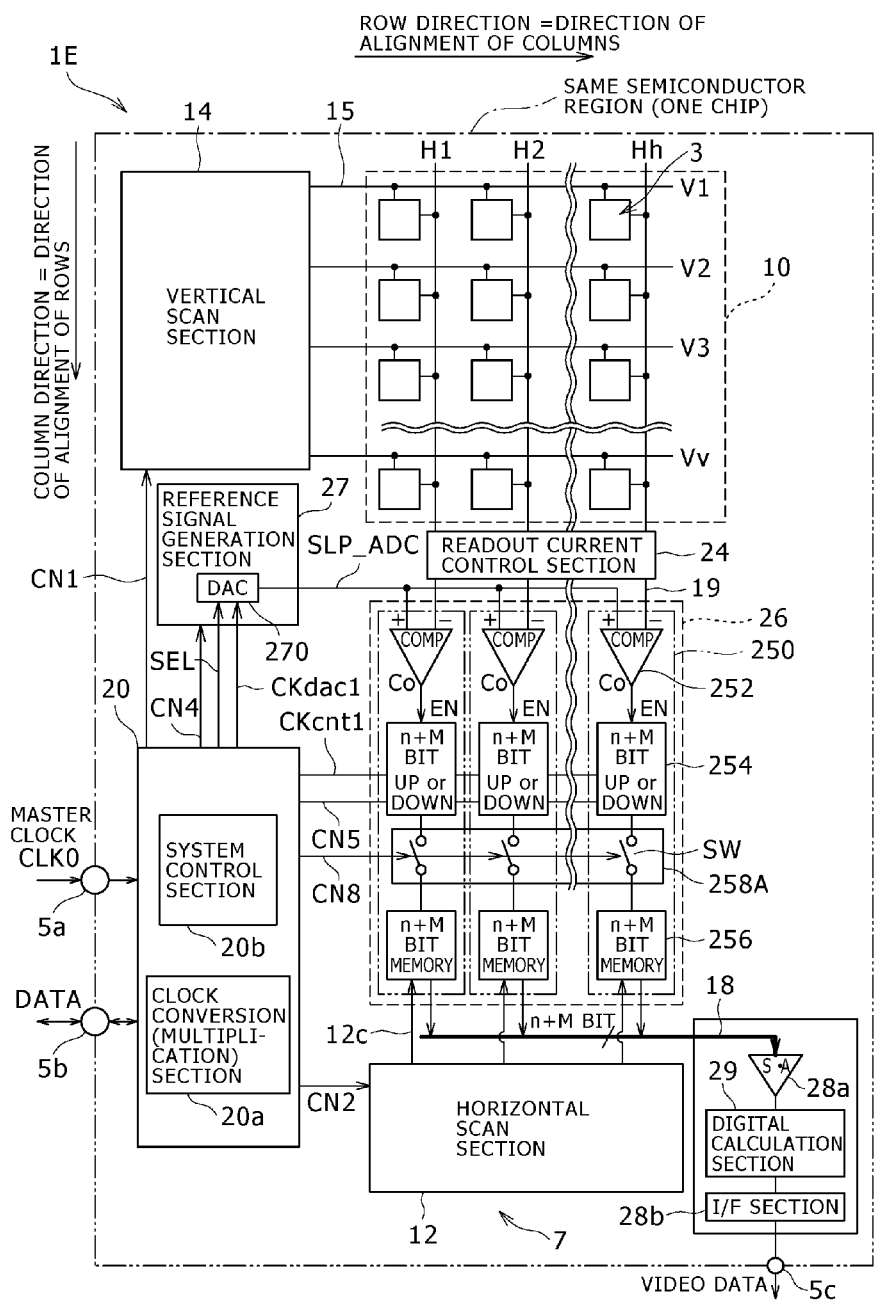

OVERALL OPERATION (7TH EMBODIMENT)

OVERALL OPERATION (7TH EMBODIMENT)

OVERALL OPERATION (8TH EMBODIMENT)

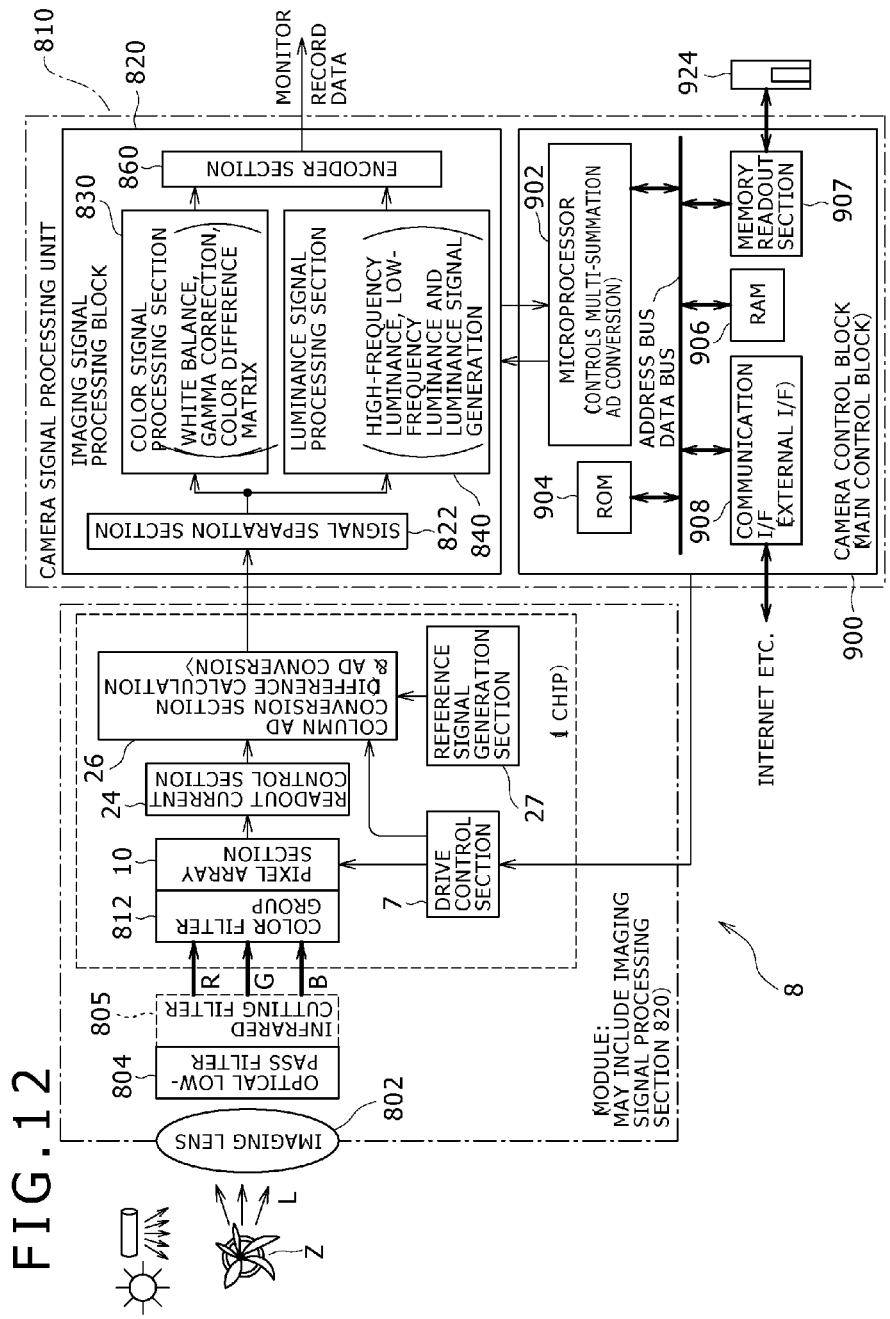

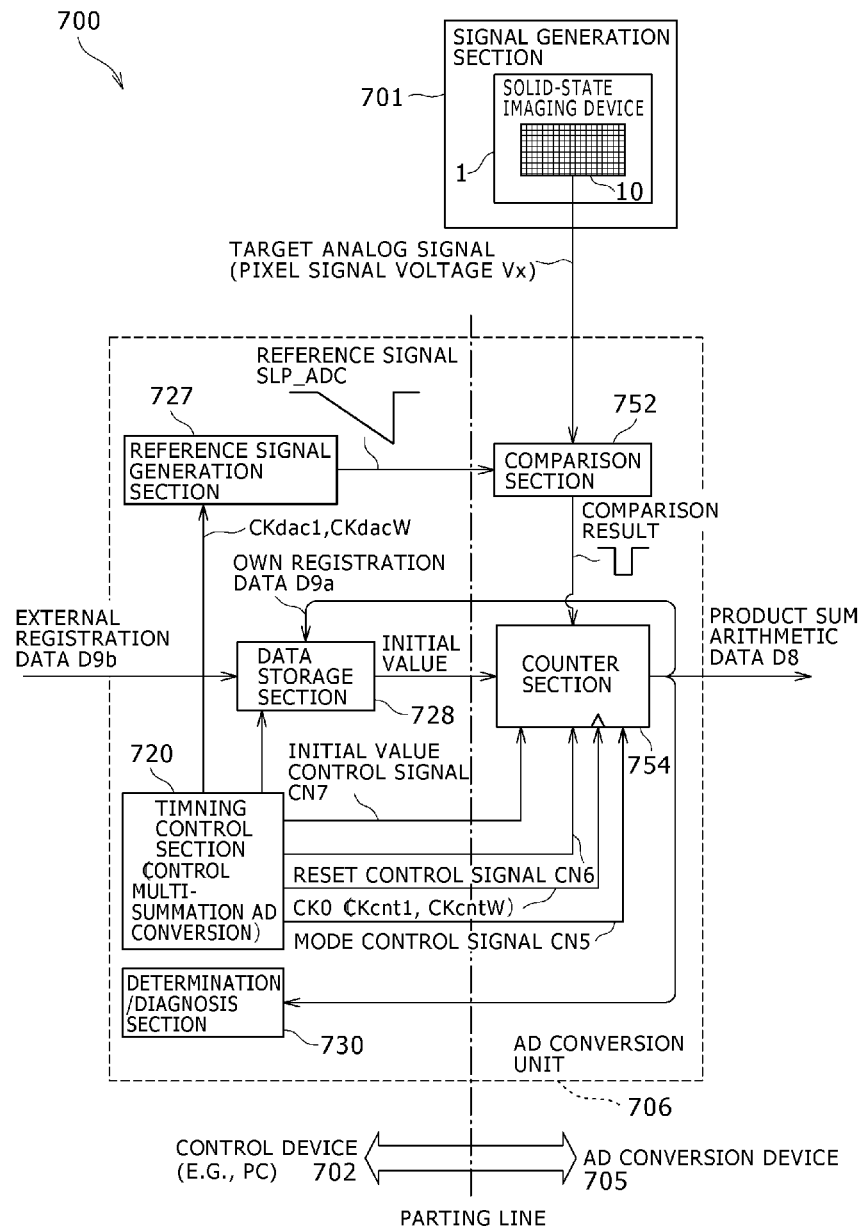

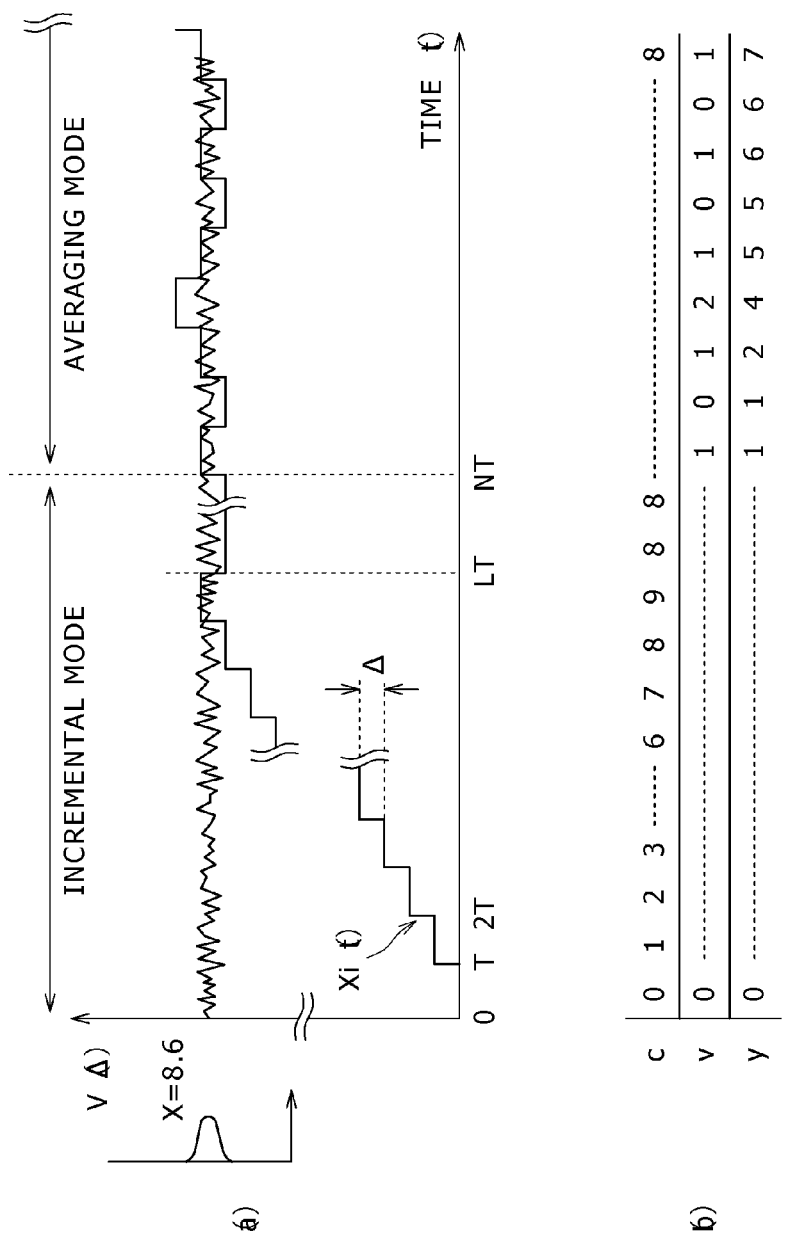

SOLID-STATE IMAGING DEVICE, IMAGING DEVICE, ELECTRONIC EQUIPMENT, A/D CONVERTER AND A/D CONVERSION METHOD

CROSS-REFERENCE TO RELATED APPLICATIONS

This application is a continuation of U.S. patent application Ser. No. 13/936,563, filed Jul. 8, 2013, which is a continuation of U.S. patent application Ser. No. 12/994,035, filed Nov. 22, 2010, now U.S. Pat. No. 8,502,899, which is a 371 of international PCT Application PCT/JP2009/060223, filed Jun. 4, 2009, which claims priority to Japanese Patent Application Serial No. JP 2008-149168, filed in the Japan Patent Office on Jun. 6, 2008, the entire disclosures of which are hereby incorporated herein by reference.

TECHNICAL FIELD

The present invention relates to a solid-state imaging device, imaging device, electronic equipment, A/D converter and A/D conversion method. The present invention relates more particularly to an A/D conversion technique that is suitably applicable to a semiconductor device or other electronic equipment adapted to detect a physical quantity distribution such as a solid-state imaging device which includes a plurality of unit components responsive to externally supplied electromagnetic wave such as light or radiation and from which a physical quantity distribution, converted into an electric signal by the unit components, can be arbitrarily selected and read out as an electric signal through address control.

BACKGROUND ART

Semiconductor devices adapted to detect a physical quantity distribution and which include a plurality of unit components (e.g., pixels) arranged in lines or in a matrix are used in a variety of fields. These unit components are responsive to externally supplied electromagnetic wave such as light or radiation.

In the field of video equipment, for example, CCD (Charge Coupled Device), MOS (Metal Oxide Semiconductor) and CMOS (Complementary Metal-oxide Semiconductor) solid-state imaging devices are used to detect light of all physical quantities (example of electromagnetic waves). In these solid-state imaging devices, a physical quantity distribution, converted into an electric signal by the unit components (pixels, in the case of solid-state imaging device), is read out as an electric signal.

On the other hand, some solid-state imaging devices are amplifying solid-state imaging devices. Such solid-state imaging devices have pixels each of which includes an amplifying solid-state imaging element (also referred to as Active Pixel Sensor or APS). An APS has an amplifying drive transistor in a pixel signal generation section adapted to generate a pixel signal commensurate with the signal charge generated by a charge generation section. For example, many CMOS solid-state imaging devices are configured in this manner.

In order to read out a pixel signal from an amplifying solid-state imaging device configured as described above, a pixel section having a plurality of unit pixels arranged therein is address-controlled so that a signal from a given unit pixel can be arbitrarily selected and read out. That is, an amplifying solid-state imaging device is an example of an address-controlled solid-state imaging device.

In an amplifying solid-state imaging element which is an example of an X-Y address solid-state imaging element in which unit pixels are arranged in matrix, for example, a pixel includes MOS-structured or other active elements (MOS transistors) to provide the pixel itself with amplifying capability. That is, a signal charge (photoelectrons) accumulated in a photodiode, i.e., a photoelectric conversion element, is amplified by the active element and read out as image information.

In this type of X-Y address solid-state imaging element, for example, many pixel transistors are arranged in a two-dimensional matrix form to make up a pixel section. The accumulation of a signal charge commensurate with the incident light begins on a line-by-line or pixel-by-pixel basis. The current or voltage signal based on the accumulated signal charge is read out from each pixel through address specification. Here, in MOS (including CMOS) type, column readout scheme (column parallel output scheme) is often used as an example of address control. The column readout scheme is designed to access a row of pixels at the same time, thus reading out a pixel signal from the pixel section on a row-by-row basis. The analog pixel signal read out from the pixel section is converted as necessary into digital data by an analog-to-digital converter (ADC). Therefore, a variety of arrangements for AD conversion have been proposed.

Various schemes have been devised as an AD conversion scheme from the viewpoint of circuit scale, processing speed (speedup), resolution and other factors. The reference signal comparison AD conversion scheme (refer to Patent Document 1) is an example of such various schemes. It should be noted that the reference signal comparison scheme is also referred to as the slope integration or ramp signal comparison scheme. The reference signal comparison AD conversion scheme uses a so-called ramped reference signal (ramp wave) for comparison with the voltage to be converted into digital data. The value of the ramped reference signal changes gradually. The analog unit signal and reference signals are compared. At the same time, the counting is performed during a counting enabled period based on the comparison result, thus acquiring digital data of the unit signal based on the count value. By using a scheme combining the reference signal comparison AD conversion scheme and the column readout scheme (referred to as the column AD scheme) described earlier, it is possible to achieve AD conversion of the analog outputs from the pixels in a column parallel manner at a low frequency band. Therefore, it can be said that this scheme is appropriate for image sensors which combine high image quality and high speed.

For example, recent years have witnessed widespread use of CMOS sensors in mobile phones, digital cameras (compact types and upscale single lens reflex types), camcorders, monitoring cameras, guiding devices and others for their superiority in terms of low power consumption and high speed. Further, CMOS sensors offering high performance and high image quality have come along lately. These CMOS sensors are integrated into a single chip with functional circuit blocks for image processing and other purposes. The reference signal comparison AD conversion scheme is probably applicable to such CMOS sensors.

FIG. 18 is a diagram illustrating a configuration example of a conventional solid-state imaging device 1Z using the reference signal comparison AD conversion scheme. The solid-state imaging device 1Z includes a pixel array section 10, horizontal scan section 12, vertical scan section 14, PLL circuit 20x, system control unit 20y adapted to control the solid-state imaging device 1Z as a whole, column AD conversion section 26, reference signal generation section 27 adapted to generate a reference signal SLP_ADC, sense amplifier 28a, signal processing/interface section 28z and other components. The pixel array section 10 includes unit pixels 3 arranged in a two-dimensional matrix form. The PLL circuit 20x generates an internal clock CKX based on an externally supplied basic clock CK, supplying the internal clock CKX to the reference signal generation section 27 and a counter section 254.

The column AD conversion section 26 includes a comparison section 252 and the counter section 254 for each column. As an example, the counter section 254 is a ripple counter with 13 stages of latches LT_00 to LT_12 connected in series. Further, the counter section 254 is a 13-bit counter that can be switched between up-counting and down-counting modes.

Data D0 to D12 output from the counter section 254 is transmitted to the sense amplifier 28a via horizontal signal lines 18 at a small amplitude level (e.g., several 100 mVp-p). The sense amplifier 28a amplifies the data D0 to D12 having a small amplitude level to a logic level (e.g., 2 to 3 Vp-p), delivering the data to the signal processing/interface section 28z. The signal processing/interface section 28z performs predetermined digital signal processing on the 13-bit data D0 to D12, changing this data into 12-bit output data Dout (D0 to D11) and delivering the data to the unshown circuit at the succeeding stage.

AD conversion is performed as follows. First, a pixel signal voltage Vx is read out by the column AD conversion section 26 from the unit pixel 3 via a vertical signal line 19. The comparison section 252 compares the pixel signal voltage Vx against the reference signal SLP_ADC supplied from the reference signal generation section 27, supplying the comparison result to the latch LT_00 at the first stage of the counter section 254. The latch LT_00 is also supplied with the internal clock CKX from the PLL circuit 20x. The counter section 254 counts when the comparison result of the counter section 254 is high. AD conversion is achieved by obtaining the count result as digital data of the pixel signal voltage Vx. That is, an AD converter is provided for each column. The pixel signal voltage Vx (analog signal) of each of the unit pixels 3 in the selected row is collectively read out into one of the vertical signal lines 19, allowing reset and signal levels of the pixel signal voltage Vx to be directly converted into digital data.

In Patent Document 1, the difference is calculated between the AD-converted reset and signal levels at the same time during the AD conversion. The reference signal comparison AD conversion is performed on a column-by-column basis to perform CDS (Correlated Double Sampling) in the digital domain. This eliminates disadvantages resulting from the CDS in the analog domain, allowing for highly accurate noise removal. Further, this column AD scheme processes one row at a time in the horizontal direction on the screen, eliminating the need for high frequency driving for horizontal scan. As a result, only a low vertical scan frequency is required for AD conversion, providing advantages including easy separation of noise component that develops in a high frequency band from signal component.

Patent Document 1: Japanese Patent Laid-Open No. 2005-328135

DISCLOSURE OF INVENTION

Technical Problem

However, the AD conversion scheme disclosed in Patent Document 1 leads to random noise resulting from AD conversion such as quantizing noise (non-existing in the analog domain) and circuit noise, making such noise visible as image noise.

The present invention has been made in light of the foregoing, and it is an object of the present invention to provide an arrangement for reducing noise resulting from reference signal comparison AD conversion.

Technical Solution

An AD conversion arrangement according to the present invention uses the comparison section to compare the reference signal whose level changes gradually against the target analog signal. The AD conversion arrangement uses the counter section to perform the counting based on the comparison result in response to a count clock supplied for AD conversion, acquiring digital data of the target signal based on the output data from the counter section.

That is, the AD conversion section performs the reference signal comparison AD conversion. At this time, the control section controls the reference signal generation section and AD conversion section so that n-bit AD conversion of the target signal is repeated W times (where W is a positive integer equal to or greater than 2), after which the digital values obtained by AD conversion are summed up for digital integration.

As an application, the obtained pieces of data may be averaged in a manner commensurate with the number of repetitions W to ensure that the data is of the same level (magnitude) as during a normal AD conversion process. Alternatively, the obtained data may be used in an "as-is" manner, as another application.

In this arrangement, the data of the same target signal is summed in the digital domain. As a result, the signal data becomes W times greater. An analog target signal is converted into digital data through n-bit AD conversion. This prevents any possible detrimental effects that may be caused by summation in the analog domain. In summation, although the signal data becomes W times greater as with signal summation in the analog domain, noise will likely become $\sqrt{W}$ times greater, thus providing improved noise characteristic.

An AD converter using this AD conversion arrangement is applied, for example, to solid-state imaging devices. It should be noted that the solid-state imaging device may be in the form of a single chip. Alternatively, the solid-state imaging device may be in a modular form having an imaging function with an imaging section packaged together with a signal processing section or optics. Still alternatively, the AD converter using this AD conversion arrangement is also applicable to imaging devices and all kinds of other pieces of electronic equipment. In this case, the same effect can be achieved from an imaging device or other piece of electronic equipment as from an AD converter or solid-state imaging device. Here, the term "imaging device" refers, for example, to a mobile device equipped with a camera (or camera system) or imaging function. On the other hand, the term "imaging" includes, in a broad sense, not only image capture during normal camera shooting but also fingerprint detection.

Advantageous Effects

An aspect of the present invention converts an analog signal into digital data through n-bit AD conversion, and also digitally integrates data of the same target signal that has been digitized in the digital domain with the number of repetitions W. This can alleviate the problem of random noise resulting from AD conversion such as quantizing noise and circuit noise that do not exist in the analog domain.

BRIEF DESCRIPTION OF DRAWINGS

FIG. 3 is a simplified circuit configuration diagram of the solid-state imaging device with focus on AD conversion and CDS.

FIG. 3A is a conceptual diagram describing the operation of multi-summation AD conversion.

FIG. 4 is a conceptual diagram of still image shooting operation describing the relationship between the operation and frame rate of the solid-state imaging device according to the first embodiment.

FIG. 5A are diagrams describing a switch section used in the solid-state imaging device according to the second embodiment (first example).

FIG. 5B are diagrams describing the switch section used in the solid-state imaging device according to the second embodiment (second example).

FIG. 6A are diagrams describing the operation of the solid-state imaging device according to the third embodiment.

FIG. 7B are diagrams describing the operation of the reference signal generation section in the solid-state imaging device according to the fourth embodiment.

FIG. 8 is a schematic configuration diagram of a solid-state imaging device according to a fifth embodiment.

FIG. 12 is a schematic configuration diagram of an imaging device according (ninth embodiment).

FIG. 13 is a schematic configuration diagram of electronic equipment (tenth embodiment).

FIG. 14A are diagram (2) describing the first comparative example.

BEST MODES FOR CARRYING OUT THE INVENTION

Figure 1:
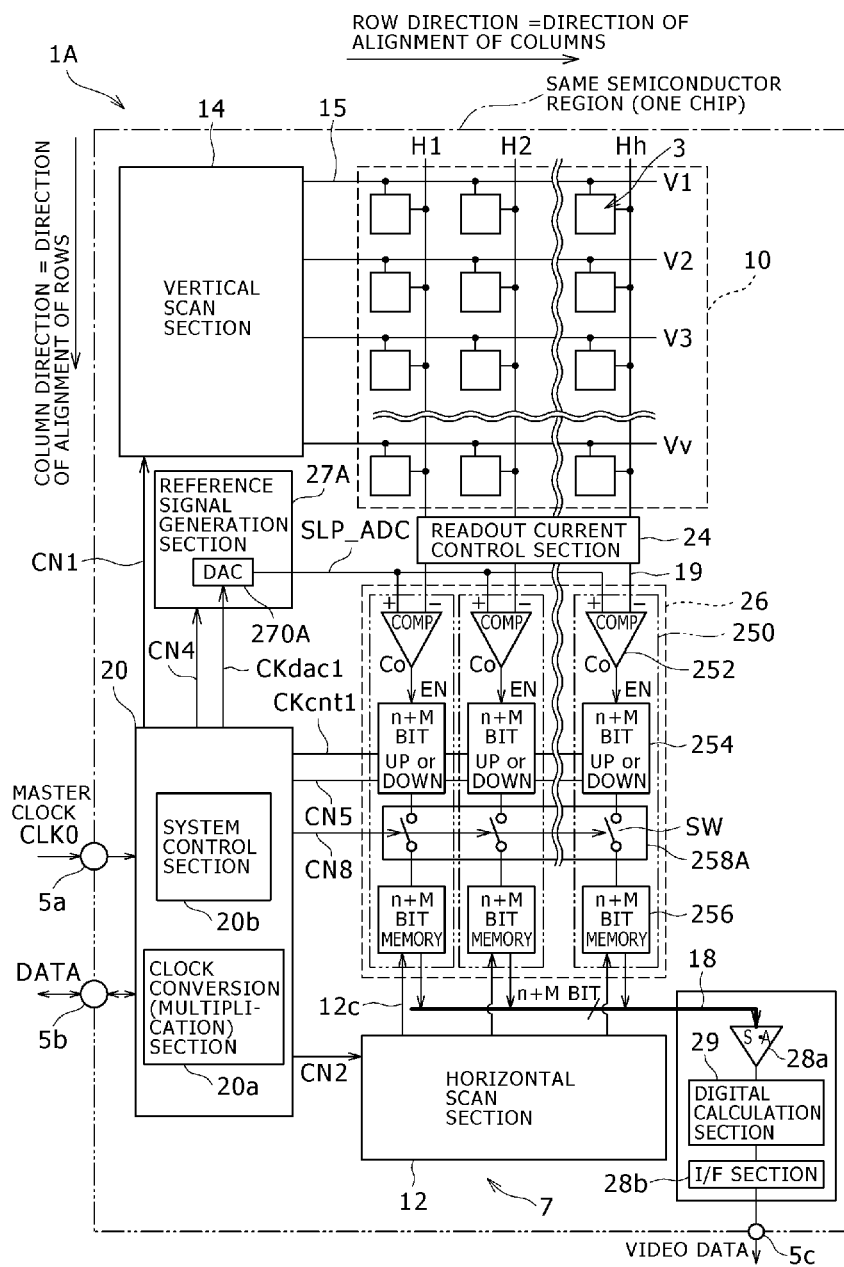
FIG. 1 is a schematic configuration diagram of a first embodiment of a solid-state imaging device.

A detailed description will be given below of the embodiments of the present invention with reference to the accompanying drawings. An uppercase letter of the alphabet such as 'A,' 'B,' 'C' or other is added as a reference numeral if a distinction is required between like functional components of the different embodiments. No uppercase letter is added as a reference if no particular distinction is made. The same holds true for the drawings.

It should be noted that a case will be described below in which a CMOS solid-state imaging device, i.e., an example of an X-Y address solid-state imaging device, is used as a device. On the other hand, a description will be given assuming that all the pixels of the CMOS solid-state imaging device include NMOS transistors. It should be noted that this is merely an example. The target device is not limited to MOS solid-state imaging devices. All the embodiments described later are applicable to all semiconductor devices adapted to detect a physical quantity distribution which include a plurality of unit components arranged in lines or in a matrix. The unit components are responsive to externally supplied electromagnetic wave such as light or radiation.

Solid-State Imaging Device

First Embodiment

FIG. 1 is a schematic configuration diagram of a first embodiment of a CMOS solid-state imaging device (CMOS image sensor) which is an embodiment of a solid-state imaging device according to the present invention. It should be noted that this solid-state imaging device is one form of electronic equipment according to the present invention.

A solid-state imaging device 1 (not necessarily a solid-state imaging device 1A according to the first embodiment) includes a pixel section. The pixel section has a plurality of pixels arranged in rows and columns (i.e., in a two-dimensional matrix form). Each of the pixels includes a photoreceiving element (example of a charge generation section) adapted to output a signal commensurate with the amount of incident light. The signal output from each pixel is a voltage signal. CDS function sections and digital conversion sections are provided in a column parallel manner. The term "CDS function sections and digital conversion sections are provided in a column parallel manner" means that a plurality of the CDS function sections and digital conversion sections (AD conversion sections) are provided substantially parallel to the vertical signal lines (example of column signal lines) 19 arranged in vertical columns.

As illustrated in FIG. 1, the solid-state imaging device 1A according to the first embodiment includes a pixel array section 10, drive control section 7, readout current control section 24, column AD conversion section 26, reference signal generation section 27A and output section 28. The pixel array section 10 has the unit pixels 3 arranged in rows and columns. Each of the unit pixels 3 includes, as basic elements, a charge generation section and three or four transistors. The pixel array section 10 is also called a pixel section or imaging section. The drive control section 7 is provided on the outside of the pixel array section 10. The readout current control section 24 supplies an operating current (readout current) to the unit pixels 3 of the pixel array section 10. The readout current is used to read out a pixel signal. The column AD conversion section 26 includes AD conversion sections 250, one arranged in each vertical column. The reference signal generation section 27A supplies the reference signal SLP_ADC to the column AD conversion section 26. The reference signal SLP_ADC is used for AD conversion. These function sections are provided on the same semiconductor substrate. The reference signal SLP_ADC need only have a linearly changing waveform with a given slope as a whole. The waveform may change in a gently sloping or successively stepped manner.

Arranging the reference signal generation sections 27A also in a column parallel manner (one in each pixel column) is a consideration when using the reference signal comparison AD conversion scheme. For example, this is a case in which a comparator and reference signal generator are provided in each pixel column so that the reference signal level is sequentially varied by the reference signal generator in the associated column based on the comparison result of the comparator in the own column. However, this leads to increased circuit scale and increased power consumption. In the present embodiment, therefore, the reference signal generation section 27A is shared by all the columns so that the reference signal SLP_ADC generated by the reference signal generation section 27A is shared by all the AD conversion sections 250 that are arranged one in each pixel column.

Each of the AD conversion sections 250 according to the present embodiment has functions of an AD conversion section and difference calculation section. The AD conversion section converts a reset level Srst, i.e., a standard level of the pixel signal voltage Vx, and a signal level Ssig, independently into digital data. The difference calculation section obtains digital data Dsig of a signal component Vsig that is represented by the difference between the reset level Srst and signal level Ssig by calculating the difference between the AD conversion results of the reset level Srst and signal level Ssig.

The drive control section 7 includes a horizontal scan section 12 (column scan circuit), vertical scan section 14 (row scan circuit) and communication/timing control section 20 to provide the control circuit functions adapted to sequentially read out the signals from the pixel array section 10. The communication/timing control section 20 includes a clock conversion section 20a, system control section 20b and other sections. The clock conversion section 20a has functions of a clock conversion section adapted to generate an internal clock. The system control section 20b has functions to control the communication function and the different sections. Although not illustrated, the horizontal scan section 12 includes, for example, a horizontal address setting section adapted to control the column addresses and a horizontal drive section adapted to control column scans. The vertical scan section 14 includes, for example, a vertical address setting section and a vertical drive section adapted to control the row addresses and the row scans.

The output section 28 includes a sense amplifier 28a (S·A) and interface section 28b (I/F section). The sense amplifier 28a detects a signal on a horizontal signal line 18 (digital data with a small amplitude). The interface section 28b serves as an interface between the solid-state imaging device 1A and external equipment. The output of the interface section 28b is connected to an output end 5c so that video data is output to the circuit at the subsequent stage.

In the first embodiment, a digital calculation section 29 (signal processing block) is provided between the sense amplifier 28a and interface section 28b. The digital calculation section 29 has at least functions of an averaging section adapted to perform the averaging at the subsequent stage of the AD conversion sections 250 rather than in the AD conversion section 250. The averaging refers to averaging of digital data obtained by repeating the AD conversion a plurality of times and output from the AD conversion sections 250 in a manner commensurate with the plurality of times.

It is possible to provide the AD conversion sections 250 with the functions of the averaging section as in the second embodiment which will be described later. In this case, however, the AD conversion sections 250 must be configured to handle W times of averaging, thus resulting in increased circuit space of the AD conversion sections 250. In contrast, the averaging can be achieved without increasing the circuit space of the AD conversion sections 250 if the digital calculation section 29 having the functions of an averaging section is provided at the subsequent stage of the AD conversion sections 250.

The clock conversion section 20a incorporates a multiplier circuit adapted to generate a pulse at a clock frequency higher than that of a master clock CLK0 supplied via a terminal 5a based on the master clock CLK0. The clock conversion section 20a generates internal clocks such as counter clocks CKcnt1 and CKdac1. As a multiplier circuit of the clock conversion section 20a, it is only necessary to provide a k1 multiplier circuit where k1 is a multiple of the frequency of the master clock CLK0. A variety of well-known circuits such as phase-locked loop (PLL) can be used. Using the count clocks CKcnt1 and CKdac1 at frequencies higher than that of the master clock CLK0 makes it possible to perform AD conversion and data output faster. On the other hand, when the digital calculation section 29 is provided, it is possible to perform motion extraction and compression that require high-speed calculations by using a high-speed clock.

In FIG. 1, some of the rows and columns are not shown for ease of illustration. In reality, however, several tens to several thousands of the unit pixels 3 are arranged in each row and column. Each of the unit pixels 3 typically includes a photodiode and in-pixel amplifier. The photodiode serves as a photoreceiving element (charge generation section) which is an example of a detection section. The in-pixel amplifier includes an amplifying semiconductor element (e.g., transistor).

In the solid-state imaging device 1A, the pixel array section 10 can be rendered capable of color imaging by using a color separation filter. That is, a color separation filter of a given color is provided on the photoreceiving surface of each of the charge generation sections (e.g., photodiodes) in the pixel array section 10. Electromagnetic wave (light in this example) is incident on the photoreceiving surface. Color separation filter, made up of a combination of a plurality of color filters adapted to capture a color image, is arranged in a Bayer color array, thus rendering the pixel array section 10 capable of color imaging.

Each of the unit pixels 3 is connected to the vertical scan section 14 via a row control line 15 adapted to select a row, and to the column AD conversion section 26 via the vertical signal line 19. The AD conversion sections 250 are arranged one in each vertical column in the column AD conversion section 26. Here, the row control line 15 represents the wires extending from the vertical scan section 14 into the pixel.

The components of the drive control section 7 such as the horizontal scan section 12 and vertical scan section 14 are configured together with the pixel array section 10 to make up a part of the solid-state imaging device 1A serving as a so-called single-chip device (device with all components fabricated on the same semiconductor substrate) integrally formed in a single crystalline silicon or other semiconductor region using techniques similar to semiconductor integrated circuit manufacturing techniques, and also as a CMOS image sensor, i.e., an example of a semiconductor system.

The solid-state imaging device 1A may be in the form of a single chip with the various sections thereof integrally formed in a semiconductor region.
Alternatively, although not illustrated, the same device 1A may be in a modular form having imaging function, with not only the signal processing sections such as the pixel array section 10, drive control section 7 and column AD conversion section 26 but also the optics such as imaging lens, optical low-pass filter or infrared cutting filter packaged together.

The horizontal scan section 12 and vertical scan section 14 initiate their shifting operation (scanning) in response to control signals CN1 and CN2 supplied from the communication/timing control section 20. Therefore, the row control lines 15 contain a variety of pulse signals (e.g., pixel reset pulse RST that defines the initialization control potential, transfer pulse TRG that defines the transfer control potential and vertical selection pulse VSEL) adapted to drive the unit pixels 3.

The system control section 20b of the communication/timing control section 20 includes a timing generator TG (example of readout address control device) functional block and communication interface functional block. The timing generator TG functional block supplies clocks and pulse signals of predetermined timings that are required for the operation of all the sections. The communication interface functional block receives the master clock CLK0 from an external main control section via the terminal 5a. The same block also receives data specifying the operation mode to be selected from the external main control section via a terminal 5b. The same block also outputs data including information about the solid-state imaging device 1A to the external main control section via the terminal 5b.

For example, the communication/timing control section 20 outputs a horizontal address signal to the horizontal scan section 12 and a vertical address signal to the vertical scan section 14. In response thereto, each of the horizontal scan section 12 and vertical scan section 14 selects the appropriate row or column. At this time, because the unit pixels 3 are arranged in a two-dimensional matrix form, the readout of the pixel signals and pixel data should be speeded up by performing (vertical) scan-and-read first, followed by a horizontal scan-and-read. In the (vertical) scan-and-read, the analog pixel signals are accessed and captured on a row-by-row basis (in a column parallel manner). The analog pixel signals are generated by a pixel signal generation section 5 and output via the vertical signal lines 19 in the column direction. In the horizontal scan-and-read, the pixel signals (digital pixel data in the present example) are accessed in the row direction, i.e., the direction in which the vertical columns are arranged, and read out to the output side. Naturally, the present embodiment is not limited to a scan-and-read. A random access is also possible by which information of only the necessary unit pixel 3 is read out by directly specifying the address of the desired unit pixel 3.

Further, the communication/timing control section 20 supplies a clock, synchronous with the clock CLK0 (master clock) that is supplied via the terminal 5a, to various sections of the device, including the horizontal scan section 12, vertical scan section 14 and column AD conversion section 26.

Each of the AD conversion sections 250 of the column AD conversion section 26 is commonly supplied with the count clock CKcnt1 and receives and processes the analog pixel signal voltage Vx of the associated column of the unit pixels 3. For example, each of the AD conversion sections 250 has an ADC (Analog Digital Converter) adapted to convert the pixel signal voltage Vx into digital data using the count clock CKcnt1.

As an AD conversion process, the column AD conversion section 26 uses the AD conversion sections 250, provided one in each column, to convert the analog signals (pixel signal voltages Vx), that are held in parallel on a row-by-row basis, into digital data in parallel for each row. At this time, the reference signal comparison AD conversion technique is used. This technique is characterized in that an AD converter can be implemented with a simple configuration without increasing the circuit scale even if AD converters are arranged parallel to each other.

Details of the Column AD Circuit and Reference Signal Generation Section

As for the reference signal comparison AD conversion, a counting enabled period (the signal representing this period is referred to as a counting enable signal EN) is determined based on the period of time from the beginning of the conversion (beginning of the comparison) to the end of the conversion (end of the comparison). The target analog signal is converted into digital data based on the counting enable signal EN.

As the pixel signal voltage Vx transmitted through the vertical signal line 19, the reset level Srst appears first in the time sequence, followed by the signal level Ssig. The reset level Srst contains noise of the pixel signal as a reference level. The process for the standard level (reset level Srst and virtually equivalent to the reset level Srst) is referred to as the precharge phase (may be abbreviated as P phase) process (or reset counter period process). The process for the signal level Ssig is referred to as the data phase (may be abbreviated as D phase) process (or data counter period process). When the D phase process is performed following the P phase process, the D phase process is for the signal level Ssig obtained by adding the reset level Srst and signal component Vsig together.

As for the counting enabled period, if the AD conversion section 250 calculates the difference between the P and D phase components, a first process example may be used in which generally, for example, the counting begins when the reference signal SLP_ADC begins to change and the counting ends when the reference signal SLP_ADC matches the target signal voltage during the processes of both phases (virtually when the two intersect each other; ditto for the rest). In this case, the counter is switched between down-counting and up-counting modes during the P and D phase counting processes adapted to obtain the digital data Dsig of the single pixel signal component Vsig.

Alternatively, if the AD conversion section 250 calculates the difference between the P and D phase components, the counting begins when the reference signal SLP_ADC begins to change and the counting ends when the reference signal SLP_ADC matches the target signal voltage for one of the processes of the two phases. For the other process, however, a second process example may be used in which the counting begins when the reference signal SLP_ADC matches the target signal voltage and the counting ends when a desired count for that time is reached (typically when the maximum AD conversion period is reached). In this case, the counter need only operate either in down-counting or up-counting mode in the P and D phase counting process.

It should be noted that the difference between the P and D phases may be calculated at the subsequent stage of the AD conversion section 250 (e.g., digital calculation section 29). In this case, a third process example may be used in which the counting begins when the reference signal SLP_ADC begins to change and the counting ends when the reference signal SLP_ADC matches the target signal voltage or the counting begins when the reference signal SLP_ADC matches the target signal voltage and the counting ends when a desired count for that time is reached (typically when the maximum AD conversion period is reached) during the processes of both phases. In this case, the counter need only operate either in down-counting or up-counting mode in the P and D phase counting processes.

It should be noted that the third process example is not used in the present embodiment because the CDS is completed by the AD conversion section 250. However, P phase data and D phase data may be transferred separately to the output section 28 so that the CDS is performed at the subsequent stage of the AD conversion section 250 (e.g., digital calculation section 29).

It should be noted that three process examples have been described here. However, the applicant of the present invention has proposed a variety of other reference signal comparison AD conversion schemes adapted to perform the AD conversion and CDS with the AD conversion section 250. These schemes can be basically used in the embodiments which will be described later.

In any of the process examples, in principle, the ramped reference signal SLP_ADC is supplied to the comparator (voltage comparator), and the analog pixel signal supplied via the vertical signal line 19 is compared against the reference signal SLP_ADC. At the same time, the counting using a clock signal is initiated when the counting enabled period begins, thus performing the AD conversion by counting the number of clocks during the counting enabled period.

The AD conversion section 250 includes the comparison section 252 (comparator (COMP)) and counter section 254. The comparison section 252 compares the reference signal SLP_ADC generated by the reference signal generation section 27A against the analog pixel signal obtained from the unit pixel 3 via the vertical signal line 19 (H1, H2, and so on up to Hh) for each row control line 15. The counter section 254 counts the active period of the counting enable signal EN with the count clock CKcnt1 and holds the counting result. The counting enable signal EN has a given relationship with the period of time required for the comparison section 252 to complete the comparison process.

The reference signal generation section 27A includes a DA conversion unit 270A (Digital Analog Converter (DAC)). The same section 27A generates a stepped sawtooth wave (ramped waveform, hereinafter also referred to as the reference signal SLP_ADC) in synchronism with the count clock CKdac1 from the initial value specified by control data CN4 supplied from the communication/timing control section 20, supplying the reference signal SLP_ADC in the form of a stepped sawtooth wave to the AD conversion sections 250 of the column AD conversion section 26 as an AD conversion reference voltage (ADC standard signal). It should be noted that, although not illustrated, an anti-noise filter should preferably be provided. It should also be noted that the same clock may be used as the count clock CKdac1 and as the count clock CKcnt1 for the counter section 254.

The control data CN4 supplied from the communication/timing control section 20 to the DA conversion unit 270A of the reference signal generation section 27A also contains information that equalizes the rate of change of digital data relative to time so that the reference signal SLP_ADC for each comparison process has basically the same slope (rate of change). More specifically, the count is changed by one every unit time in synchronism with the count clock CKdac1 using a current output DA conversion circuit so that a current commensurate with the count is output. Then, the current signal is converted into a voltage signal using a current-voltage conversion resistor element.

In the column AD conversion according to the present embodiment, the reference signal SLP_ADC is supplied from the DA conversion unit 270A commonly to the comparison sections 252 that are provided one in each column. Each of the comparison sections 252 performs the comparison of the pixel signal voltage Vx, of which the same section 252 is in charge, using the common reference signal SLP_ADC. The counter section 254 performs the counting during the active period of the counting enable signal EN (period during which the signal EN is high) based on the count clock CKcnt1 and holds the counting result when the counting ends.

A control signal CN5 is fed from the communication/timing control section 20 to the counter section 254 of each of the AD conversion sections 250. The control signal CN5 specifies control information including not only whether the counter section 254 operates in down-counting or up-counting mode for the P and D phase counting processes but also setting and resetting of an initial value Dini in the P phase counting process.

The reference signal SLP_ADC generated by the reference signal generation section 27A is supplied commonly to input terminals (+) of the comparison sections 252. The associated vertical signal line 19 is connected to one of other input terminals (−) of the comparison sections 252. This allows for the pixel signal voltage Vx to be supplied to each of the comparison sections 252 from the pixel array section 10.

The count clock CKcnt1 is supplied commonly to clock terminals CK of the counter sections 254 from the communication/timing control section 20. Although not illustrated, the counter section 254 can be implemented by changing the wiring of a data storage section which includes latches to that used for a synchronous counter or ripple counter. The counter section 254 is designed to perform counting therein with an input of the count clock CKcnt1.

If the first process example is used in which the counter section 254 is switched between down-counting and up-counting modes during the P and D phase counting processes adapted to obtain the digital data Dsig of the single pixel signal component Vsig, an up-down counter capable of switching between down-counting and up-counting modes should preferably be used as the counter section 254.

On the other hand, if the second or third process example is used in which the counter section 254 need only operate in down-counting or up-counting mode, an up-counter or down-counter, whichever is appropriate for the type of counting used, is acceptable. It should be noted, however, that, in principle, an up-down counter capable of switching between down-counting and up-counting modes may be operated in down-counting or up-counting mode. Normally, however, an up-down counter requires mode switching circuitry, thus resulting in a larger circuit scale than an up- or down-counter designed to operate in a single counting mode. Therefore, if the counter need only operate in one mode, an up-down counter should not be used.

The counter section 254 is supplied with a control pulse from the horizontal scan section 12 via a control line 12c. The counter section 254 has a latching function adapted to hold a counting result, holding the counter output value until instructed otherwise by a control pulse supplied via the control line 12c.

As for the output side of each of the AD conversion sections 250, the output of the counter section 254 can be connected, for example, to the horizontal signal line 18. Alternatively, a data storage section 256 and switch section 258A may be provided at the subsequent stage of the counter section 254, as illustrated in FIG. 1. The data storage section 256 includes a latch adapted to hold the counting result held by the counter section 254. The switch section 258A is arranged between the counter section 254 and data storage section 256. The switch section 258A has a switch SW in each vertical column.

When the data storage section 256 is provided, a memory transfer instruction pulse CN8 as a control pulse is supplied from the communication/timing control section 20 commonly to the switches SW in vertical columns. When supplied with the memory transfer instruction pulse CN8, each of the switches SW of the switch section 258A transfers the count value of the associated counter section 254 to the data storage section 256. The data storage section 256 holds and stores the transferred count value.

It should be noted that the arrangement for causing the data storage section 256 to hold the count value of the counter section 254 at a given timing is not limited to a configuration in which the switch section 258A is arranged between the counter section 254 and data storage section 256. This arrangement can be alternatively implemented by directly connecting the counter section 254 and data storage section 256 and controlling the output enable of the counter section 254 with the memory transfer instruction pulse CN8. Further, this arrangement can be alternatively implemented by using the memory transfer instruction pulse CN8 as a latch clock that defines the timings at which the data storage section 256 loads the data.

The data storage section 256 is supplied with a control pulse from the horizontal scan section 12 via the control line 12c. The same section 256 holds the count value loaded from the counter section 254 until instructed otherwise by the control pulse supplied via the control line 12c.

The horizontal scan section 12 has a function of a readout scan section to read out a count value held by each of the data storage sections 256 concurrently as each of the comparison sections 252 and each of the counter sections 254 of the column AD conversion section 26 perform the processes of which these sections are in charge.

The output of the data storage section 256 is connected to the horizontal signal line 18. The horizontal signal line 18 has the same or twice the bit width (e.g., in the case of a complementary output) of the AD conversion section 250. The same line 18 is connected to the output section 28. The output section 28 has the sense amplifier 28a that is suited to each of the output lines.

The provision of the data storage section 256 allows for transfer of the counting result held by the counter section 254 to the data storage section 256. This makes it possible to control the counting performed by the counter section 254, i.e., the AD conversion, and the readout of the counting result to the horizontal signal line 18, independently of each other, thus achieving pipelining in which the AD conversion and signal readout to external equipment are conducted concurrently.

In such a configuration, the AD conversion section 250 performs the counting during a given pixel signal readout period, outputting the counting result at a given timing. That is, the comparison section 252 compares the reference signal SLP_ADC supplied from the reference signal generation section 27A and the pixel signal voltage Vx supplied via the vertical signal line 19 first. When the two voltages become equal to each other, a comparison output Co (comparator output) of the comparison section 252 is inverted. For example, the comparison section 252 is inactive when the comparison output Co is high (e.g., power potential). The comparison output Co changes to low level (becomes active) when the pixel signal voltage Vx and reference signal SLP_ADC match.

The counter section 254 uses the comparison output Co supplied from the comparison section 252 as the count enable signal EN. The same section 254 latches (holds and stores), as pixel data, the number of the count clocks CKcnt1 while the count enable signal EN is active (while the comparison output Co of the comparison section 252 is high), thus completing the AD conversion.

Although described in detail later, the communication/timing control section 20 according to the present embodiment controls the reference signal generation section 27A and counter sections 254 so that each of the AD conversion sections 250 performs n-bit AD conversion during the normal AD conversion and n-bit AD conversion W times during multi-summation AD conversion for digital integration. In order to deal with this, the counter sections 254, data storage sections 256, switch section 258 and horizontal signal line 18 are each configured to be "n+M" bits wide in the first embodiment.

Here, the number of repetitions W for repeating the reference signal comparison AD conversion process and the bit count M, i.e., the increment from the n bits for the counter sections 254, are set so that the inequality $2^{(M-1)}<W\leq2^M$ holds. For example, when the number of repetitions W is 2, the bit count is increased by one. When the number of repetitions W is 3 or 4, the bit count is increased by two. When the number of repetitions W is any of 5 to 8, the bit count is increased by three. This is defined from the relationship between the number of repetitions and the number of bits required. If the reference signal comparison AD conversion process is repeated W times, the digital data of the signal becomes W times greater, and the number of bits required changes accordingly.

Reference Signal Generation Section

First Embodiment

Figure 2:
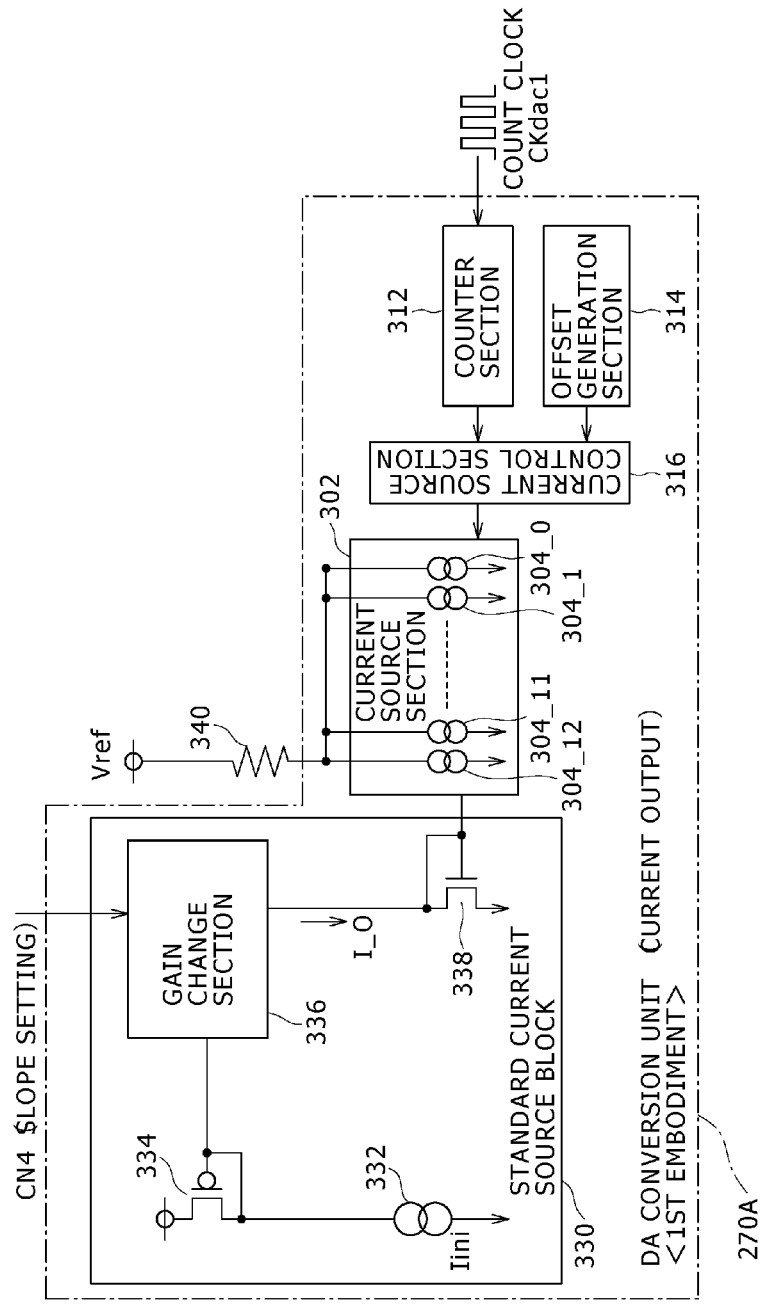
FIG. 2 is a diagram illustrating a configuration example of a DA conversion unit of the first embodiment.

FIG. 2 is a diagram illustrating a configuration example of the DA conversion unit 270A of the reference signal generation section 27A used in the solid-state imaging device 1A according to the first embodiment. The DA conversion unit 270A is a current output DA conversion circuit that includes a current source section 302 configured by the combination of constant current sources, counter section 312, offset generation section 314, current source control section 316 and standard current source block 330 adapted to set a standard current level I_0. A resistor element 340 having a resistance of R_340 is connected to the current output terminal of the current source section 302 as a current-voltage conversion element.

The current source section 302 includes constant current sources 304 adapted to output given prescribed current levels. The current sources 304 of the current source section 302 may be set to a variety of current levels and arranged in a variety of manners for controlling purposes. Here, to facilitate the understanding, the constant current source 304 includes as many constant current sources 304 as the number of bits. Each of the constant current sources 304 outputs a current having a bit weight of the standard current level I_0 set by the standard current source block 330.

For example, if there are 13 bits, and when "^" represents the power, a constant current source $304_{13}$ 0 for the zeroth bit outputs 2^0×I_0, a constant current source 304_1 for the first bit 2^1×I_0, and so on. A constant current source 304_11 for the eleventh bit outputs 2^11×I_0, and a constant current source 304_12 for the twelfth bit 2^12×I_0. The current output terminals of the constant current sources 304 are connected together and further connected to a standard power source Vref equivalent to an initial potential SLP_ini of the reference signal SLP_ADC via the resistor element 340. The standard power source Vref is set based on information specifying the initial value of the reference signal SLP_ADC for each comparison process contained in the control data CN4. Any circuit configuration may be used to set the standard power source Vref.

The standard current source block 330 includes a constant current source 332, p-channel transistor 334, gain change section 336 and n-channel transistor 338. The constant current source 332 has one end connected to negative power or ground and generates an initial current Iini. The p-channel transistor 334 serves as a load of the constant current source 332. The n-channel transistor 338 supplies the current from the gain change section 336 to each of the constant current sources 304 of the current source section 302. The transistor 334 has its source connected to positive power and its drain and gate connected together to the output end of the constant current source 332. The drain and gate of the transistor 334 are also connected to the unshown transistor and current mirror of the gain change section 336.

Although not described in detail, the gain change section 336 supplies a standard current I_0 to the transistor 338. The standard current I_0 is obtained by multiplying the mirror current supplied from the transistor 334 by a given number of times. The transistor 338 has its source connected to negative power or ground and its drain and gate connected together to the output end of the gain change section 336. The drain and gate of the transistor 333 are also connected to the constant current sources 304 of the current source section 302 and to the current mirror.

The gain change section 336 sets a voltage change ΔSLPdac (=I_0×R_340) per clock based on information specifying the slope of the reference signal SLP_ADC for each comparison process contained in the control data CN4, changing the count value by one for each count clock CKdac. In reality, it is only necessary to set the maximum voltage width for the maximum count of the count clock CKdac (e.g., 1024 for ten bits). Changing the gain for the initial current Iini of the constant current source 332 of the standard current source block 330 adjusts ΔSLPdac per clock, thereby adjusting the slope (rate of change) of the reference signal SLP_ADC.

The counter section 312 performs the counting based on the count clock CKdac1 supplied from the communication/timing control section 20, supplying the counting result to the current source control section 316. The offset generation section 314 adds a given potential (offset) to the reference signal SLP_ADC separately from the change that takes place based on the count value of the counter section 312, supplying the information thereabout to the current source control section 316. The current source control section 316 determines which constant current sources 304 to turn on and which others to turn off based on the count value of the counter section 312 and the offset information supplied from the current source control section 316, turning on and off the constant current sources 304 based on that determination result.

In the operation examples of the embodiments which will be described later, the offset is zero unless otherwise specified to facilitate the understanding. Therefore, the DA conversion unit 270A changes the voltage indicating the initial value contained in the control data CN4 by ΔSLPdac per count each time the count value of the counter section 312 advances. In up-counting mode, the voltage drops by ΔSLPdac at a time, thus providing a negative slope. In down-counting mode, on the other hand, the voltage increases by ΔSLPdac at a time, thus providing a positive slope.

It should be noted that the configuration of the reference signal generation section 27A shown here is merely an example, and the method of adjusting the reference signal SLP_ADC is not limited to the above. For example, it is only necessary to contain α (initial value) and slope (rate of change) β in the control data CN4 and generate the reference signal SLP_ADC that satisfies the function y=α−β*x. The reference signal generation section 27A may be configured without using the counter section 312. It should be noted, however, that the configuration using the counter section 312 is advantageous in that the reference signal SLP_ADC can be readily generated and that operational response to the counter sections 254 is easy to achieve.

A possible solution, for example, would be to output the potential calculated by the function y=α−β*x where x is the counter output value while maintaining the period of the count clock CKdac to be supplied to the reference signal generation section 27A, constant. At this time, the clock count is changed, for example, to adjust the voltage change ΔSLPdac (i.e., slope β of the reference signal SLP_ADC) per count clock CKdac based on the information specifying the slope β. The voltage change ΔSLPdac can alternatively be changed by changing the current-voltage conversion resistance or the current levels of the unit current sources.

Operation of the Solid-State Imaging Device

First Embodiment

Figure 3B:
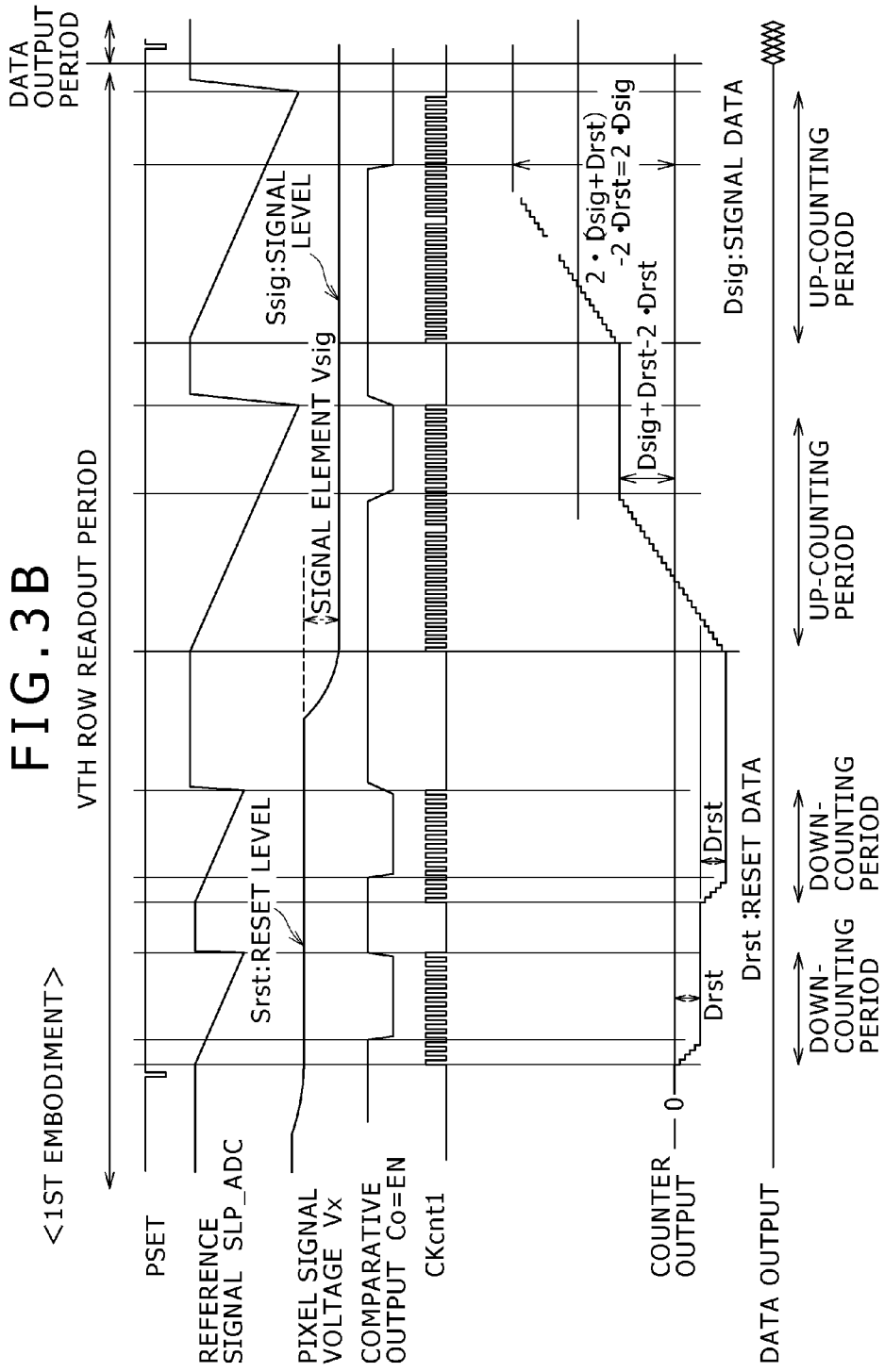
FIG. 3B is a timing diagram describing multi-summation AD conversion and digital CDS in the solid-state imaging device according to the first embodiment.

FIGS. 3 to 3B are diagrams describing the operation of the solid-state imaging device 1A according to the first embodiment. FIG. 3 is a simplified circuit configuration diagram of the solid-state imaging device 1 with focus on AD conversion and CDS. FIG. 3A is a conceptual diagram describing the operation of multi-summation AD conversion. FIG. 3B is a timing diagram describing multi-summation AD conversion and digital CDS in the solid-state imaging device 1A according to the first embodiment.

As illustrated in FIG. 3, the unit pixel 3 includes, as an example, not only a charge generation section 32 but also four transistors (readout selection transistor 34, reset transistor 36, vertical selection transistor 40 and amplifying transistor 42) as basic elements making up a pixel signal generation section 5. The readout selection transistor 34 making up a transfer section is driven by a transfer signal TRG. The reset transistor 36 making up an initialization section is driven by a reset signal RST. The vertical selection transistor 40 is driven by a vertical selection signal VSEL.

The charge generation section 32, i.e., an example of a detection section which includes a photoreceiving element DET such as a photodiode PD, has one end (anode) of the photoreceiving element DET connected to a low-potential standard potential Vss (negative potential, e.g., −1 V or so) and other end thereof (cathode) to the input end (typically the source) of the readout selection transistor 34. It should be noted that the standard potential Vss may be a ground potential GND. The readout selection transistor 34 has its output end (typically the drain) connected to a connection node to which the reset transistor 36, a floating diffusion 38 and the amplifying transistor 42 are connected. The reset transistor 36 has its source connected to the floating diffusion 38 and its drain to a reset power source Vrd (normally common to a power source Vdd).

As an example, the vertical selection transistor 40 has its drain connected to the source of the amplifying transistor 42, its source to a pixel line 51, and its gate (particularly referred to as a vertical selection gate SELV) to a vertical selection line 52. The amplifying transistor 42 has its gate connected to the floating diffusion 38, its drain to the power source Vdd and its source to the pixel line 51 via the vertical selection transistor 40, and further to the vertical signal line 19. It should be noted that the present embodiment is not limited to the above connection configuration. The vertical selection transistor 40 and amplifying transistor 42 may be arranged in reverse so that the vertical selection transistor 40 has its drain connected to the power source Vdd and its source to the drain of the amplifying transistor 42, and that the amplifying transistor 42 has its source connected to the pixel line 51.

The vertical signal line 19 has its one end extending toward the column AD conversion section 26, with the readout current control section 24 connected thereto halfway along the route. Although not described in detail, the readout current control section 24 includes a load MOS transistor for each vertical column. The gates of the standard current source block and transistor are connected together to form a current mirror circuit so that the readout current control section 24 serves as a current source 24a for the vertical signal line 19. The readout current control section 24 also forms a source follower with the amplifying transistor 42 to supply an approximately constant operating current (readout current).

Each of the AD conversion sections 250 first compares the analog pixel signal voltage Vx read out from the unit pixel 3 to the vertical signal line 19 against the reference signal SLP_ADC using the comparison section 252 provided in each column. At this time, the counter section 254 provided in each column as with the comparison section 252 is activated based on the count enable signal EN so that the given potential of the reference signal SLP_ADC and the counter section 254 are varied in a one-to-one fashion, thus converting the pixel signal voltage Vx of the vertical signal line 19 into digital data.

Here, in the conventional arrangement, the count value of each of the flip-flops of the counter section 254 is reset to the initial value of 0 first when the first signal is processed, that is, during the P phase process period in which the reset level Srst is subjected to AD conversion. Then, the counter section 254 is set to down-counting mode so that the comparison between the reference signal SLP_ADC and the P phase level of the pixel signal voltage Vx by the comparison section 252 and the counting by the counter 254 are performed concurrently, thus achieving P phase level AD conversion. This allows for the counter section 254 to hold the count value representing the digital value (reset data) Drst (representing −Drst with the sign) commensurate with the magnitude of the reset level Srst.

Next, the signal component Vsig is read out that is commensurate with the amount of incident light for each of the unit pixels 3 in addition to the reset level Srst when the second signal is processed, that is, during the D phase process period in which the signal level Ssig is subjected to AD conversion, thus performing the same operation as when the P phase is read out. First, the counter section 254 is set to up-counting mode, the mode opposite to that used during the P phase process, so that the comparison between the reference signal SLP_ADC and the D phase level of the pixel signal voltage Vx by the comparison section 252 and the counting by the counter 254 are performed concurrently, thus achieving D phase level AD conversion.

At this time, up-counting is performed unlike during the P phase process, starting from the digital value (reset data) Drst of the reset level Srst of the pixel signal voltage Vx obtained during the P phase readout and AD conversion. The signal level Ssig is equal to the sum of the reset level Srst and the signal component Vsig. Therefore, the count value of the AD conversion result of the signal level Ssig is basically "Drst+Dsig." However, because up-counting begins from "−Drst," i.e., the AD conversion result of the reset level Srst, the count value held in reality by the counter section 254 is "−Drst+(Dsig+Drst)=Dsig."

That is, the counter section 254 uses different counting modes during the counting, namely, down-counting during the P phase process and up-counting during the D phase process. Within the counter section 254, therefore, the difference is calculated (subtraction is performed) automatically between the count value "−Drst," i.e., the AD conversion result of the reset level Srst, and the count value "Drst+Dsig," i.e., the AD conversion result of the signal level Ssig, so that the counter section 254 holds the count Dsig commensurate with the difference calculation result. The count Dsig commensurate with the difference calculation result held by the counter section 254 represents the signal data commensurate with the signal component Vsig.

As described above, the reset level Srst containing a variation between the unit pixels 3 can be removed by the readout conducted on two occasions, namely, down-counting during the P phase process and up-counting during the D phase process, and the difference calculation between the two counts within the counter section 254. This provides an AD conversion result of only the signal component Vsig commensurate with the amount of incident light for each of the unit pixels 3 with a simple configuration. Therefore, each of the AD conversion sections 250 serves not only as a digital conversion section adapted to convert an analog pixel signal into digital pixel data but also as a CDS (Correlated Double Sampling) function section.

In the first embodiment, on the other hand, although the relationship between the counting modes during the P and D phase processes is the same as in the conventional techniques, the reference signal comparison AD conversion is performed consecutively on the same signal a plurality of times (W times where W is a positive integer equal to or greater than 2) during the P and D phase AD conversion processes as illustrated in FIG. 3A. At this time, the reference signal SLP_ADC for AD conversion is varied during the second AD conversion onward in the same manner as during the first AD conversion. The counting is performed in the same mode starting from the previous AD conversion result.

This provides data (summation data) equal to W times the AD conversion result of the same signal in each of the P and D phase processes. A calculation result "−W·Drst+W·Dsig+Drst)=W·Dsig" is obtained by a combination of reversed counting modes during the P and D phase processes. It can be understood that the counter section 254 serves as a digital integrator. Although the signal becomes W times greater, noise likely becomes $\sqrt{W}$ times greater, thus providing improved noise characteristic. This makes it possible to reduce random noise without entailing the dynamic range problem as with analog summation.

Using W·Dsig in an as-is manner as an application provides a wider dynamic range of output data. This means that mere summation by performing the reference signal comparison AD conversion a plurality of times for each of the P and D phases provides an image obtained by summing the same image a plurality of times. As a result, data with twice the range can be obtained although the gain setting remains the same. For example, as for the reference signal comparison AD conversion for the P and D phases, the AD conversion is performed once during shooting under normal brightness as with the conventional techniques. During shooting under low illumination condition, however, the same signal is processed W times, thus providing a wider possible shooting range on the low illumination side. It should be noted that if an application requires data of the same size as the original data, it is only necessary to average the summation data W·Dsig that is W times greater than the original one, that is, to average the sum.

As is clear from the above, the W-time greater summation data W·Dsig is obtained from the AD conversion section 250 for the bit width n available when the present invention is not used. Here, assuming that the number of repetitions W satisfies the inequality $2^{(M-1)}<W\leq 2^M$, the counter sections 254, data storage sections 256, switch section 258A and horizontal signal line 18 must be each configured to be "n+M" bits wide (where M is an integer equal to or greater than 1) (refer to FIG. 1). For example, when n=12, M=1 and W=2, the counter sections 254, data storage sections 256, switch section 258A and horizontal signal line 18 must be each configured to be 13 bits wide.

For example, FIG. 3B also shows the counter output when W=2. First, during the P phase process, each of the flip-flops of the counter section 254 is reset to "0." Then, the counter section 254 is set to down-counting mode so that the comparison between the reference signal SLP_ADC and the reset level Srst by the comparison section 252 and the counting by the counter 254 are performed concurrently, thus achieving P phase level AD conversion. As a result, when the first process is complete, the counter section 254 holds the count value representing the digital value (reset data) Drst (representing −Drst with the sign) commensurate with the magnitude of the reset level Srst.

Next, during the second P phase process, the counter section 254 remains in the same down-counting mode as during the first process and starts counting from the digital value Drst (negative in this case) of the reset level Srst in the first process so that the comparison between the reference signal SLP_ADC and the reset level Srst by the comparison section 252 and the counting by the counter 254 are performed concurrently, thus achieving the second P phase level AD conversion. As a result, when the second process is complete, the counter section 254 holds the count value representing the digital value 2·Drst (representing −2·Drst with the sign) commensurate with twice the magnitude of the reset level Srst. That is, the reference signal comparison AD conversion is performed twice consecutively for the P phase so that a negative count is held by the counter section 254.

Next, during the first D phase process, the counter section 254 is set to up-counting mode, the mode opposite to that used during the P phase process, and starts counting from the digital value 2·Drst (negative in this case) commensurate with the reset level Srst of the pixel signal voltage Vx obtained during the P phase readout and AD conversion so that the comparison between the reference signal SLP_ADC and the signal level Ssig by the comparison section 252 and the counting by the counter 254 are performed concurrently, thus achieving the first D phase level AD conversion. As a result, when the first D phase process is complete, the counter section 254 holds the count value representing "−2·Drst+(Dsig+Drst)=−Drst+Dsig."

Next, during the second D phase process, the counter section 254 remains in the same up-counting mode as during the first process and starts counting from the first counting result or (−Drst+Dsig) so that the comparison between the reference signal SLP_ADC and the signal level Ssig by the comparison section 252 and the counting by the counter 254 are performed concurrently, thus achieving the second D phase level AD conversion. As a result, when the second process is complete, the counter section 254 holds the count value representing "−Drst+Dsig+(Dsig+Drst)=2·Dsig."

As described above, in the first embodiment, the reference signal comparison AD conversion is performed in down-counting mode W times consecutively for the P phase, followed by the reference signal comparison AD conversion in up-counting mode W times consecutively for the D phase. This allows for the W-time data for the P phase (negative with the sign) and the W-time data for the D phase to be summed. The same reset level Srst and signal level Ssig can be subjected to the CDS and also summed together. This W-time sampling AD conversion and CDS is referred, for example, to the multi-summation AD conversion, digital integration, W-time summation AD conversion or W-time integration AD conversion.

The summation data W·Dsig obtained by this multi-summation AD conversion is sent to the output section 28 through horizontal transfer. The output section 28 obtains the sum-averaged data Dsig obtained by division by W through digital signal processing by the digital calculation section 29. Although the signal component becomes W times greater, random noise becomes $\sqrt{W}$, thus providing improved noise characteristic. Such a multi-summation AD conversion permits reduction of quantizing noise and random noise without concern for the dynamic range as with analog summation. Further, if, as an application, a digital signal is summed using W·Dsig in an as-is manner without averaging the sum as described earlier, it is possible to provide a higher gain and wider dynamic range.

First Embodiment

Relationship with Frame Rate

FIG. 4 is a diagram describing the relationship between the operation and frame rate of the solid-state imaging device 1A according to the first embodiment. In particular, FIG. 4 is a conceptual diagram of still image shooting operation of the arrangement according to the first embodiment.

In the case of the arrangement according to the first embodiment, the reference signal comparison AD conversion is performed a plurality of times (twice in FIG. 3A) for the P and D phases within one horizontal scan period (period between horizontal synchronizing signals XHS). With the arrangement according to the first embodiment, therefore, the total AD conversion time is a plurality of times (twice in FIG. 3A) longer than in the conventional techniques, thus resulting in a lower frame rate and possibly causing a problem during moving image shooting.

However, the reduction in frame rate is not problematic if a mechanical shutter is used as during still image shooting. As illustrated in FIG. 4, for example, all the unit pixels 3 of the pixel array section 10 are reset at the same time during still image shooting (referred to as simultaneous shuttering of all pixels) (t10), followed by exposure for a given period of time (charge accumulation) and closing of the mechanical shutter (t12). The signal charge is accumulated from the simultaneous shuttering of all the pixels to the closing of the mechanical shutter. Thereafter, a pixel signal is read out one line at a time from the pixel array section 10 to the column AD conversion section 26 with the shutter closed to proceed with the AD conversion with the AD conversion section 250. This pixel signal readout and AD conversion need only be slow. During still image shooting, the reduction in frame rate resulting from performing the reference signal comparison AD conversion a plurality of times for the P and D phases is hardly problematic.

Solid-State Imaging Device

Second Embodiment

Figure 5:
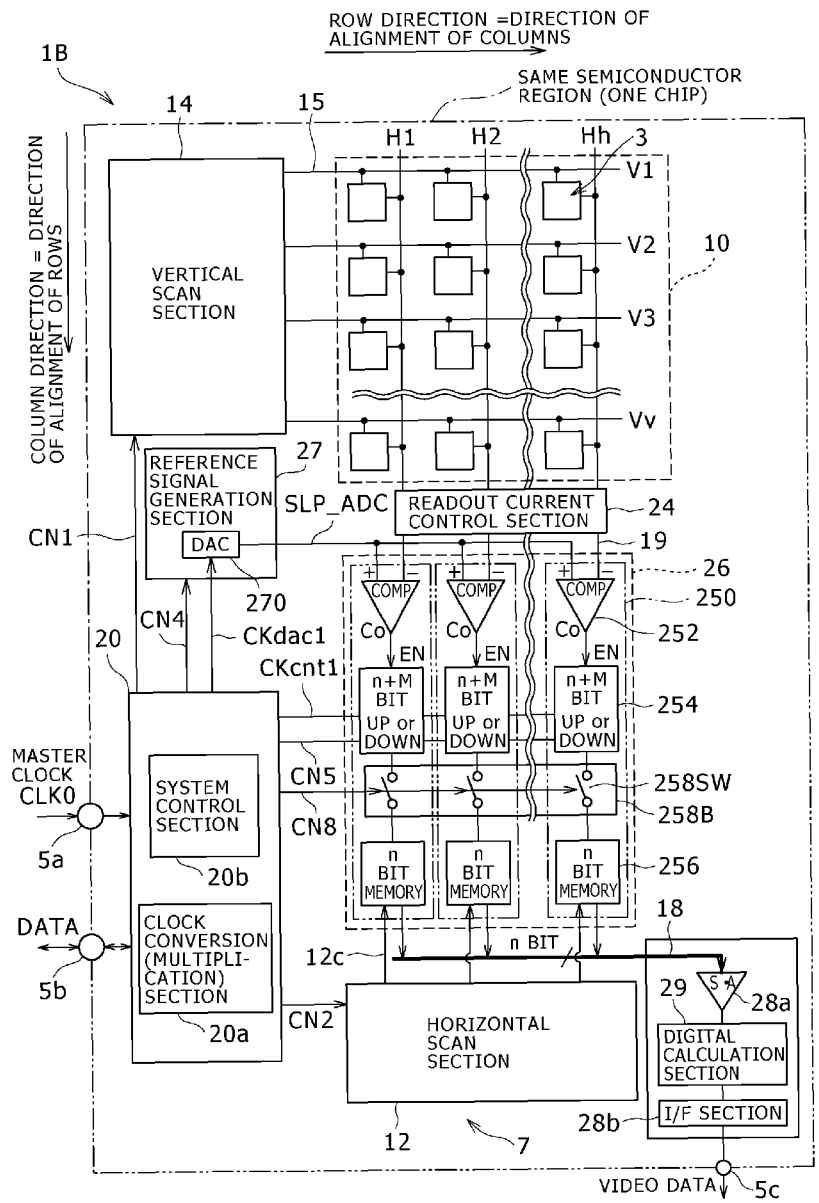
FIG. 5 is a schematic configuration diagram of a solid-state imaging device according to a second embodiment.
Figure 5C:
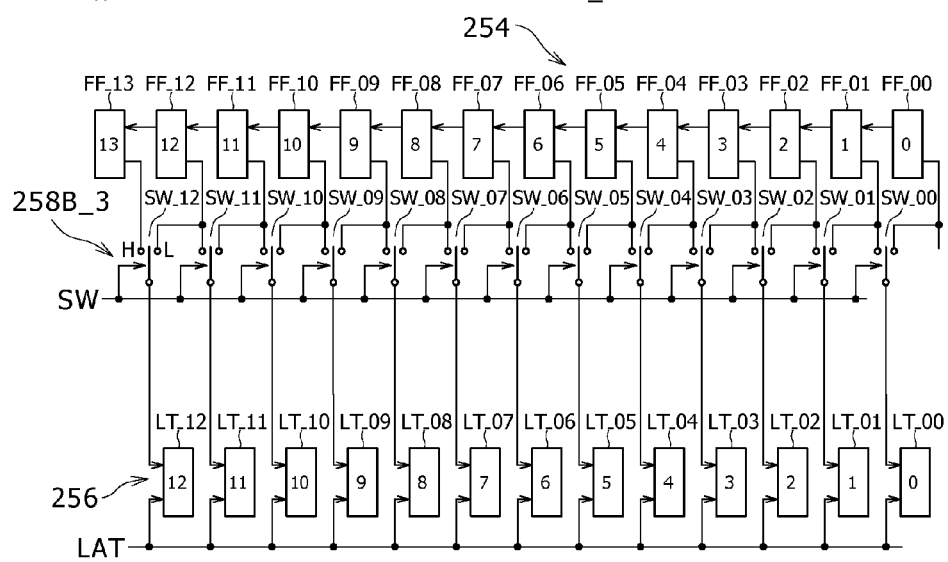
FIG. 5C are diagrams describing the switch section used in the solid-state imaging device according to the second embodiment (third example).

FIGS. 5 to 5C are diagrams describing a solid-state imaging device according to a second embodiment. FIG. 5 is a schematic configuration diagram of the solid-state imaging device according to the second embodiment. FIG. 5A are diagrams describing a switch section 258B_1 used in a solid-state imaging device 1B_1 according to the second embodiment (first example). FIG. 5B are diagrams describing a switch section 258B_2 used in the solid-state imaging device 1B_2 according to the second embodiment (second example). FIG. 5C are diagrams describing a switch section 258B_3 used in a solid-state imaging device 1B_3 according to the second embodiment (third example).

The summation data is averaged by the digital calculation section 29 provided at the subsequent stage of the column AD conversion section 26 in the first embodiment. In the second embodiment, however, the summation data is averaged by the column AD conversion section 26. The second embodiment is identical to the first embodiment in all other respects. A description will be given below with focus on the differences from the first embodiment.

First, the counter section 254 of each of the solid-state imaging devices 1B_1 and 1B_2 according to the second embodiment is configured to be "n+M" bits wide. However, the data storage section 256 and horizontal signal line 18 are configured to be n bits wide. There is a difference of M bits between the "n+M"-bit-wide counter section 254 and the n-bit-wide wide horizontal signal line. Using this difference, the division (digital integration) of $1/2^M$ is performed by the AD conversion section 250.

The function to perform the division of $1/2^M$ is achieved by the data selection control of the switch section 258B. Therefore, the configuration of the switch section 258B provided between the counter section 254 and data storage section 256 differs from that in the first embodiment. The switch section 258B according to the second embodiment has a data selection function to select either the higher or lower n bits of the "n+M" bits of data output from the counter section 254 and deliver the selected data to the data storage section 256. Basically, the switch section 258B delivers only higher n bits of the "n+M" bits of data output from the counter section 254 to the n-bit-wide data storage section 256 and discards the M bits of data during the multi-summation AD conversion process for simplified division. It may be considered that the averaging process section includes the data storage section 256 and switch section 258B.

For example, FIGS. 5A to 5C show a case in which n=13, W=2 and M=1. The counter section 254 includes 14 (=n+M=13+1) stages of flip-flops FF connected in a ripple counter fashion. The data storage section 256 includes 13 latches LT.

In the case of the solid-state imaging device 1B_1 according to the second embodiment (first example), the data storage section 256 is divided into two groups, namely, higher six bits and lower seven bits, as illustrated in FIG. 5A(1), so that the data of each group is transferred over the independent horizontal signal line 18. Such an arrangement is referred to as a multi-bus configuration.

The advantage of the division into groups (multiple buses) lies in reduction of transfer time. If data is transferred over a single bus as in the second example which will be described later, the time required to transfer data is 13 clocks because data must be transferred one bit at a time. In contrast, multiple buses allows for data to be transferred a plurality of pieces of data at a time at the same timing because the divided buses are independent of each other. For example, if the zeroth to sixth bits are assigned to bus 1 and the seventh to twelfth bits to bus 2 with the seventh bit serving as a boundary, the zeroth and seventh bits are transferred at the same timing. Although it takes seven clocks to transfer the zeroth to sixth bits over the bus 1, the seventh to twelfth bits are simultaneously transferred over the bus 2. Therefore, it takes only seven clocks to transfer all the bits.

In order to achieve such an arrangement, the input sides of the latches LT of the data storage section 256 for the higher six bits (seventh to twelfth bits) are connected together with a common wire BUS1, and the input sides of the latches LT thereof for the lower seven bits (zeroth to sixth bits) are connected together with a common wire BUS2. The single input/single output switches SW are provided between the output sides of the flip-flops FF of the higher six bits (eighth to thirteenth bits) of the counter section 254 and the common wire BUS1. The single input/single output switches SW are provided between the output sides of the flip-flops FF of the lower seven bits (zeroth to sixth bits) of the counter section 254 and the common wire BUS2.

A switch SW_07 is provided first between the output side of the flip-flop FF of the remaining seventh bit (approximately at the center). A two-input/single-output switch SW_BUS is provided between the output thereof and the common wires BUS1 and BUS2. Both the single-input/single-output and two-input/single-output switches SW are supplied with switch control signals SW at their control input ends. The switch control signals SW define the connection timings. The connection between the input and output ends can be switched (enabled or disabled) based on the same signals SW.

Single-input/single-output switches SW_00 to SW_13 are supplied respectively with active high switch control signals SW_00 to SW_13 from the communication/timing control section 20. The same signals SW_00 to SW_13 enable or disable the same switches SW_00 to SW_13. The switch SW_BUS is supplied with a switch control signal SELBUS from the communication/timing control section 20. The switch control signal SELBUS controls whether to deliver the count data of the seventh bit to the common wire BUS1 or BUS2. For example, the common wire BUS1 is selected when the switch control signal SELBUS is low, and the common wire BUS2 is selected when the switch control signal SELBUS is high.

The latches LT are supplied respectively with latch (load) control signals LAT00 to LAT12 from the communication/timing control section 20. The same signals LAT00 to LAT12 define the latch (load) timings for the respective latches LT. The latches LT load and hold data in synchronism with the leading edge of the latch control signal LAT.

As illustrated in FIG. 5A(2-1) and 5A(2-2), there is a phase difference of one clock between the switch control signals SW and between the latch control signals LAT for different bits, and there is a phase difference of half a clock between the switch control signal SW and latch control signal LAT for the associated bits. The switch control signals SW are controlled to lag the associated latch control signals LAT by half a clock so as to load the data at the trailing edge of the latch control signals LAT.

The switch SW_BUS provided at the output side of the latch of the seventh bit switches between destinations of the count data of the seventh bit. The switch SW_BUS transfers the data to the common wire BUS1 during a normal AD conversion (switch control signal SELBUS: low), and to the common wire BUS2 during a two-time integration AD conversion (switch control signal SW07: high).

Here, as illustrated in FIG. 5A(2), the data is transferred from the counter section 254 to the data storage section 256 by switching between the switch control signals SW and latch control signals LAT in an arbitrary order while at the same time maintaining consistency between the bit positions of these signals. That is, the communication/timing control section 20 sequentially switches between the switch control signals SW and latch control signals LAT in association with the bit positions of the data to be delivered from the counter section 254 to the data storage section 256.

For example, FIG. 5A(2-1) shows a case in which the normal one-time integration AD conversion is performed with 12-bit resolution with the thirteenth bit of the counter section 254 serving as a sign bit. Because the highest of the 14 bits is not required, the switch control signal SW13 for the highest bit is left inactive. The remaining switch control signals SW00 to SW12 are switched in an arbitrary order (e.g., in ascending order). The latch control signals LAT00 to LAT12 of the associated bit positions are switched as the switch control signals are switched. That is, the switch section 258 performs the connection and conversion adapted to transfer the count data of the zeroth bit to the latch LT of the zeroth bit (LSB), and so on, and finally the count data of the twelfth bit to the latch LT of the twelfth bit (MSB).

On the other hand, FIG. 5A(2-2) shows a case in which the two-time integration AD conversion is performed with 12-bit resolution of the counter section 254. In this case, the count data is equivalent to 14 bits in width including the sign bit. However, because the data is adjusted to 13 bits by discarding the lowest bit, the switch control signal SW00 for the lowest bit is left inactive when the count data is transferred to the data storage section 256. Of the 14 bits of data output from the counter section 254, only the higher 13 bits of data are delivered to the 13-bit-wide data storage section 256. The lower bit data (one bit or LSB of data in the present example) is discarded. The remaining switch control signals SW01 to SW13 are switched in an arbitrary order (e.g., in ascending order). The latch control signals LAT00 to LAT12 of the associated bit positions are switched in an arbitrary order (e.g., in ascending order) as the switch control signals are switched. That is, the switch section 258 performs the connection and conversion adapted to transfer the count data of the first bit to the latch LT of the zeroth bit (LSB), and so on, and finally the count data of the thirteenth bit to the latch LT of the twelfth bit (MSB).

As a result, the AD conversion section 250 performs the division of $½^M=½$ during the two-time integration AD conversion in which the two-time sampling AD conversion and CDS are performed, thus allowing for the sum to be averaged by the AD conversion section 250. This approach ensures, as a signal processing block, that the data bit count is the same (13 bits) during normal and multi-summation AD conversions, thus making it easy to configure the circuits.

It should be noted that it is not absolutely essential to divide the data storage section 256 into the higher and lower bit groups and use a two-input/single-output switch for the boundary bit of the counter output (seventh bit in the first example) so as to selectively switch between the wires of the two groups. In the case of the solid-state imaging device 1B_2 according to the second embodiment (second example), for example, the data storage section 256 is not divided into groups. Instead, all the input sides of the data storage section 256 are connected to the common wire BUS, with the single-input/single-output switches SW provided between the output sides of the flip-flops FF of the counter section 254 and the common wire BUS, as illustrated in FIG. 5B(1). The second example is advantageous in that simple single-input/single-output switches can be used for all the switches SW.

In the second embodiment (second example) described above, the switch control signals SW and latch control signals LAT are also switched in an arbitrary order while at the same time maintaining consistency between the bit positions of these signals as illustrated in FIG. 5B(2), thus transferring the data from the counter section 254 to the data storage section 256. It should be noted that, unlike the first example, the switch control signals SW are controlled to lead the associated latch control signals LAT by half a clock so as to load the data at the leading edge of the latch control signals LAT.

For example, FIG. 5B(2-1) shows a case in which the normal one-time integration AD conversion is performed. The switch control signal SW13 for the highest bit is left inactive. The remaining switch control signals SW00 to SW12 are switched in an arbitrary order (e.g., in ascending order). The latch control signals LAT00 to LAT12 of the associated bit positions are switched in an arbitrary order (e.g., in ascending order) as the switch control signals are switched.

FIG. 5B(2-2) shows a case in which the two-time integration AD conversion is performed. Of the 14 bits, only the higher 13 bits of data are used. Therefore, the switch control signal SW00 for the lowest bit is left inactive. The remaining switch control signals SW01 to SW13 are switched in an arbitrary order (e.g., in ascending order). The latch control signals LAT00 to LAT12 of the associated bit positions are switched as the switch control signals are switched, thus discarding the lower one bit of data.

In the case of the solid-state imaging device 1B_2 according to the second embodiment (third example), the two input/single output switches SW are provided between the output sides of the flip-flops FF of the counter section 254 and the latches LT of the data storage section 256 as illustrated in FIG. 5C(1). The switch SW, whose output end is connected to the latch LT of the kth (where k is any of 0 to n) bit, has its first input end connected to the output of the flip-flop FF of the kth bit and its second input end connected to the output of the flip-flop FF of the "k+1"th bit.

It should be noted that, for general deployment, (M+1) input/one output switches SW are, for example, provided. The switch SW, whose output end is connected to the latch LT of the kth (where k is any of 0 to n) bit, has its first input end connected to the output of the flip-flop FF of the kth bit and its second input end connected to the output of the flip-flop FF of the "k+1"th bit. The switch SW has its other input ends connected in the same manner, and finally, its M+1th input end connected to the output of the flip-flop FF of the "k+M"th bit. This makes it possible to deal with an arbitrary number of repetitions. If the number of repetitions W is fixed, the two input/single output switches SW may be provided so that the switch SW, whose output end is connected to the latch LT of the kth bit, has its first input end connected to the output of the flip-flop FF of the kth bit and its second input end connected to the output of the flip-flop FF of the "k+M"th bit. That is, whichever types of the switches SW are used, it is only necessary to connect the input ends of the switches SW in such a manner as to be associated with the bit positions of the data to be delivered from the data output ends of the counter section 254 to the data storage section 256.

The switches SW are supplied commonly with the switch control signal SW from the communication/timing control section 20. The switch control signal SW controls the switches SW. As illustrated in FIG. 5C(2), for example, the switch control signal SW is low during a normal AD conversion, and high during a two-time integration AD conversion in which the two-time sampling AD conversion and CDS are performed. Each of the switches SW selects the output of the flip-flop FF of the kth bit when the switch control signal SW is low, and the output of the flip-flop FF of the k+M (k+1 in the present example)th bit when the switch control signal SW is high.

The latches LT are supplied commonly with the latch control signal LAT from the communication/timing control section 20. The latch control signal LAT controls the latch timing. The latches LT load and hold data in synchronism with the leading edge of the latch control signal LAT.

If the counter section 254 performs the normal one-time integration AD conversion with 12-bit resolution, the switch control signal SW is low, and the latch control signal LAT is active high at a given timing when 13-bit count data including the sign bit is transferred to the data storage section 256. As a result, the switch section 258 performs the connection and conversion adapted to transfer the count data of the zeroth bit to the latch LT of the zeroth bit (LSB), and so on, and finally the count data of the twelfth bit to the latch LT of the twelfth bit (MSB).

On the other hand, if the counter section 254 performs the two-time integration AD conversion with 12-bit resolution, the count data is equivalent to 14 bits in width including the sign bit. When the count data is transferred to the data storage section 256, the switch control signal SW is high, and the latch control signal LAT is active high at a given timing. As a result, the switch section 258 performs the connection and conversion adapted to transfer the count data of the first bit to the latch LT of the zeroth bit (LSB), and so on, and finally the count data of the thirteenth bit to the latch LT of the twelfth bit (MSB). Of the 14 bits of data output from the counter section 254, only the higher 13 bits of data are delivered to the 13-bit wide data storage section 256. The lower bit data (one bit or LSB in the present example) is discarded.

In the case of the third example, there is no need to control the shifting of the switches SW as in the first and second examples. That is, the control signals SW and LAT are connected commonly to the switches and latches respectively, thus making it impossible to control the shifting. The switches SW and latches LT of the different bits are switched all together irrespective of the data bit positions when the communication/timing control section 20 changes the statuses of the control signals SW and LAT. When the latch control signal LAT changes to active high level, the count data of the counter section 254 is latched all together to the associated bit positions of the data storage section 256.

As a result, the AD conversion section 250 performs the division of $½^M=½$ during the multi-summation AD conversion in the third example, as well. Virtually, this allows for the sum to be averaged by the AD conversion section 250. As a signal processing block, the data bit count is the same (13 bits) during normal and multi-summation AD conversions in the third example as in the first example, thus making it easy to configure the circuits.

It should be noted that although, here, the switch control signal SW and latch control signal LAT are wired commonly to the switches and latches, respectively, this is not absolutely essential. Instead, each of the switch control signals SW or latch control signals LAT may be wired to the associated switch or latch. Also in this case, the communication/timing control section 20 need only change the statuses of the control signals SW and LAT all together irrespective of the data bit positions. No matter how the control signals SW and LAT are wired, the communication/timing control section 20 need only change the statuses of the control signals SW and LAT all together so that the data is transferred all together from the counter section 254 to the data storage section 256 irrespective of the data bit positions.

The arrangement according to the second embodiment (first to third examples) performs the summation using the counter section 254 and shifts the bits by controlling the switches of the switch section 258 provided between the counter section 254 and data storage section 256, thus achieving a binary division in a convenient manner. This makes it possible to readily perform the sum averaging, thus providing a smaller layout than when configuring a pure (accurate) sum averaging circuit. Even such an approach does not adversely affect the normal AD conversion. It is possible to adopt a switch configuration which remains unaffected by the number of repetitions W when the higher n bits of the "n+M" bits of data are selected and delivered to the data storage section 256. The number of repetitions W can be changed as desired according to the application.

It should be noted that although, in the second embodiment, the different sections are controlled so as to carry out either the normal AD conversion adapted to perform the n-bit AD conversion once and the digital integration adapted to perform the n-bit AD conversion W times, this is not absolutely essential. If it is sufficient to deal only with the digital integration, the switch section 258B need not be configured to discard the higher bits of data. The same section 258B need only be configured to discard the lower bits of data.

Solid-State Imaging Device

Third Embodiment

Figure 6:
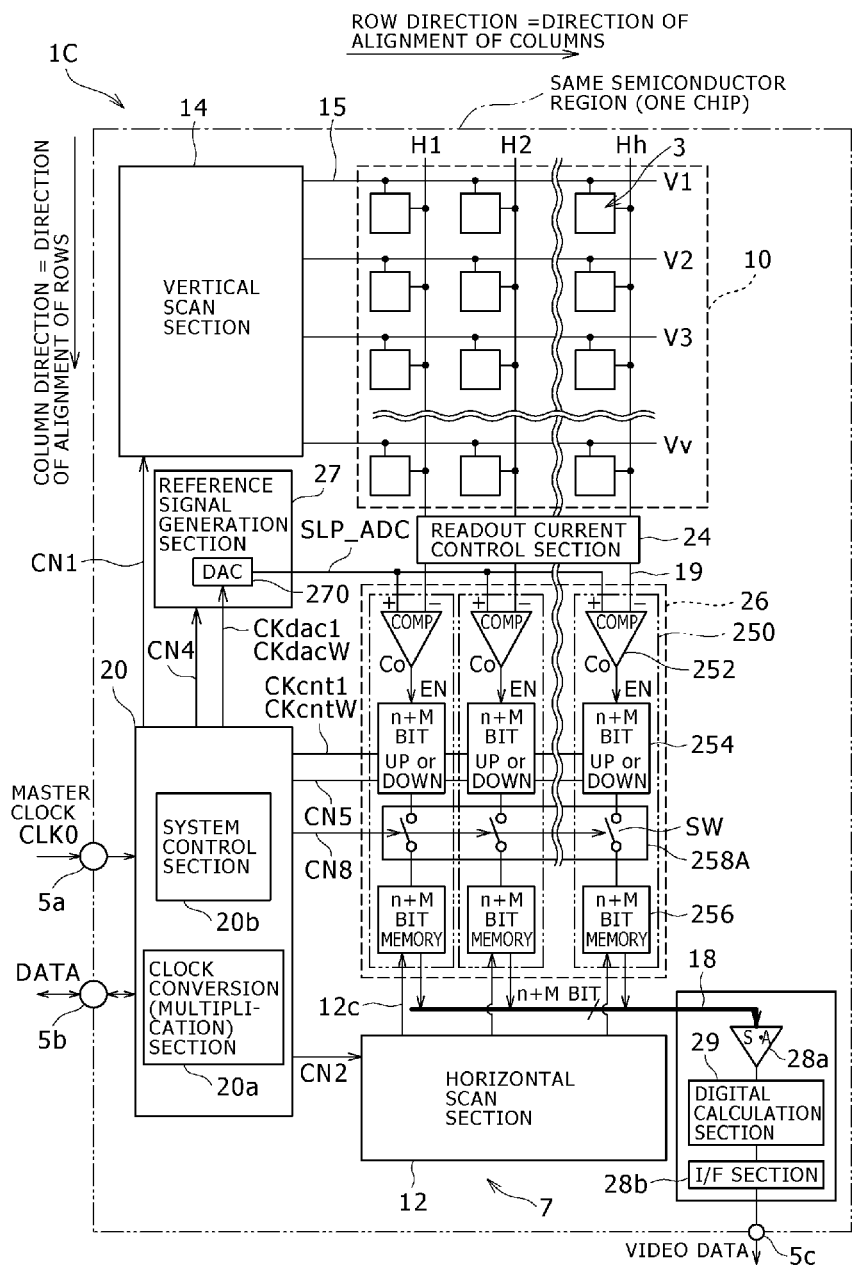
FIG. 6 is a schematic configuration diagram of a solid-state imaging device according to a third embodiment.

FIGS. 6 and 6A are diagrams describing a solid-state imaging device according to a third embodiment. Here, FIG. 6 is a schematic configuration diagram of a solid-state imaging device 1C according to the third embodiment. Although a modification example of the first embodiment is shown here, the second embodiment may be modified in the same manner.

FIG. 6A is a diagram describing the operation of the solid-state imaging device 1C according to the third embodiment.

As with the fourth embodiment which will be described later, the third embodiment offers a countermeasure against the reduction in frame rate described in relation to the first embodiment. A description will be given below with focus on the differences from the first embodiment. The basic idea behind the countermeasure against the reduction in frame rate according to the third and fourth embodiments is to perform the reference signal comparison AD conversion W times faster during the multi-summation AD conversion repeated W times for the P and D phases, thus maintaining the frame rate unchanged. The reduction in frame rate is prevented by speeding up the operation of the reference signal generation section 27 and AD conversion section 250.

Here, a possible solution to performing the reference signal comparison AD conversion W times faster would be to speed up the counting of the AD conversion section 250 (counter section 254) W times faster and making the slope of the reference signal SLP_ADC for AD conversion steeper.

In order to speed up the counting of the counter section 254 of the AD conversion section 250 W times faster, the communication/timing control section 20 of the solid-state imaging device 1C according to the third embodiment supplies a count clock CKcntW to the counter section 254. The count clock CKcntW is W times higher in frequency than the count clock CKcnt1. As a circuit, the AD conversion section 250 is configured in the same manner as the AD conversion section 250A according to the first embodiment. The count clock CKcntW is generated by the clock conversion section 20a of the communication/timing control section 20, for example, through PLL. The frequency of the count clock CKcntW adapted to operate the counter section 254 must be W times higher than in the first embodiment. As a result, the increase in power consumption of the AD conversion section 250 due to speedup is inevitable. The countermeasure against the reduction in frame rate according to the third embodiment is similar to that according to the fourth embodiment which will be described later in these respects.

In order to make the slope of the reference signal SLP_ADC for AD conversion steeper, on the other hand, the counter making up the DA conversion unit 270 is operated W times faster in the third embodiment rather than changing the prescribed current or current-voltage conversion resistance of the DA conversion unit 270. This approach is referred to as the approach for speeding up the clock of the counter section 312 of the DA conversion unit 270.

Figure 10:
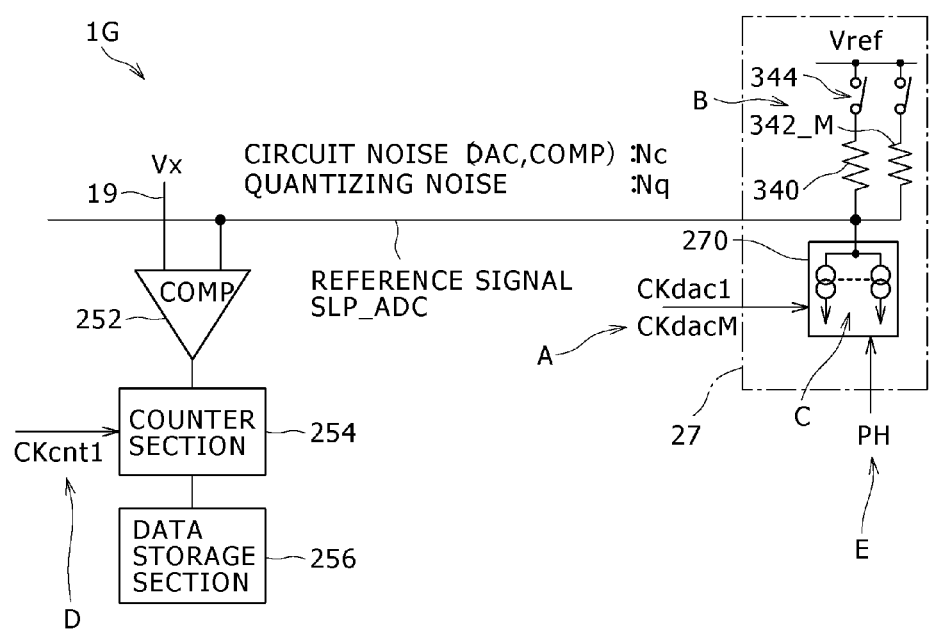
FIG. 10 is a simplified circuit configuration diagram with focus on noise characteristic of a solid-state imaging device according to a seventh embodiment.

Although described later, the current-voltage conversion resistance is increased W times in the fourth embodiment rather than changing the prescribed current of the DA conversion unit 270 or the operation speed of the counter making up the DA conversion unit 270 to make the slope of the reference signal SLP_ADC for AD conversion steeper. This approach is referred to as the method for speeding up the clock of the counter section 312 of the DA conversion unit 270. This approach is referred to as the approach for speeding up the current-voltage conversion by changing the resistance. In addition to these approaches, the weight for the count value of the counter section 312 may be increased W times by increasing the prescribed current of the DA conversion unit 270 W times rather than changing the operation speed of the counter making up the DA conversion unit 270 or the current-voltage conversion resistance (e.g., refer to arrow C in FIG. 10 showing a seventh embodiment which will be described later). This approach is referred to as the approach for speeding up the current-voltage conversion by changing the current.

In order to speed up the counting of the DA conversion unit 270 W times faster, the communication/timing control section 20 supplies the count clock CKdacW rather than the count clock CKdac1 to the DA conversion unit 270 to operate the counter section 312 of the same unit 270. The count clock CKdacW has a frequency W times higher than the count clock CKdac1. As a circuit, the DA conversion unit 270 is configured in the same manner as that according to the first embodiment. The count clock CKdacW is generated by the clock conversion section 20a of the communication/timing control section 20, for example, through PLL. A clock conversion section may be provided in the reference signal generation section 27 so that the count clock CKdac1 is supplied to the DA conversion unit 270, and that the clock conversion section in the reference signal generation section 27 generates the count clock CKdacW having a frequency W times higher than the count clock CKdac1.

Just as the same clock can be used both as the count clocks CKcnt1 and CKdac1 in the first embodiment, so can the same clock be used both as the count clocks CKcntW and CKdacW in the third embodiment.

If the count clock for the DA conversion unit 270 is W times (twice and four times in FIG. 6A(1)) higher in frequency than the count clock CKdac1 as in the generation of the reference signal SLP_ADC shown in FIG. 6A(1), the slope of the reference signal SLP_ADC can be made W times steeper than in the first embodiment even when the voltage change ΔSLP-dac (=I_0×R_340) per clock is the same as in the first embodiment with no change made to the prescribed current or current-voltage conversion resistance of the DA conversion unit 270. At this time, if the count clock CKcntW is used for the counter section 254 that is W times (twice in FIG. 6A(2)) higher in frequency than the count clock CKcnt1 as in the overall operation shown in FIG. 6A(2), the same count data can be obtained every time for the same pixel signal voltage Vx, thus providing W-fold multiplied data.

In the third embodiment, therefore, the reference signal generation section 27 (DA conversion unit 270) generates the reference signal SLP_ADC W times faster, and the counter section 254 performs the counting W times faster, as well, thus speeding up the AD conversion and preventing the reduction in frame rate resulting from multi-summation AD conversion.

Here, the approach according to the third embodiment for speeding up the counting of the counter section 312 of the DA conversion unit 270 is advantageous in that the modification is easy to achieve because the reduction in frame rate can be solved by changing the counter clock speed. This approach is also advantageous in that the same counter clock can be used for the AD conversion sections 250 and DA conversion unit 270 as described earlier. It should be noted, however, that although the power consumption required to generate the reference signal SLP_ADC once is the same as in the first embodiment, the reference signal SLP_ADC is generated repeatedly W times during a horizontal scan period. Therefore, the power consumption will likely be roughly W times greater. In addition, the count clock CKdac adapted to operate the DA conversion unit 270 must be increased W times higher in frequency than in the first embodiment, thus resulting in higher power consumption of the counter section 312, as well. Therefore, the arrangement according to the third embodiment leads to higher power consumption due to speed up more frequently than in the fourth embodiment.

Solid-State Imaging Device

Fourth Embodiment

Figure 7:
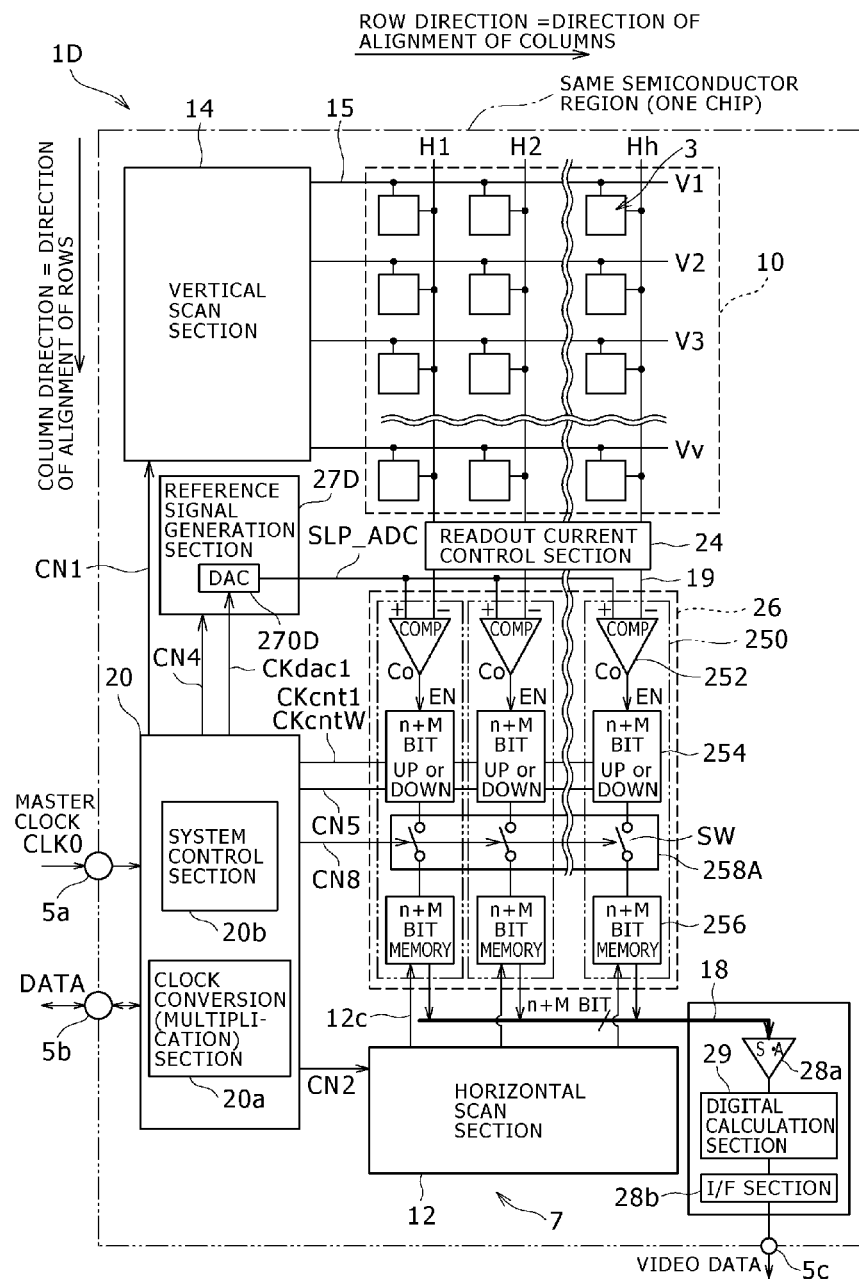
FIG. 7 is a schematic configuration diagram of a solid-state imaging device according to a fourth embodiment.
Figure 7A:
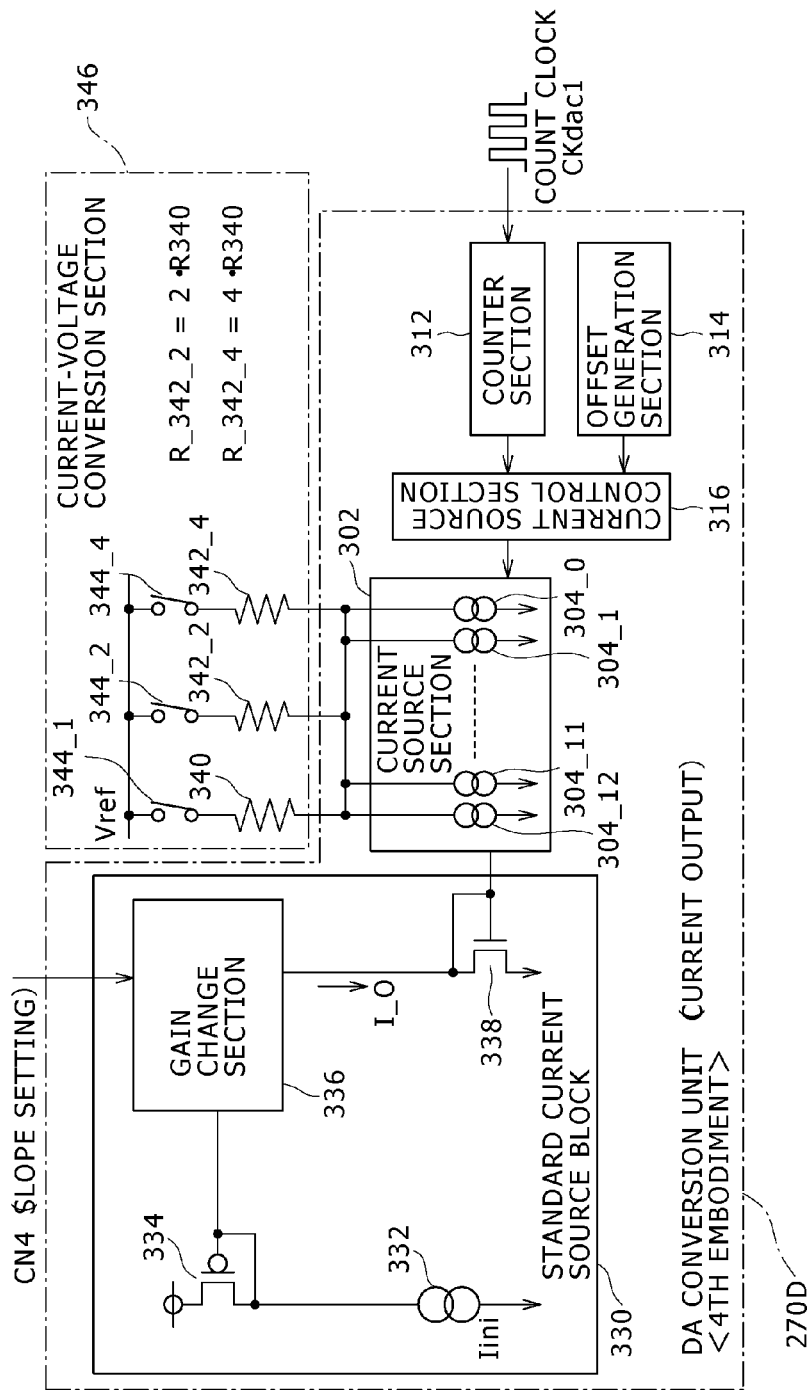
FIG. 7A is a diagram illustrating a configuration example of a reference signal generation section used in the solid-state imaging device according to the fourth embodiment.

FIGS. 7 to 7B are diagrams describing a solid-state imaging device according to the fourth embodiment. Here, FIG. 7 is a schematic configuration diagram of a solid-state imaging device 1D according to the fourth embodiment. Although a modification example of the first embodiment is shown here, the second embodiment may be modified in the same manner. FIG. 7A is a diagram illustrating a configuration example of a reference signal generation section 27D used in the solid-state imaging device 1D according to the fourth embodiment. FIG. 7B are diagrams describing the operation of the reference signal generation section 27D (DA conversion unit 270D) in the solid-state imaging device 1D according to the fourth embodiment.

As outlined in relation to the third embodiment, the fourth embodiment offers a countermeasure against the reduction in frame rate described in relation to the first embodiment. In particular, the fourth embodiment differs from the third embodiment in that the current-voltage conversion resistance is increased W times rather than changing the prescribed current (I_0) or the operation speed of the counter making up the DA conversion unit 270D.

As illustrated in FIG. 7, in order to speed up the counting of the counter section 254 of the AD conversion section 250 W times, the communication/timing control section 20 of the solid-state imaging device 1D according to the fourth embodiment supplies the count clock CKcntW to the counter section 254. The count clock CKcntW is W times higher in frequency than the count clock CKcnt1. In order to ensure that the DA conversion unit 270D performs the counting at the same speed as during the normal AD conversion, on the other hand, the communication/timing control section 20 supplies the count clock CKdac1 to the DA conversion unit 270D as a clock to operate the counter section 312 of the DA conversion unit 270D as in the first embodiment. That is, the counter making up the DA conversion unit 270D operates at the same speed as in the first embodiment. In the fourth embodiment, therefore, the same counter clock cannot be used for the DA conversion unit 270D and AD conversion section 250 (counter section 254).

The DA conversion unit 270D according to the fourth embodiment first includes, as an example, a single input/single output switch 344_1 between the resistor element 340 and standard power source Vref as illustrated in FIG. 7A. The DA conversion unit 270D further includes resistor elements 342_W each having a resistance of R_342_W in parallel with the resistor element 340 having a resistance of R_340. The DA conversion unit 270D includes single input/single output switch 344_W each between one of the added resistor elements 342_W and standard power source Vref. The switches 344_W are supplied with a control signal from the communication/timing control section 20 at their control input ends. The control signal controls the mode of the AD conversion, namely, the number of times the summation is performed. The resistor elements 340 and 342 and switches 344 make up a current-voltage conversion section 346 whose resistance can be changed during current-voltage conversion. The ratio between the resistance R_340 of the resistor element 340 and the resistance R_342_W must be 1:W. During the normal AD conversion, only the switch 344_1 is turned on, with the remaining switches left off. During the multi-summation AD conversion, the switch 344_W is turned on, with the remaining switches left off. This ensures that the current-voltage conversion resistance is W times larger than during the normal AD conversion.

It should be noted that the configuration of the current-voltage conversion section 346 shown here is merely an example. The same section 346 may be configured in a variety of manners by combining series and parallel resistor element circuits and switches. Any configuration may be adopted so long as the current-voltage conversion resistance can be increased W times during the multi-summation AD conversion (digital integration) than during the normal AD conversion.

If the current-voltage conversion resistance of the DA conversion unit 270 is W times larger than during the normal AD conversion as in the generation of the reference signal SLP_ADC shown in FIG. 7B(1), the voltage change ΔSLP-dac per clock becomes W times greater without changing the prescribed current or count clock of the DA conversion unit 270. As a result, the slope of the reference signal SLP_ADC can be made W times steeper than in the first embodiment. At this time, if the count clock CKcntW is used for the counter section 254 that is W times (twice in FIG. 7B(2)) higher in frequency than the count clock CKcnt1 as in the overall operation shown in FIG. 7B(2), the same count data can be obtained every time for the same pixel signal voltage Vx, thus providing W-fold multiplied data. The fourth embodiment also speeds up the AD conversion, thus solving the reduction in frame rate resulting from multi-summation AD conversion.

At this time, the current-voltage conversion resistance is W times larger than during the normal AD conversion. Therefore, the power consumption required to generate the reference signal SLP_ADC once is one-Wth of that in the first embodiment, and the reference signal SLP_ADC is generated repeatedly W times during a horizontal scan period. Therefore, as far as the current-voltage conversion is concerned, the power consumption will likely be roughly the same as in the first embodiment. As a result, the power consumption will remain unchanged despite speedup. In addition, there is no need to increase the frequency of the count clock CKdac adapted to operate the DA conversion unit 270. As a result, the power consumption of the counter section 312 remains unchanged. Therefore, the arrangement according to the fourth embodiment keeps the increase in power consumption lower than in the third embodiment described earlier. The arrangement according to the fourth embodiment for speeding up the current-voltage conversion of the DA conversion unit 270D with the resistance is advantageous in that the power consumption of the DA conversion unit 270D remains unchanged, and that the speed of the clock fed to the same unit 270D is the same, thus solving the reduction in frame rate without increasing the power consumption of the reference signal generation section 27D.

Solid-State Imaging Device

Fifth Embodiment

Figure 8A:
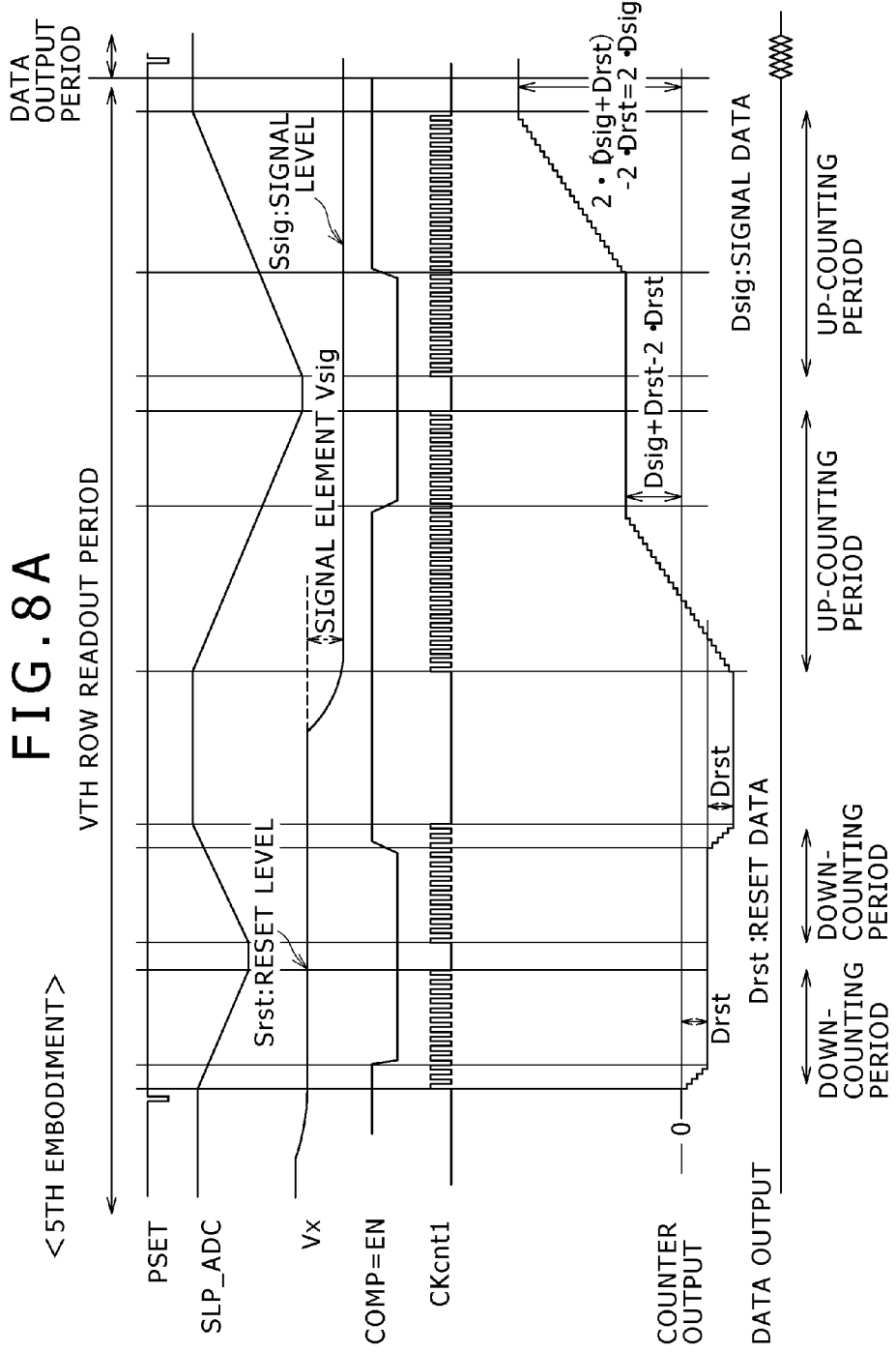
FIG. 8A is a timing diagram describing the operation of the solid-state imaging device according to the fifth embodiment.

FIGS. 8 and 8A are diagrams describing a solid-state imaging device according to a fifth embodiment. Here, FIG. 8 is a schematic configuration diagram of a solid-state imaging device 1E according to the fifth embodiment. Although a modification example of the first embodiment is shown here, the second to fourth embodiments may be modified in the same manner. FIG. 8A is a timing diagram describing the operation of a solid-state imaging device 1E according to the fifth embodiment.

The fifth embodiment speeds up the operation of the multi-summation AD conversion from an aspect different from the frame rate. In the first embodiment, the reference signal SLP_ADC for AD conversion is varied during the second AD conversion onward in the same manner as during the first AD conversion. This requires a period of time for the reference signal SLP_ADC to be restored to its preparatory potential (maximum potential in FIG. 8A) and a settling time. The fifth embodiment is designed to resolve this problem, reducing the time required for the reference signal SLP_ADC to be restored to its preparatory potential by varying the same signal SLP_ADC (by generating the reference signal SLP_ADC of opposite orientation) in the opposite direction (i.e., reversing the sign) starting from the final value of the same signal SLP_ADC at the completion of the first AD conversion while maintaining the slope unchanged.

In order to vary the reference signal SLP_ADC in the opposite direction while maintaining the slope unchanged, the counter section 312 of the DA conversion unit 270 is configured to be capable of switching between down-counting and up-counting modes. Then, it is only necessary to operate the counter section 312 in the counting mode opposite to that used for the first AD conversion, starting from the final value at the completion of the first AD conversion. For example, if the counter section 312 operates in up-counting mode during the first AD conversion, the same section 312 must operate in down-counting mode during the second AD conversion. It should be noted that if the number of repetitions W is three or greater, it is only necessary to vary the reference signal SLP_ADC during odd-numbered AD conversions in the same manner as during the first AD conversion and vary the same signal SLP_ADC during even-numbered AD conversions in the same manner as during the second AD conversion.

In order to achieve this control, the DA conversion unit 270 is supplied with a control signal SEL from the communication/timing control section 20 as illustrated in FIG. 8. The same signal SEL controls how many times the AD conversion will have been performed. The DA conversion unit 270 uses the control signal SEL to control the direction of variation of the reference signal SLP_ADC which is specific to the multi-summation AD conversion. The counter section 312 is configured to be capable of switching between down-counting and up-counting modes. The same section 312 operates in different counting modes between odd- and even-numbered AD conversions. This simple configuration is advantageous in that the direction of variation of the reference signal SLP_ADC can be changed.

The AD conversion section 250 deals with the reversal of the direction of variation of this reference signal SLP_ADC for AD conversion between odd- and even-numbered AD conversions. More specifically, it is only necessary for the counter section 254 to perform the counting when the count enable signal EN is high based on the comparison output Co supplied from the comparison section 252 even during even-numbered AD conversions in the AD conversion section 250 of the solid-state imaging device 1E according to the fifth embodiment.

As illustrated, for example, in FIG. 8A, during an odd-numbered AD conversion, when the reference signal SLP_ADC begins to vary, the same signal SLP_ADC is higher than the pixel signal voltage Vx, and the comparison output Co and count enable signal EN are high. During an odd-numbered AD conversion, therefore, the counter section 254 begins the counting when the reference signal SLP_ADC begins to vary, and stops the counting when the count enable signal EN changes to low level as a result of the reference signal SLP_ADC and pixel signal voltage Vx intersecting each other.

During an even-numbered AD conversion, on the other hand, when the reference signal SLP_ADC begins to vary, the same signal SLP_ADC is lower than the pixel signal voltage Vx, and the comparison output Co and count enable signal EN are low. During an even-numbered AD conversion, therefore, the counter section 254 does not begin the counting when the reference signal SLP_ADC begins to vary. Instead, the counter section 254 begins the counting when the count enable signal EN changes to high level as a result of the reference signal SLP_ADC and pixel signal voltage Vx intersecting each other.

That is, in the present example, the counter section 254 of the column AD conversion section 26 need only perform the counting during an odd-numbered AD conversion until the reference signal SLP_ADC and pixel signal voltage Vx intersect each other. The counter section 254 need only begin the counting during an even-numbered AD conversion when the reference signal SLP_ADC and pixel signal voltage Vx intersect each other. The fifth embodiment is identical in that the counting is performed during a period of time when the count enable signal EN is active based on the comparison output Co output from the comparison section 252, requiring no change to the circuit configuration and ensuring ease of dealing with the modification.

Solid-State Imaging Device

Sixth Embodiment

Figure 9:
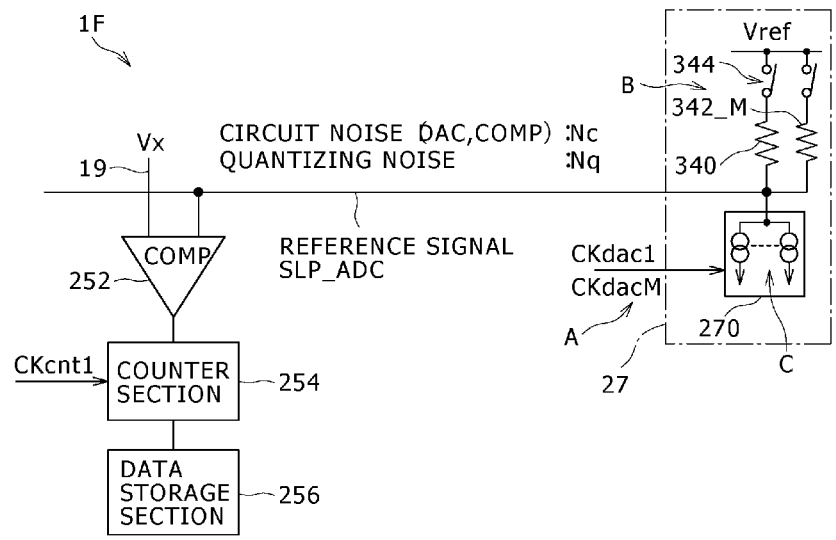
FIG. 9 is a simplified circuit configuration diagram with focus on noise characteristic of a solid-state imaging device according to a sixth embodiment.
Figure 9A:
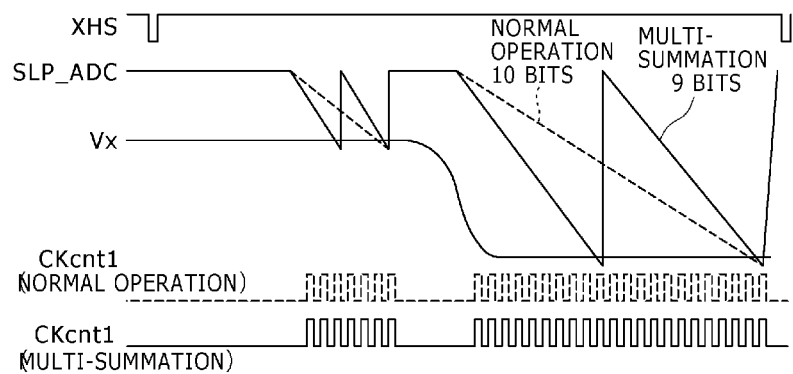
FIG. 9A is a timing diagram describing the operation of the solid-state imaging device according to the sixth embodiment.

FIGS. 9 and 9A are diagrams describing a solid-state imaging device according to a sixth embodiment. Here, FIG. 9 is a simplified circuit configuration diagram with focus on noise characteristic of a solid-state imaging device 1F according to the sixth embodiment. FIG. 9A is a timing diagram describing the operation of the solid-state imaging device 1F according to the sixth embodiment.

The sixth embodiment is designed to provide improved noise characteristic without making any change to the circuits by using the multi-summation AD conversion. The basic idea is to produce an image output with better noise characteristic than the n-bit AD conversion although despite "n–M"-bit accuracy because circuit noise Nc and quantizing noise Nq are multiplied by $1/\sqrt{2^M}$ as a result of the sum averaging. At this time, the count is the same between the normal n-bit AD conversion and the summation of "n–M" bits repeated $2^M$ times. Besides, the averaging is not required. The counter section 254 need only be configured to be as many bits wide as for the normal AD conversion. The same is true when the multi-summation AD conversion is repeated W times with the slope of the reference signal SLP_ADC made W times steeper. On the other hand, if the slope of the reference signal SLP_ADC is made $2^W$ times steeper when W satisfies the inequality $2^{(M-1)} < W \leq 2^M$ (where M is a positive integer equal to or greater than 1), the count for the "n–M"-bit multi-summation AD conversion repeated W times is equal to or less than that for the n-bit AD conversion. Therefore, the counter section 254 need only be configured in the same manner as for the normal AD conversion. A description will be given below of a case in which $W=2^M$ for ease of comprehension unless otherwise specified.

In order to achieve this, the communication/timing control section 20 of the solid-state imaging device 1F according to the sixth embodiment supplies the same count clock CKcnt1 during the multi-summation AD conversion as during the normal AD conversion to the counter section 254 as a clock to operate the same section 254 as illustrated in FIG. 9.

On the other hand, one of the approaches indicated by arrows A, B and C in FIG. 9 is adopted for the reference signal generation section 27 to make the slope of the reference signal SLP_ADC $2^M$ times steeper during the multi-summation AD conversion than during the normal AD conversion. Arrow A indicates an approach adapted to speed up the clock operation of the counter section 312 of the DA conversion unit 270 using a count clock CKdac$2^M$ that is $2^M$ times higher in frequency (refer to the third embodiment). The arrow B indicates an approach adapted to speed up the AD conversion by changing the current-voltage conversion resistance so that the ratio between the resistance R_340 of the resistor element 340 and the resistance R_342_M of the resistor element 342_M is 1:2^M (refer to the fourth embodiment). Arrow C indicates an approach adapted to speed up the AD conversion by changing the current for current-voltage conversion.

If, during the multi-summation AD conversion, the counter section 254 is operated at the same speed as during the normal AD conversion, and the slope of the reference signal SLP_ADC is made 2^M times steeper, the AD conversion resolution becomes ½^Mth. FIG. 9A shows a case in which n=10, M=1 and the number of repetitions W=2. The AD conversion range is 10 bits wide during the normal AD conversion, and nine bits wide during the multi-summation AD conversion.

The noise characteristic at this time can be examined as follows. First, letting the circuit noise be denoted by Nc and quantizing noise by Nq, total circuit-originated random noise Ntotal is $\sqrt{(Nc^2+Nq^2)}$. Here, the circuit noise Nc for the reference signal comparison AD conversion is roughly determined by noise of the reference signal generation section 27 (more specifically, DA conversion unit 270) and comparison section 252. The approach adapted to switch from n bits to "n−M" bits is determined by a current step (ΔSLPadc) of the reference signal generation section 27. However, the circuit noise at this time is determined by the current-voltage conversion resistor elements 340 and 342 and the current flow through these elements. Therefore, the circuit noise at the output of the reference signal generation section 27 is roughly the same for all the approaches indicated by arrows A, B and C.

On the other hand, letting the bit count be denoted by X and the resolution by Δ, the quantizing noise Nq is Δ/√12 (refer to the literature shown below). Therefore, the quantizing noise Nq is smaller for n bits (Nq_n=Δ_n/√12) than for "n−M" bits (Nq_n−M=Δ_n-M/√12). That is, switching to "n−M" bits leads to lower bit accuracy, thus resulting in increased quantizing noise.

Literature: Akira Yukawa, "Signal Handling in Mixed Signal LSI Design—Problems with Frequency Ranges, Sampling and A-D/D-A Conversion," Design Wave Magazine, 2004 October issue, CQ Publishing, p87-93, particularly, "Quantizing Noise Produced by A-D Conversion" on p. 91.

Here, the noise characteristic becomes 1/√2^Mth by averaging the sum 2^M times. Therefore, so long as the circuit noise is greater than the quantizing noise, the reduction in circuit noise and quantizing noise to 1/√2^Mth is greater than the increase in quantizing noise due to switching to "n−M" bits. This permits "n−M"-bit AD conversion with excellent noise characteristic. The same is likely true for W that satisfies the inequality 2^(M−1)<W≤2^M.

Solid-State Imaging Device

Seventh Embodiment

Figure 10A:
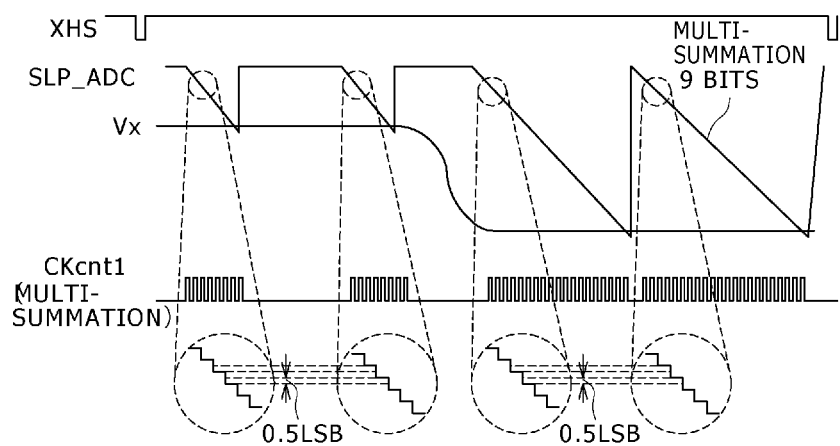
FIG. 10A is a timing diagram describing the operation of the solid-state imaging device according to the seventh embodiment.
Figure 10B:
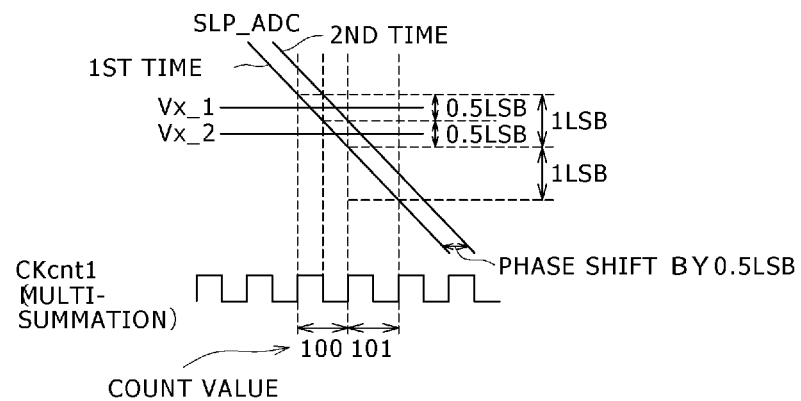
FIG. 10B is a diagram describing quantizing noise in the operation of the solid-state imaging device according to the seventh embodiment.

FIGS. 10 to 10B are diagrams describing a solid-state imaging device according to a seventh embodiment. Here, FIG. 10 is a simplified circuit configuration diagram with focus on noise characteristic of a solid-state imaging device 1G according to the seventh embodiment. FIG. 10A is a timing diagram describing the operation of the solid-state imaging device 1G according to the seventh embodiment. FIG. 10B is a diagram describing quantizing noise in the operation of the solid-state imaging device 1G according to the seventh embodiment.

The seventh embodiment performs the multi-summation AD conversion with "n−M"-bit accuracy as in the sixth embodiment. However, the seventh embodiment keeps down quantizing noise, thus providing an image output with even better noise characteristic than the n-bit AD conversion. That is, the arrangement according to the sixth embodiment is unable to increase the speed of the count clock CKcnt1 of the counter section 254. As a result, circuit-originated random noise can be suppressed if the bit accuracy is reduced. This, in turn, leads to more quantizing noise. The seventh embodiment offers a countermeasure against this problem.

First, the count is the same between the normal n-bit AD conversion and the summation of "n−M" bits repeated 2^M times. Besides, the averaging is not required. The counter section 254 need only be configured to be as many bits wide as for the normal AD conversion. The same is true when the multi-summation AD conversion is repeated W times with the slope of the reference signal SLP_ADC made W times steeper. On the other hand, if the slope of the reference signal SLP_ADC is made 2^M times steeper when W satisfies the inequality 2^(M−1)<W≤2^M (where M is a positive integer equal to or greater than 1), the count for the "n−M"-bit multi-summation AD conversion repeated W times is equal to or less than that for the n-bit AD conversion. Therefore, the counter section 254 need only be configured in the same manner as for the normal AD conversion. A description will be given below of a case in which W=2^M for ease of comprehension unless otherwise specified.

The basic idea to keep down the quantizing noise is to shift the count clock CKcnt1 for the counter section 254 and the reference signal SLP_ADC by "½^M" LSB relatively in each AD conversion. Such an approach according to the seventh embodiment is referred to as the multi-summation, W-time summation or W-time integration AD conversion "in combination with phase shift."

Because the two are shifted "relatively," it is possible to adopt the first approach, namely, shifting the phase of the count clock CKcnt1 by "½^M" LSB in the counter section 254 while at the same time varying the reference signal SLP_ADC in the DA conversion unit 270 at the same timing as in the sixth embodiment during each AD conversion. In contrast to the above, it is also possible to adopt the second approach of shifting the phase of the reference signal SLP_ADC by "½^M" LSB while at the same time using the same count clock CKcnt1 in the counter section 254 as in the sixth embodiment during each AD conversion. Naturally, these two approaches may be combined. The second approach is shown in FIGS. 10A and 10B by way of an operational example.

In order to achieve this, the communication/timing control section 20 of the solid-state imaging device 1G according to the seventh embodiment supplies the count clock CKcnt1 to the counter section 254 (arrow D) as a clock to operate the same section 254 during the multi-summation AD conversion. The count clock CKcnt1 is shifted in phase by "½^M" LSB, for example, when the first approach is adopted. A publicly known circuit configuration may be used to shift the count clock CKcnt1 in phase. Although not described in detail here, it is possible, for example, to feed the count clock CKcnt1 to a shift register so as to sequentially shift the count clock CKcnt1 with a clock 2^M times higher in frequency than the count clock CKcnt1, thus supplying the output of the given shift stage to the counter section 254.

As for the reference signal generation section 27, on the other hand, one of the approaches indicated by arrows A, B and C in FIG. 10 is used, irrespective of whether the first or second approach is adopted, thus making the slope of the reference signal SLP_ADC 2^M times steeper during the multi-summation AD conversion than during the normal AD conversion. The seventh embodiment is identical to the sixth embodiment in this respect. Further, if the second approach is adopted, the communication/timing control section 20 supplies a control signal PH to the DA conversion unit 270 (arrow E). The same signal PH shifts the phase of the reference signal SLP_ADC by "½^M" LSB. The phase of the count clock CKdac need only be shifted by "½^M" LSB to shift the phase of the reference signal SLP_ADC. As a result, the same approach can be adopted as for shifting the phase of the count clock CKcnt1.

In the sixth embodiment, the AD conversion resolution becomes ½^Mth during the multi-summation AD conversion. However, if the count clock CKcnt1 and reference signal SLP_ADC are each shifted in phase relatively by "½^M" LSB during each AD conversion, the resolution can be equivalently increased 2^M times. This is conceptually based on the fact that if the sampling point is shifted in phase by "½^M" LSB during each AD conversion, it becomes possible to make a discrimination in units of "½^M" LSB in the range (one LSB range) in which discrimination is not possible by a single AD conversion. This suppresses the reduction in resolution as a whole, thus allowing for noise reduction despite a lower bit accuracy for each AD conversion.

For example, FIGS. 10A and 10B show a case in which n=10, M=1 and the number of repetitions W=2. In contrast to 10-bit accuracy during the normal AD conversion, the resolution of the reference signal SLP_ADC is reduced to nine bits during the multi-summation AD conversion. In addition, the potential level of the reference signal SLP_ADC during each AD conversion is shifted by 0.5LSB of the reduced resolution. For example, the potential level is shifted by 0.5LSB in the second P phase level AD conversion from the first one. The potential level is also shifted by 0.5LSB in the second D phase level AD conversion from the first one. A 0.5LSB of the reduced (nine-bit) resolution is equal to one LSB of the resolution before the reduction (10-bit resolution). This allows for AD conversion without increasing noise even if the quantizing noise is larger when the bit accuracy is reduced during the multi-summation AD conversion.

This will be described by way of a simpler example. We assume that the dynamic range of the pixel signal voltage Vx is 256 mV, and that the resolution of the DA conversion unit 270 is reduced to nine bits. We also assume that there is no circuit-originated random noise. Although the LSB is 0.5 mV, the maximum quantizing error is 0.25 mV if the potential level is not shifted by 0.5LSB. The reason for this is that each time the pixel signal voltage is shifted by 0.5 mV, the final value changes by 2. However, if the potential level is shifted by 0.5LSB, i.e., 0.25 mV, the maximum quantizing error is 0.125 mV. The reason for this is that each time the potential of the pixel signal voltage Vx is shifted by 0.25 mV, the final value changes by 1.

As illustrated in FIG. 10B, for example, the count is the same during the first AD conversion so long as the pixel signal voltage Vx falls within the LSB (0.5 mV) of the nine bits. If the count clock CKcnt1 and reference signal SLP_ADC are shifted in phase by "½^M" LSB during the second AD conversion, the count value is different depending on whether the pixel signal voltage Vx is higher or lower than the midpoint of that one LSB. For example, pixel signal voltages Vx_1 and Vx_2 are considered. The same voltages Vx_1 and Vx_2 are both "100" in decimal form during the first AD conversion. For the pixel signal voltage Vx_1 higher than the midpoint of the one LSB, "100" is obtained again during the second AD conversion. Averaging these results provides "100" (Vx_1: (100+100)/2=100). For the pixel signal voltage Vx_2 lower than the midpoint of the one LSB, on the other hand, "101" is obtained during the second AD conversion. Averaging these results provides "100.5" (Vx_2: (100+101)/2=100.5). Although each AD conversion is handled with nine-bit resolution, the two-time integration in combination with phase shift permits half count discrimination. As a result, it is acceptable to understand that the same accuracy (resolution) as the LSB of the 10-bit AD conversion is obtained.

Although not illustrated, when the number of repetitions W=4, it is only necessary to shift by ¼LSB of the reduced resolution. That is, it is only necessary to shift by one LSB of the resolution before the reduction. The reference signal SLP_ADC during the second P and D phase level AD conversions is shifted by ¼LSB in phase relative to the same signal SLP_ADC during the first P and D phase level AD conversions. The same signal SLP_ADC during the third P and D phase level AD conversions is shifted by 2/4LSB in phase, and the same signal SLP_ADC during the fourth P and D phase level AD conversions by ¾LSB in phase.

For general deployment, it will be understood that it is advisable to make the slope of the reference signal SLP_ADC 2^M times steeper and shift the sampling point in phase by "½^M" LSB at a time during each AD conversion with the reference signal generation section 27 while at the same time using the same count clock CKcnt1 for the counter section 254 as during the normal AD conversion. On the other hand, W is not limited to 2^M and may be an arbitrary positive integer equal to or greater than 2. It will be understood that it is advisable to make the slope of the reference signal SLP_ADC W times steeper and shift the sampling point in phase by 1/WLSB at a time during each AD conversion with the reference signal generation section 27 while at the same time using the same count clock CKcnt1 for the counter section 254 as during the normal AD conversion.

Solid-State Imaging Device

Eighth Embodiment

Figure 11:
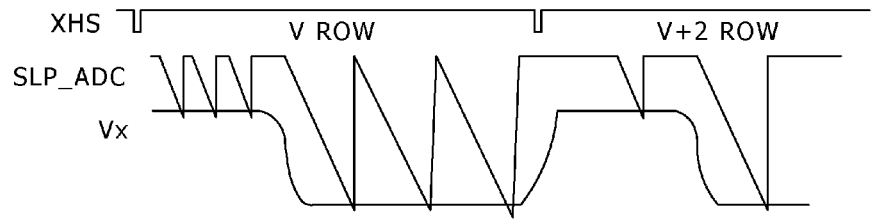
FIG. 11 is a timing diagram describing the operation of a solid-state imaging device according to an eighth embodiment.
Figure 11A:
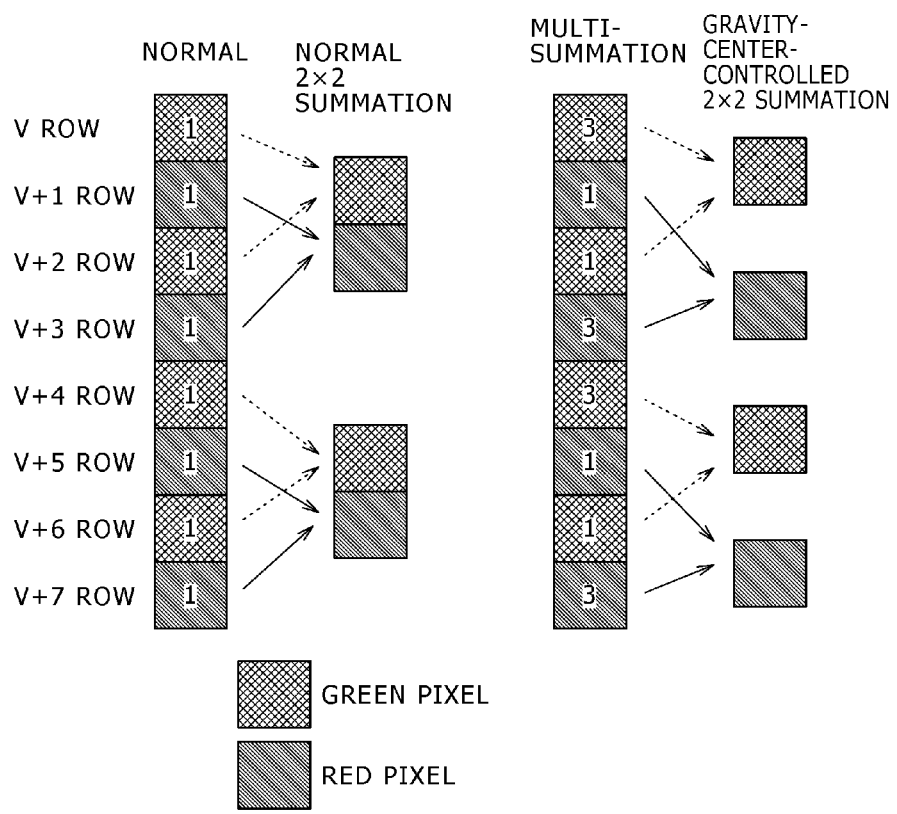
FIG. 11A is a diagram describing the effect of the operation of the solid-state imaging device according to the eighth embodiment.

FIGS. 11 and 11A are diagrams illustrating a solid-state imaging device according to an eighth embodiment. Here, FIG. 11 is a timing diagram describing the operation of a solid-state imaging device 1H according to the eighth embodiment. FIG. 11A is a diagram describing the effect of the operation of the solid-state imaging device 1H according to the eighth embodiment.

Although a schematic configuration diagram is not shown, the solid-state imaging device 1H according to the eighth embodiment will be described, for example, based on the arrangement according to the third embodiment. Here, the multi-summation AD conversion will be described based on the third embodiment. However, not only the third embodiment but also other embodiments are also applicable.

The eighth embodiment is designed to set a factor using the arrangement for the multi-summation AD conversion described in relation to the first to seventh embodiments during the summation or subtraction between a plurality of pixels, thus providing digital data of product sum calculation result of a plurality of target signals. Among possible applications are summation with gravity center adjustment function, edge detection using subtraction, spatial filtering and discrete cosine transform used for image compression. It should be noted that both the first and second embodiments may be used to average the calculation result.

It is possible to sum a plurality of pixel signals by using the same combination of counting modes and repeating the counting. It is also possible to calculate the difference between a plurality of pixel signals (subtract one pixel signal from another) by changing the combination of counting modes (more specifically, reversing the combination) and repeating the counting. At this time, repeating the multi-summation AD conversion W times on each of the P and D phases of each of the pixel signal voltages Vx provides W-fold multiplied data of that pixel signal voltage Vx. Letting the factor be denoted by Wk, and each piece of the pixel data by Dk, digital data Dout=W1·D1±W2·D2±W3·D3± and so on is obtained as a calculation result of the product sum of a plurality of pixels.

In order to achieve this, the solid-state imaging device 1H according to the eighth embodiment specifies the number of repetitions W. If the arrangement according to the third embodiment is used to do so, the communication/timing control section 20 supplies the count clock CKcntW to the counter section 254. The count clock CKcntW is W times higher in frequency than the count clock used during the normal AD conversion. The communication/timing control section 20 supplies the count clock CKdacW to the DA conversion unit 270. The count clock CKdacW is W times higher in frequency than the count clock used during the normal AD conversion.

In the case of 2×2 summation, for example, Japanese Patent Laid-Open No. 2006-174325 shows that the centers of gravity can be aligned by changing the weight ratio. At this time, the unit pixel 3 in the first row (V or V+1) are summed three times, and the same pixel 3 in the target row (V+2 or V+3) is counted as during the normal AD conversion, as illustrated in FIG. 11. These pieces of data for the two pixels are summed by the counter section 254 of the AD conversion section 250, thus allowing the counter section 254 to hold the data of (Vth row pixel×3)+((V+2)th row pixel×1).

It should be noted that the averaging of summation data may be achieved not only by the digital calculation section 29 (first embodiment) but also by bit shifting in the AD conversion section 250 (second embodiment).

FIG. 11A shows a conceptual rendering of the centers of gravity of the pixel signals obtained as a result. It is clear therefrom that the centers of gravity for each color are equidistant. As described above, if a plurality of pixels are summed, the summation ratio for reading out the pixels according to the color filter array is changed by using the multi-summation AD conversion. This makes it possible to control the centers of gravity after the summation.

It should be noted that although an example is shown here in which two rows are summed, it is possible to perform the summation and subtraction (product sum calculation including the signs and factors) of three or more rows using the up- and down-counting function of the counter section 254, thus providing calculation images in a variety of forms. As one form of application thereof, a one-dimensional spatial filtering function can be implemented without using any special circuit external to the column AD conversion section 26. For example, "1, −3, 1" or "−1, 3, −1" provides a spatial filter adapted to enhance the center pixel, and "−1, 0, 1" provides a differential filter. Further, a simple smoothing filter can be provided by summing the three pixels with their factors set to the same value. Still further, weighted summation enhancing the center pixel can be achieved by making the factor of the center pixel of the three pixels greater than that of the two other neighboring pixels.

Solid-State Imaging Device

Ninth Embodiment

FIG. 12 is a diagram describing a ninth embodiment. The ninth embodiment is an application of the arrangement for AD conversion adopted in the solid-state imaging device 1 according to the above-described embodiments to an imaging device which is an example of a physical information acquisition device. FIG. 12 is a schematic configuration diagram of such an imaging device 8.

The pixel signal voltage Vx of at least one pixel is subjected to the multi-summation AD conversion as an imaging device, as well, thus achieving an arrangement for noise reduction and wider dynamic range. At this time, at least the control parameters in relation to the multi-summation AD conversion such as the number of repetitions W, the frequencies of the count clocks CKcnt and CKdac and the slope of the reference signal SLP_ADC can be set as desired by specifying control instruction information in the communication/timing control section 20 from an external main control section. It is preferred that the normal reference signal comparison AD conversion with no multi-summation AD conversion can also be controlled.

More specifically, the imaging device 8 includes an imaging lens 802, optical low-pass filter 804, color filter group 812, pixel array section 10, drive control section 7, column AD conversion section 26, reference signal generation section 27 and camera signal processing unit 810. As shown by a dashed line in FIG. 12, an infrared cutting filter 805 may be provided together with the optical low-pass filter 804 to reduce the infrared component.

The imaging lens 802 guides light L carrying the image of a subject Z under illumination such as a fluorescent lamp or the sun onto the imaging device, thus forming an image. The color filter group 812 includes, for example, R, G and B color filters arranged in a Bayer pattern. The drive control section 7 drives the pixel array section 10. A readout current control section 24 controls the operating current of the pixel signal output from the pixel array section 10. The column AD conversion section 26 subjects the pixel signal output from the pixel array section 10 to CDS, AD conversion and other processes. The reference signal generation section 27 supplies the reference signal SLP_ADC to the column AD conversion section 26. The camera signal processing unit 810 processes the imaging signal output from the column AD conversion section 26.

The camera signal processing unit 810 provided at the subsequent stage of the column AD conversion section 26 includes an imaging signal processing block 820 and camera control block 900. The same block 900 serves as a main control block adapted to control the imaging device 8 as a whole. The imaging signal processing block 820 includes a signal separation section 822, color signal processing section 830, luminance signal processing section 840 and encoder section 860.

The signal separation section 822 has a primary color separation function adapted to separate a digital imaging signal supplied from the AD conversion function section into primary color signals of R (red), G (green) and B (blue) when color filters other than primary color filters are used. The color signal processing section 830 performs signal processing for a color signal C based on the primary color signals R, G and B separated by the signal separation section 822. The luminance signal processing section 840 performs signal processing for a luminance signal Y based on the primary color signals R, G and B separated by the signal separation section 822. The encoder section 860 generates a video signal VD based on the luminance signal Y/color signal C.

Although not illustrated, the color signal processing section 830 includes, for example, a white balance amplifier, gamma correction section and color difference matrix section. Although not illustrated, the luminance signal processing section 840 includes, for example, a high-frequency luminance signal generation section, low-frequency luminance signal generation section and luminance signal generation section. The high-frequency luminance signal generation section generates a luminance signal YH based on the primary color signals supplied from a primary color separation function section of the signal separation section 822. The luminance signal YH contains components up to relatively high frequency components. The low-frequency luminance signal generation section generates a luminance signal YL based on the white-balance-adjusted primary color signals supplied from the white balance amplifier. The luminance signal generation section generates a luminance signal Y based on the two luminance signals YH and YL, supplying the luminance signal Y to the encoder section 860.

The encoder section 860 digitally modulates color difference signals R-Y and B-Y with a digital signal associated with the color signal subcarrier first, and then combines these signals with the luminance signal Y generated by the luminance signal processing section 840, converting the above signals into a digital video signal VD(=Y+S+C; S is a synchronizing signal, C a chroma signal). The digital video signal VD output from the encoder section 860 is supplied to an unshown camera signal output section provided at the further subsequent stage of the encoder section 860 for output to a monitor or recording onto a recording medium. At this time, the digital video signal VD is converted to an analog video signal V through DA conversion as necessary.

The camera control block 900 according to the present embodiment includes a microprocessor 902, ROM (Read Only Memory) 904, i.e., a read-only storage section, RAM (Random Access Memory) 906 and other unshown peripheral members. The microprocessor 902 is similar to the core component of a computer, typically, a CPU (Central Processing Unit), in which the calculation and control functions performed by the computer are packed into ultrasmall integrated circuits. The RAM 906 is an example of a volatile storage section that is readable and writable at any time. The microprocessor 902, ROM 904 and RAM 906 may also be collectively referred to as a microcomputer.

The camera control block 900 controls the system as a whole and has a function to adjust the number of summations performed, the frequencies of the count clocks CKcnt and CKdac and the slope of the reference signal SLP_ADC for the multi-summation AD conversion. Although the ROM 904 stores programs including those adapted to control the camera control block 900, the ROM 904 stores the programs adapted to control the normal reference signal comparison AD conversion and multi-summation AD conversion particularly in the present example. The RAM 906 stores, for example, data required for the camera control block 900 to perform a variety of processes.

On the other hand, the camera control block 900 is configured in such a manner that a recording medium 924 such as memory card can be inserted thereinto and removed therefrom. Further, the camera control block 900 is configured to be able to connect to communications networks such as the Internet. For example, the camera control block 900 includes a memory readout section 907 and communication I/F (interface) 908 as well as the microprocessor 902, ROM 904 and RAM 906.

The recording medium 924 is used, for example, to store a variety of data. Such data includes program data required for the microprocessor 902 to run software, the convergence range of photometry data DL based on the luminance signal supplied from a luminance signal processing section 840 and settings of a variety of control information for exposure control (including electronic shutter control) and multi-summation AD conversion.

The memory readout section 907 installs the data read out from the recording medium 924 into the RAM 906. The communication I/F 908 acts as a mediator for data exchange with communications networks such as the Internet.

It should be noted that although the drive control section 7 and column AD conversion section 26 of the imaging device 8 configured as described above are shown to be in a modular form separate from the pixel array section 10, it is needless to say, as mentioned in relation to the solid-state imaging device 1, that the single-chip solid-state imaging device 1 may be used in which the above sections are formed integrally with the pixel array section 10 on the same semiconductor substrate. In FIG. 12, the imaging device 8 is shown to include optics such as the imaging lens 802, optical low-pass filter 804 or infrared cutting filter 805 in addition to the pixel array section 10, drive control section 7, column AD conversion section 26, reference signal generation section 27 and camera signal processing unit 810. This is suitable when all the above sections are packaged together into a modular form with imaging function.

As for the relationship with the modules of the above solid-state imaging device 1, the same device 1 may be made available in such a manner that the pixel array section 10 (imaging section) and the signal processing sections, closely related to the pixel array section 10 such as the column AD conversion section 26 with AD conversion and difference calculation (CDS) functions (excluding the camera signal processing section provided at the subsequent stage of the column AD conversion section 26), are packaged together into a modular form with imaging function as illustrated in FIG. 12. The camera signal processing unit 810, i.e., the remaining signal processing section, is provided at the subsequent stage of the solid-state imaging device 1 made available in a modular form to form the imaging device 8 as a whole.

Alternatively, although not illustrated, the solid-state imaging device 1 may be made available in such a manner that the pixel array section 10 and the optics such as the imaging lens 802 are packaged together into a modular form with imaging function. In addition to the solid-state imaging device 1 made available in a modular form, the camera signal processing unit 810 is provided inside the module to form the imaging device 8 as a whole. On the other hand, the camera signal processing unit 810 may be included in the modular form of the solid-state imaging device 1. In this case, the solid-state imaging device 1 and imaging device 8 can be virtually regarded as identical to each other. The imaging device 8 configured as described above is made available, for example, as a camera-equipped or imaging-capable mobile device adapted to perform "imaging." It should be noted that the term "imaging" refers not only to image capture during normal camera shooting but also, in a broad sense, to, for example, fingerprint detection.

The imaging device 8 configured as described above includes all the functions of the solid-state imaging device 1. Therefore, the imaging device 8 can be configured and operated in the same manner as the solid-state imaging device 1, thus making it possible to achieve an arrangement for performing not only the normal reference signal comparison AD conversion but also the multi-summation AD conversion.

Application to Electronic Equipment

FIG. 13 is a diagram describing a tenth embodiment. The tenth embodiment is an application of the arrangement for AD conversion adopted in the solid-state imaging device 1 according to the above-described embodiments to electronic equipment. That is, the tenth embodiment shows an example of application of the AD conversion method and AD conversion device according to the present invention to electronic equipment other than solid-state imaging devices. FIG. 13 is a schematic configuration diagram of electronic equipment.

Cases were described in relation to the first to ninth embodiments in which the multi-summation AD conversion adapted to repeat the reference signal comparison AD conversion W times on the same signal is applied to the solid-state imaging device 1 and imaging device 8. However, the scope of application is not limited to solid-state imaging devices. The multi-summation AD conversion based on the reference signal comparison AD conversion is applicable to all kinds of electronic equipment requiring a data processing arrangement adapted to acquire digital data of product sum calculation result of a plurality of signals having the same physical characteristics. Performing the multi-summation AD conversion on at least one target signal as electronic equipment provides reduced noise, higher gain and wider dynamic range.

Illustrated electronic equipment 700 has a variety of processing functions based on product sum result including diagnosing the solid-state imaging device 1 for defective pixels and detecting moving objects. More specifically, the electronic equipment 700 includes, first of all, a signal generation section 701 adapted to generate a target analog signal. The signal generation section 701 is configured to use the pixel signal voltage Vx, output from the pixel array section 10 of the solid-state imaging device 1, as a target signal. That is, the pixel signal (pixel signal voltage Vx), output from the pixel array section 10 of the solid-state imaging device 1, is used as a target signal in the present embodiment as in the first to ninth embodiments. It should be noted, however, that this is merely an example. The target signal may be not only the pixel signal but also a desired signal so long as this signal has the same physical characteristics so as to allow for product sum calculation.

The electronic equipment 700 also includes a control device 702 arranged on the left of the parting line shown at the center of FIG. 13 and an AD converter 705 arranged on the right of the parting line. The control device 702 uses, for example, a personal computer to control the operation of the electronic equipment 700 as a whole. The AD converter 705 is supplied with the pixel signal voltage Vx from the signal generation section 701. It should be noted that the control device 702 and AD converter 705 may be combined as a single AD conversion unit 706 (AD converter) with the functions of a data processing device adapted to acquire digital data of product sum calculation result of a plurality of signals rather than separating the control device 702 and AD converter 705 with the parting line.

The AD conversion unit 706 (AD converter 705) includes a comparison section 752 and counter section 754. The comparison section 752 converts the analog pixel signal loaded from the signal generation section 701 (solid-state imaging device 1) into digital data. The comparison section 752 corresponds to the comparison section 252, and the counter section 754 to the counter section 254. The comparison section 752 and counter section 754 operate in the same manner as their counterparts according to the first to eighth embodiments.

The control device 702 includes, as functional elements adapted to control the AD converter 705, a reference signal generation section 727 and timing control section 720. The reference signal generation section 727 supplies an AD conversion reference voltage to the comparison section 752. The timing control section 720 controls the reference signal generation section 727 and counter section 754. The timing control section 720 corresponds to the timing control section 20, and the reference signal generation section 727 to the reference signal generation section 27. The timing control section 720 and reference signal generation section 727 operate in the same manner as their counterparts according to the first to eighth embodiments.

The control device 702 includes a data storage section 728 and determination/diagnosis section 730. The data storage section 728 holds one of the data to be subjected to product sum calculation. The determination/diagnosis section 730 diagnoses the solid-state imaging device 1 based on product sum calculation result data D8 obtained by the counter section 754 and handles other determination processes.

In order to achieve the function to diagnose the solid-state imaging device 1 for defective pixels in the electronic equipment 700 configured as described above, pixel data (referred to as normal condition data) of the (defect-free) solid-state imaging device 1 in a normal condition to be compared against is obtained. Then, a pixel signal is read out from the solid-state imaging device 1 to be diagnosed. The difference between the pixel signal and normal condition data is calculated, thus diagnosing the presence or absence of defects based on the result. For example, the solid-state imaging device 1 should be diagnosed, for example, for dark and light defects as pixel defects. For diagnosis for dark defects, normal condition data acquisition and diagnosis are performed with the solid-state imaging device 1 in a non-exposure condition. For diagnosis for light defects, on the other hand, data acquisition and diagnosis are performed, for example, with the solid-state imaging device 1 in a totally white shooting condition.

In order to obtain normal condition data, the AD converter 705 (AD conversion unit 706) obtains the pixel signal voltage Vx from the solid-state imaging device 1 in a normal condition to be compared and compares the reference signal SLP_ADC and pixel signal voltage Vx using the comparison section 752 in the same manner as described in relation to the first and other embodiments.

It should be noted that, in the present embodiment, the timing control section 720 instructs the counter section 754 and reference signal generation section 727 to perform the multi-summation AD conversion W times and average the AD conversion result in a manner commensurate with the number of repetitions W to obtain normal condition data. This means that the pixel signal voltage Vx is converted into digital data with high gain followed by restoration of the digital data to its normal level with high gain by repeating the AD conversion on the pixel signal voltage Vx W times.

The counter section 754 begins its counting in the counting mode specified by the timing control section 720 based on a count clock CK0 (e.g., CKcnt1 during the normal AD conversion and CKcntW during the multi-summation AD conversion) simultaneously with the generation of the reference signal SLP_ADC by the reference signal generation section 727. Here, the timing control section 720 sets the counter section 754 to down-counting mode during the counting of the reset level and to up-counting mode during the counting of the signal level. This means that positive data is obtained as pixel data commensurate with the signal component Vsig.

The counter section 754 counts the count clock CK0 from when the reference signal SLP_ADC used for the comparison by the comparison section 752 is generated to when the pixel signal voltage Vx and reference signal SLP_ADC match. The counter section 754 stores the factor result in the data storage section 728 in association with the pixel positions as its own storage data D9a. The AD converter 705 repeats these processes on all the pixels of the imaging signals.

It should be noted that normal condition data need not necessarily be obtained by using the AD converter 705. Alternatively, for example, normal condition data may be obtained by external equipment so that storage data D9b supplied from this external equipment is stored in the data storage section 728 in association with the pixel positions. Still alternatively, normal condition data may be constant (invariable) irrespective of the pixel positions. In this case, it is not necessary to obtain normal condition data.

During diagnosis for dark and light defects, the solid-state imaging device 1 is brought into the predetermined exposure condition according to each diagnosis. The timing control section 720 should preferably instruct that the multi-summation AD conversion be performed W times. During diagnosis for dark defects, data with higher gain is obtained with no sum averaging. During diagnosis for light defects, on the other hand, normal condition data is obtained by performing the sum averaging.

For example, the timing control section 720 sets the counter section 754 to up-counting mode for the reset level and down-counting mode for the signal level first. This means that negative data is obtained as pixel data commensurate with the signal component Vsig. Further, the timing control section 720 instructs the reference signal generation section 727 to make the slope of the reference signal SLP_ADC W times steeper than during the normal AD conversion. Further, the timing control section 720 instructs the counter section 754 to repeat the AD conversion W times at a speed W times faster than during the normal AD conversion. This means that W-fold multiplied data of negative data is obtained as pixel data commensurate with the signal component Vsig by converting the pixel signal voltage Vx into digital data with the same gain as during the normal AD conversion and repeating this AD conversion W times.

The timing control section 720 issues an initial value control signal CN7 to the counter section 754, instructing the same section 754 to read out normal condition pixel data of the same pixel position as the target pixel position from the data storage section 728, and use this data as the initial value of the counting. The AD converter 705 obtains the analog pixel signal voltage Vx from the solid-state imaging device 1 to be diagnosed. First, the comparison section 752 compares the reference signal SLP_ADC, that is supplied from the reference signal generation section 727 and that varies with the given slope, against the pixel signal voltage Vx. The counter section 754 counts the count clock CK0 based on the comparison result.

The determination/diagnosis section 730 uses product sum calculation data D8 as defect determination data to determine where there are any defective pixels. The product sum calculation data D8 indicates the difference between the normal and operating conditions represented by the count value obtained by the counter section 754. Here, the value obtained by subtracting the operating condition pixel data from the normal condition pixel data is obtained as the counting result. When there are no pixel defects, the count value obtained is likely sufficiently small due to error and noise components. In contrast, if there are pixel defects, a large difference occurs between the normal and operating condition pixel data. In order to prevent erroneous determination during pixel defect determination due to error and noise components, therefore, the determination/diagnosis section 730 should determine that there are pixel defects if the product sum calculation data D8 obtained by the counter section 754 is equal to or greater than a fixed value.

As described above, when the electronic equipment 700 is applied to pixel defect diagnosis, the AD conversion unit 706 made up of the comparison section 752 and counter section 754 is used to calculate the difference in pixel data between the device in a normal condition and that to be diagnosed. This provides digital data representing the difference between the normal and operating conditions directly as the output of the counter section 754 during the AD conversion of the operating condition pixel signal in the same manner as described in relation to the first to eighth embodiments. Applying the W-time multi-summation AD conversion allows for pixel defect diagnosis using diagnosis data with excellent S/N. During diagnosis for dark defects, data of sufficient level for diagnosis is obtained by using the gain enhancement function achieved by the multi-summation AD conversion.

It should be noted that although the W-time multi-summation AD conversion was described here by taking an application to pixel defect diagnosis as an example, the application of the W-time multi-summation AD conversion is not limited thereto. In order to achieve moving object detection, for example, the pixel signal voltage Vx of the current frame is read out from the solid-state imaging device 1. Then, the difference is calculated between the same voltage Vx and the pixel signal voltage Vx of the previous frame, thus detecting a moving object based on the difference calculation result. At this time, applying the W-time multi-summation AD conversion provides moving object detection data with excellent S/N.

First Comparative Example

Figure 14:
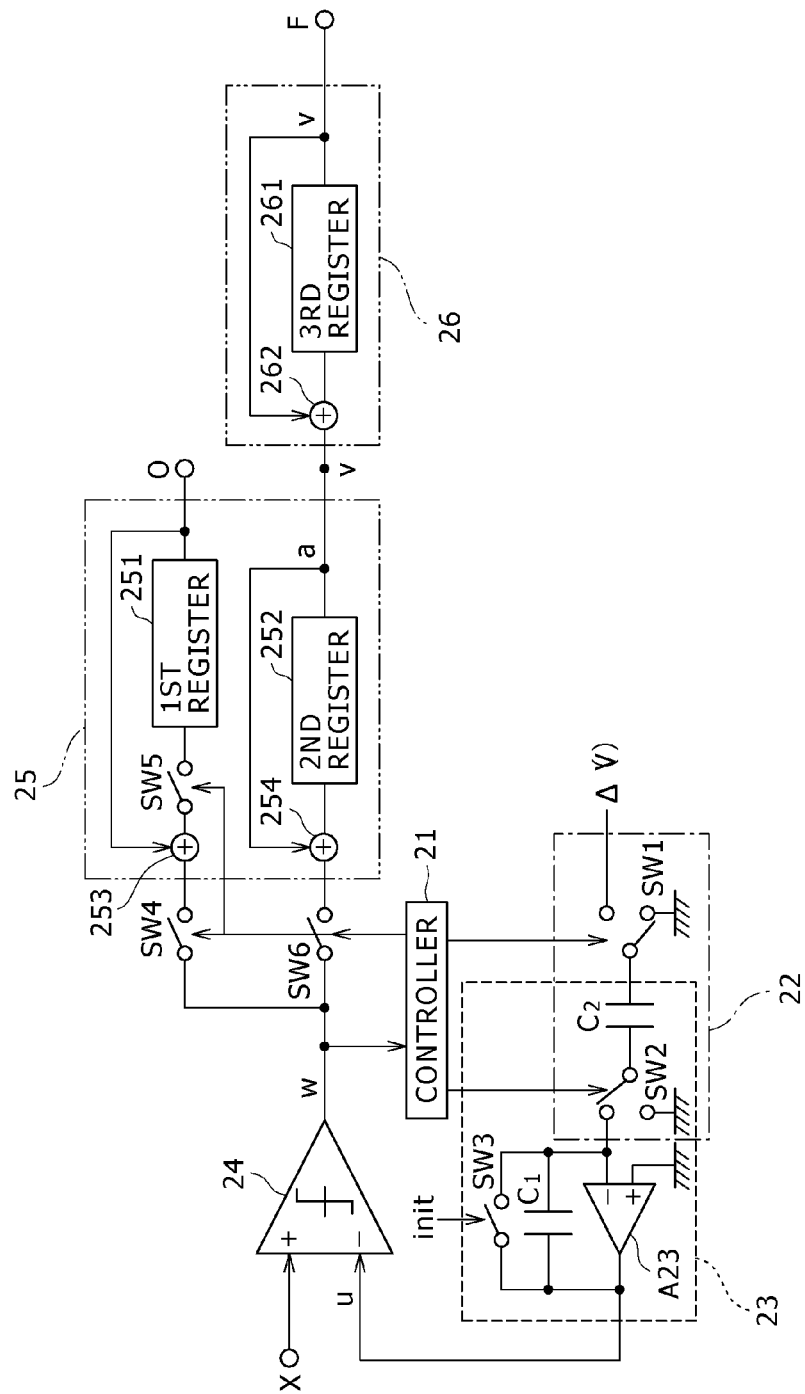
FIG. 14 is a diagram (1) describing a first comparative example.

FIGS. 14 and 14A are diagrams describing a first comparative example. The first comparative example is an arrangement described in Japanese Patent Laid-Open No. 2006-222782. As illustrated in FIG. 14, the first comparative example is a multi-integration AD converter that includes two stages of digital integrators. A high-resolution integrator is used as the second stage integrator, thus providing improved noise characteristic thanks to averaging.

However, two-stage configuration leads to more registers and requires a comparison voltage generation circuit in each column, thus resulting in larger circuit scale and layout. Further, if the column AD scheme is used in which a circuit adapted to generate the reference signal SLP_ADC (corresponds to the reference signal generation section 27 in the present embodiment) is shared, it is necessary to specify an averaging mode for each pixel as illustrated in FIG. 14A. Therefore, this is impossible to achieve if the common reference signal SLP_ADC is shared among columns. In contrast, the arrangement according to the present embodiments allows for multi-integration using the common reference signal SLP_ADC shared among columns.

Second Comparative Example

Figure 15:
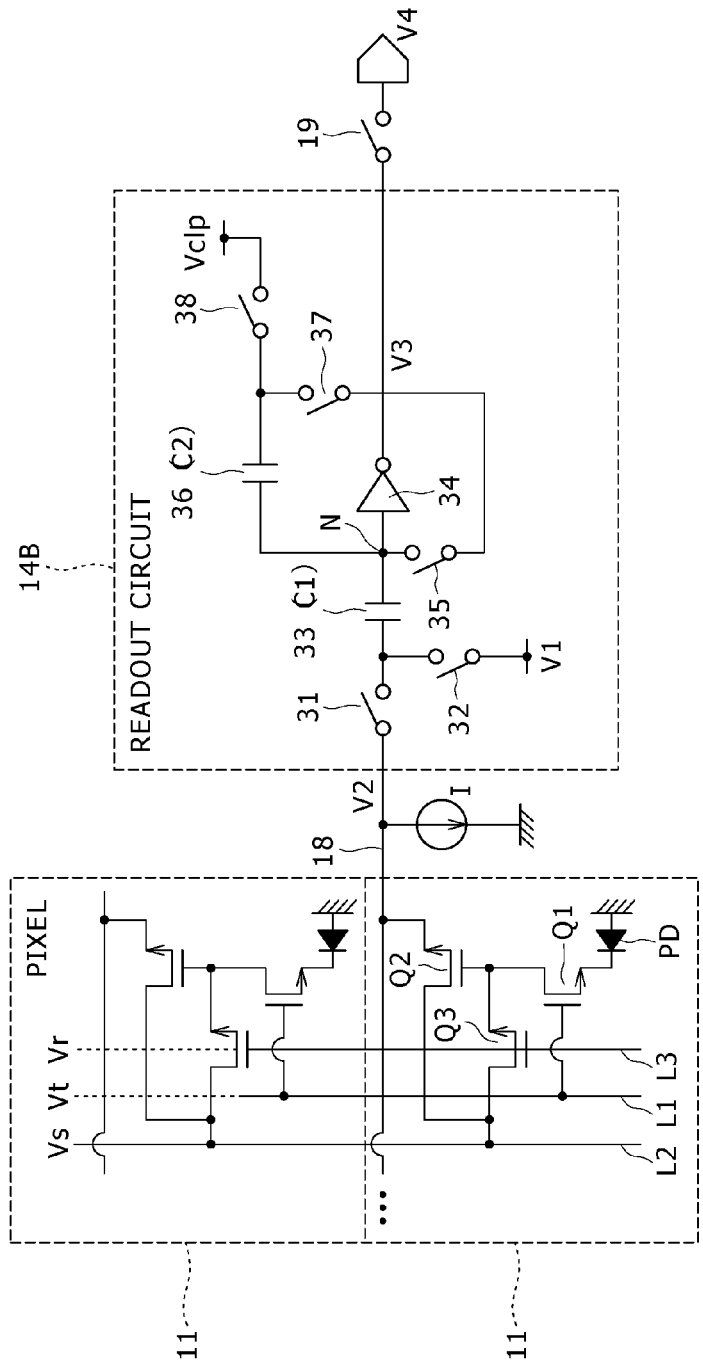
FIG. 15 is a diagram (1) describing a second comparison example.
Figure 15A:
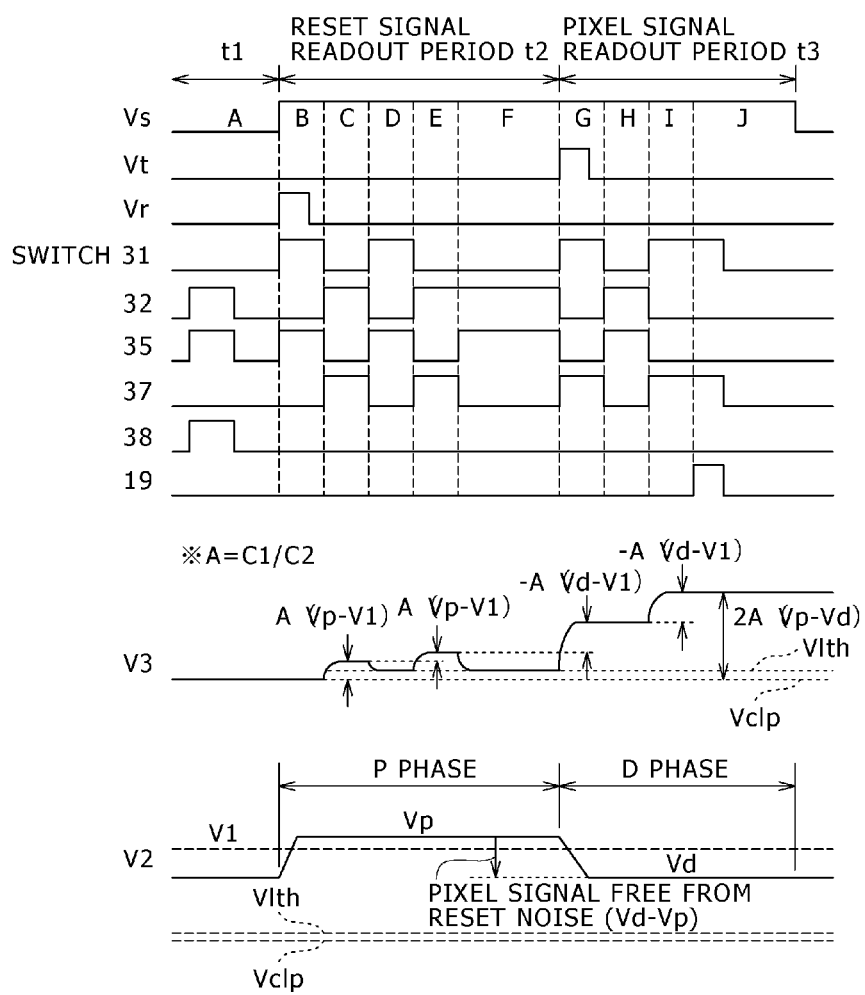
FIG. 15A is a diagram (2) describing the second comparison example.

FIGS. 15 and 15A are diagrams describing a second comparative example. The second comparative example is an arrangement described in Japanese Patent Laid-Open No.

2005-269471. As illustrated in FIG. 15, the second comparative example is designed to sum and read out a plurality of reset and signal voltages using a capacitive amplifier column processing circuit.

In this case, however, analog values are summed as illustrated in FIG. 15A. Therefore, the limitation of the summation output voltage is determined by the source voltage, thus limiting the number of summations (number of averagings), i.e., the dynamic range. In contrast, the arrangement according to the present embodiments performs summations in the digital domain. As a result, the number of summations and the dynamic range are not limited by the source voltage although, for example, the counter section 254 and data storage section 256 need to be as many bits wide as it takes for the number of summations.

Third Comparative Example

Figure 16:
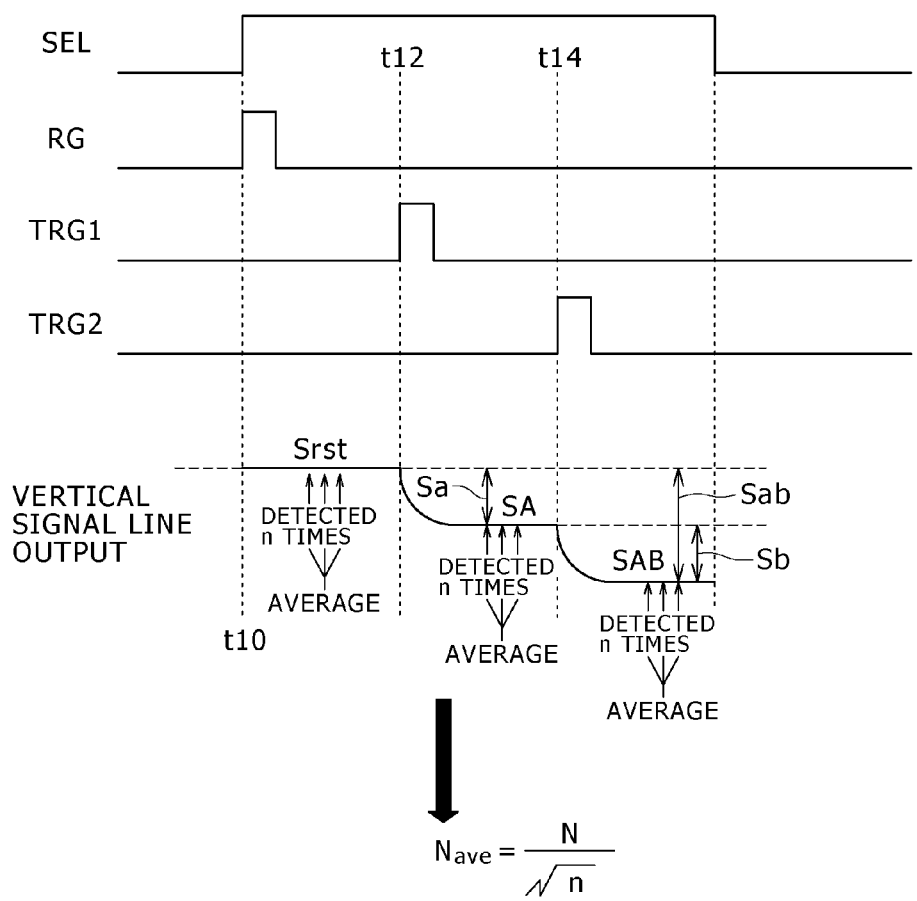
FIG. 16 is a diagram describing a third comparison example.

FIG. 16 is a diagram describing a third comparative example. The third comparative example is an arrangement described in Japanese Patent Laid-Open No. 2006-080937. As illustrated in FIG. 16, the third comparative example is a shared pixel type, providing improved S/N by summation for use under low luminance and low exposure time conditions.

However, because analog values are summed, the limitation of the summation output voltage is determined by the source voltage, thus limiting the number of summations and dynamic range as in the second comparative example. In contrast, the number of summations and the dynamic range are not limited by the source voltage in the arrangement according to the present embodiments as described in relation to the second comparative example.

Fourth Comparative Example

Figure 17:
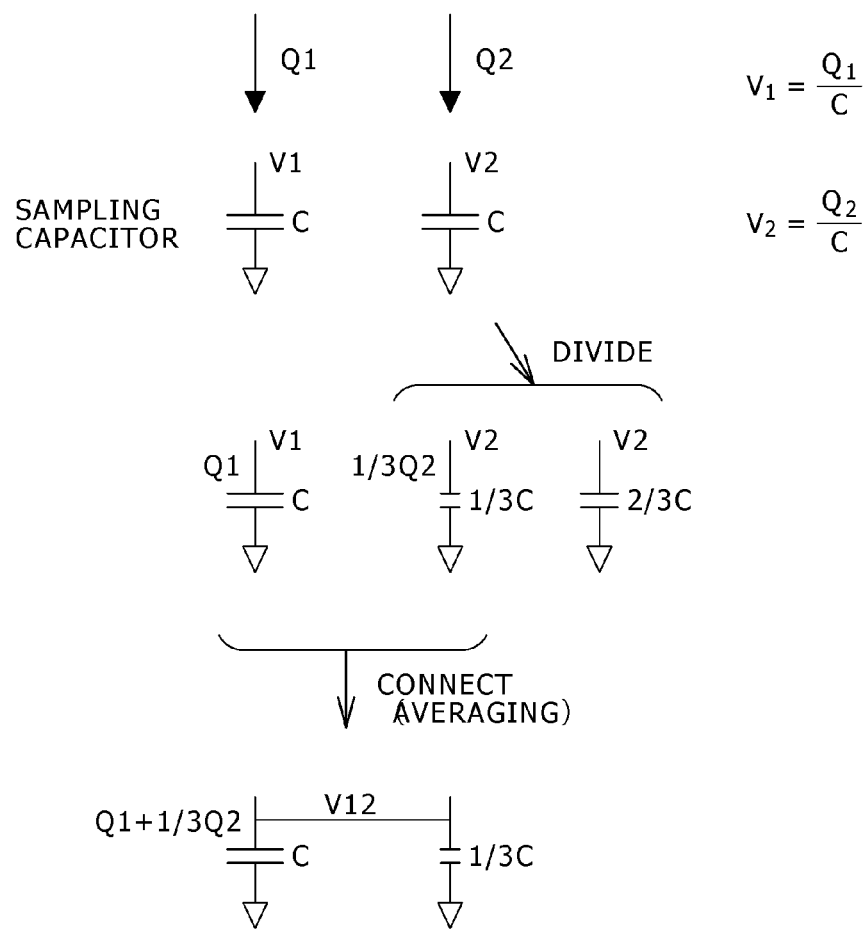
FIG. 17 is a diagram (1) describing a fourth comparison example.
Figure 17A:
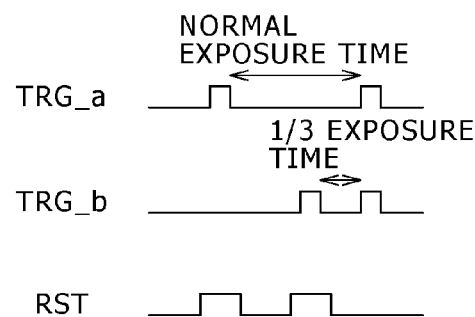
FIG. 17A is a diagram (2) describing the fourth comparison example.
Figure 17B:
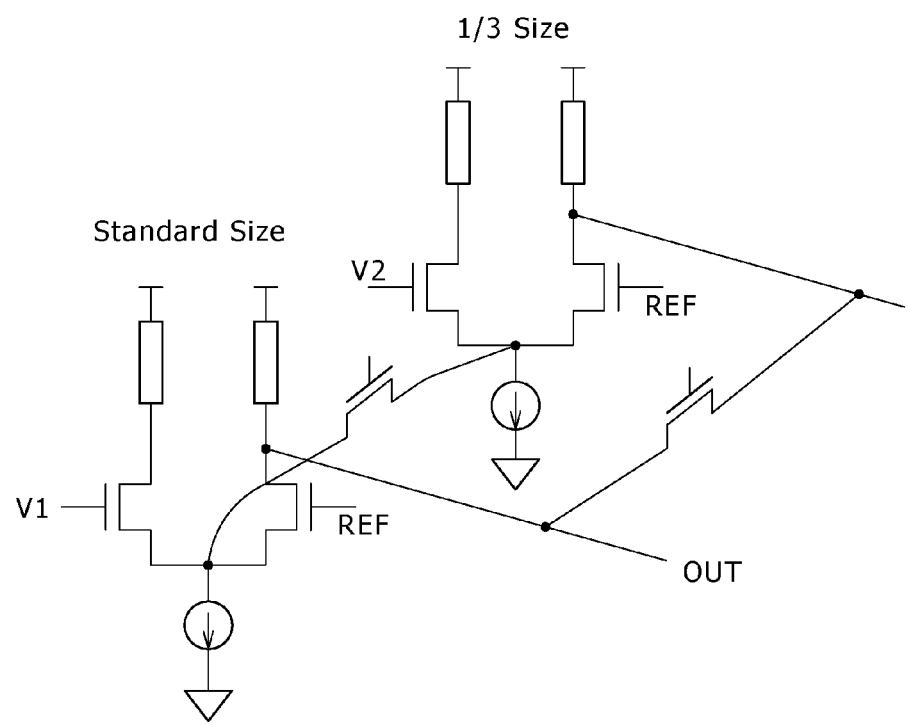
FIG. 17B is a diagram (3) describing the fourth comparison example.
Figure 18:
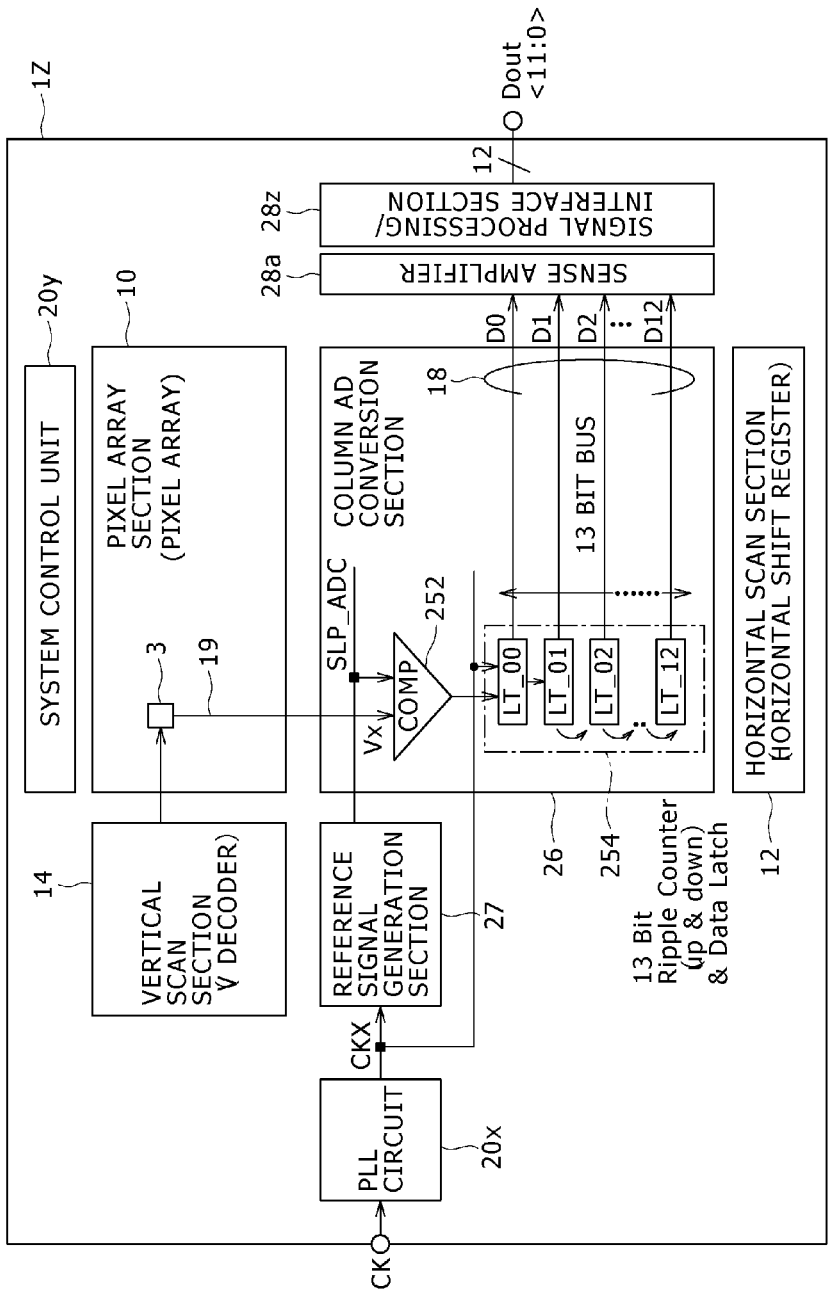
FIG. 18 is a diagram illustrating a configuration example of a conventional solid-state imaging device using a reference signal comparison AD conversion scheme.

FIGS. 17 to 17B are diagrams describing a fourth comparative example. The fourth comparative example is an arrangement described in Japanese Patent Laid-Open No. 2006-174325. The fourth comparative example is designed to change the capacitance ratio (refer to FIG. 17), accumulation time (refer to FIG. 17A) or amplification factor of the amplifier (refer to FIG. 17B) for weight assignment during summation of a plurality of pixels.

However, these schemes require an additional sampling capacitor and amplification circuit. Further, it is, for example, necessary to vary the accumulation time and signal level linearly even if other method is used. In contrast, the arrangement according to the present embodiments need only perform summations in the digital domain, thus requiring no changes to the capacitance ratio, accumulation time, amplification factor of the amplifier and so on.

Fifth Comparative Example

Although not illustrated, an arrangement described (referred to as a fifth comparative example), for example, in Japanese Patent Laid-Open No. 2006-33454 sums the pixel signals with first and second accumulation times, thus providing an image with a wider dynamic range. This scheme is designed, in short, to sum the signals of the same pixel with different accumulation times, thus providing a wider range of output pixel data. This scheme is completely different in concept from the arrangement according to the present embodiments that performs a plurality of summations for each of the P and D phases of the same pixel (i.e., same accumulation time).

EXPLANATION OF REFERENCE NUMERALS

1: Solid-state imaging device
10: Pixel array section
12: Horizontal scan section
14: Vertical scan section
18: Horizontal signal line
19: Vertical signal line
20: Communication/timing control section
250: AD conversion section
252: Comparison section
254: Counter section
256: Data storage section
258: Switch section
26: Column AD conversion section
27: Reference signal generation section
270: DA conversion unit
28: Output section
29: Digital calculation section
3: Unit pixel
302: Current source section
312: Counter section
314: Offset generation section
340, 342: Resistor elements
344: Switch
346: Current-voltage conversion section
7: Drive control section
700: Electronic equipment
701: Signal generation section
702: Control device
705: AD converter
706: AD conversion unit
720: Timing control section
727: Reference signal generation section
728: Data storage section
730: Determination/diagnosis section
752: Comparison section
754: Counter section
8: Imaging device
900: Camera control block (main control block)

The invention claimed is:

1. A solid-state imaging device, comprising:
an analog to digital (A/D) conversion unit, the A/D conversion unit comprising:
a reference signal generation section that generates a reference signal whose level changes gradually; and
a counter section that performs a counting based on a count clock and a result of the comparison of the reference signal and a target analog signal, the A/D conversion unit obtaining digital data of the target analog signal based on output data of the counter section; and
a drive control section that controls the reference signal generation section and the A/D conversion unit to perform a digital integration that repeats an n-bit A/D conversion on the target analog signal W times, where W is a positive integer equal to or greater than 2.

2. The solid-state imaging device of claim 1, wherein the drive control section switches between the normal A/D conversion adapted to perform the n-bit A/D conversion on the target analog signal once and the digital integration.

3. The solid-state imaging device of claim 1, comprising:
a pixel array section having unit pixels, adapted to output the target analog signal, arranged in a matrix form,
wherein,
the A/D conversion unit is provided for each column of the pixel array section, and the reference signal generation section supplies the reference signal commonly to the comparison sections in the respective columns.

4. The solid-state imaging device of claim 3, wherein:
the target analog signal output from the unit pixels contains a reset level and signal level, and
the drive control section exercises control so that the digital integration is performed on each of the reset and signal levels, and so that the difference is calculated between two pieces of digital data obtained by the digital integration, one for the reset level and another for the signal level.

5. The solid-state imaging device of claim 1 comprising:
an averaging section that averages digital data, obtained by the digital integration, in a manner commensurate with the W times, wherein the averaging section is provided at a subsequent stage of the A/D conversion unit.

6. The solid-state imaging device of claim 5, wherein the A/D conversion unit comprises:
an "n+M"-bit-wide counter section that satisfies the inequality $2^{(M-1)}<W\leq 2 \mu M$, where M is an integer equal to or greater than 1;
an n-bit-wide data storage section that loads and stores data based on a load control signal that defines the load timing; and
a data selection section that selects the higher n bits of the "n+M" bits of data output from the counter section based on a switch control signal that defines the connection timing and deliver the selected bits of data to the data storage section,
wherein,
the function of the averaging section is implemented by the data storage section and data selection section.

7. The solid-state imaging device of claim 6 comprising:
a common wire that connects together the data input ends of the data storage sections,
wherein,
the data selection section has switches each between the data output end of the counter section and the common wire to switch input and output connections based on the switch control signal, and
the drive control section sequentially switches the switch control signals and load control signals in association with the bit positions of data output from the data output end of the counter section for delivery to the data storage section.

8. The solid-state imaging device of claim 6, wherein:
the data selection section has switches having at least the two or more input ends for each bit position of the data storage section, with each of the switches having its input end connected to the data output end of the counter section, its output end connected to the data input end of the data storage section, and whose input and output connections can be switched based on the switch control signals,
each of the input ends of the switches is connected in association with the bit position of the data output from the data output end of the counter section for delivery to the data storage section, and
the drive control section switches the switch control signal and load control signal so that data is transferred all together from the counter section to the data storage section irrespective of the data bit positions.

9. The solid-state imaging device of claim 6, wherein the data selection section selects the lower n bits of the "n+M" bits of data output from the counter section during the normal A/D conversion adapted to perform the n-bit A/D conversion on the target analog signal once.

10. The solid-state imaging device of claim 1, wherein:
the drive control section controls the reference signal generation section to make the slope of the reference signal W times steeper during the digital integration than during the normal A/D conversion adapted to perform the n-bit A/D conversion on the target signal once, and
wherein
the drive control section controls the counter section to perform the counting W times faster during the digital integration than during the normal A/D conversion.

11. The solid-state imaging device of claim 10 comprising:
the reference signal generation section, wherein the reference signal generation section has a counter section adapted to perform the counting in response to a count clock supplied for reference signal generation and varies the reference signal level for each count value output from the counter section, and wherein the counter section uses, as the count clock for the reference signal generation, a count clock having a frequency W times higher during the digital integration than during the normal A/D conversion.

12. The solid-state imaging device of claim 10, wherein the reference signal generation section comprises:
a counter section that performs the counting in response to a count clock supplied for reference signal generation;
a current source section that outputs a current with a weight commensurate with the count value output from the counter section; and
a current-voltage conversion section having a resistor element and that generates a voltage signal commensurate with a current, output from the current source section, flowing through the resistor element, and the current-voltage conversion section whose resistance can be changed during current-voltage conversion,
wherein,
the counter section uses, as the count clock for the reference signal generation, a count clock having the same frequency during the digital integration as during the normal A/D conversion, and
the current-voltage conversion section increases the resistance for current voltage conversion W times during the digital integration than during the normal A/D conversion.

13. The solid-state imaging device of claim 10, wherein the reference signal generation section comprises:
a counter section that performs the counting in response to a count clock supplied for reference signal generation;
a current source section that outputs a current with a weight commensurate with the count value output from the counter section; and
a current-voltage conversion section having a resistor element and that generates a voltage signal commensurate with a current, output from the current source section, flowing through the resistor element, and the current-voltage conversion section whose resistance can be changed during current-voltage conversion,
wherein,
the counter section uses, as the count clock for the reference signal generation, a count clock having the same frequency during the digital integration as during the normal A/D conversion, and
the current source section increases the weight associated with the count value W times during the digital integration than during the normal A/D conversion.

14. The solid-state imaging device of claim 1, wherein the reference signal generation section reverses the direction of variation of the reference signal between odd- and even-numbered A/D conversions of the digital integration.

15. The solid-state imaging device of claim 14, wherein the counter section of the reference signal generation section is configured to be capable of switching between down-counting and up-counting modes so that the direction of variation of the reference signal is reversed by changing the counting mode between odd- and even-numbered A/D conversions.

16. The solid-state imaging device of claim 1, wherein the A/D conversion unit has the n-bit-wide counter section, wherein the drive control section controls the reference signal generation section to make the slope of the reference signal W times steeper with W satisfying the inequality $2^{\wedge}(M-1)<W\leq 2$ μM during the digital integration than during the normal A/D conversion adapted to perform the n-bit A/D conversion on the target signal once, wherein the drive control section controls the counter section to perform the counting at the same speed as during the normal A/D conversion and with "n-M"-bit accuracy in each A/D conversion, and wherein the drive control section controls the reference signal generation section and counter section to shift the count clocks for the reference signal and A/D conversion in phase relatively by 1/WLSB for each A/D conversion.

17. An imaging device comprising:
a pixel array section having unit pixels arranged in a matrix form, each of the unit pixels having a charge generation section and a transistor that outputs a target signal containing reset and signal levels commensurate with a signal charge generated by the charge generation section;
a reference signal generation section that generates a reference signal whose level changes gradually;
an A/D conversion unit, the A/D conversion unit comprising:
  a comparison section that compares each of the reset and signal levels of the target signal against the reference signal output from the reference signal generation section, and
  a counter section that performs a counting based on a count clock and a result of the comparison of each of the reset and signal levels of the target signal against the reference signal, the A/D conversion unit obtaining digital data which is a difference between the reset and signal levels based on the output data of the counter section, and the A/D conversion unit being provided one for each column of the pixel array section, the imaging device further comprising:
a drive control section that controls the reference signal generation section and A/D conversion unit to perform a digital integration that repeats an n-bit A/D conversion on the reset and signal levels W times, where W is a positive integer equal to or greater than 2; and
a main control section that controls the drive control section.

18. Electronic equipment, comprising:
a signal generation section that generates a target analog signal;
a reference signal generation section that generates a reference signal whose level changes gradually;
a comparison section that compares the target analog signal generated by the signal generation section and the reference signal supplied from the reference signal generation section;
a counter section that performs a counting based on the comparison of the target analog signal and the reference signal in response to a count clock supplied for analog to digital (A/D) conversion; and
a control section that controls the reference signal generation section, comparison section, and counter section to perform a digital integration that repeats an n-bit A/D conversion on the same target analog signal W times, where W is a positive integer equal to or greater than 2.

19. An analog to digital (A/D) converter, comprising:
a reference signal generation section that generates a reference signal whose level changes gradually;
a comparison section that compares a target analog signal and the reference signal generated by the reference signal generation section;
a counter section that performs the counting based on a result of the comparison of the target analog signal and the reference signal by the comparison section in response to a count clock supplied for A/D conversion; and
a control section that controls the reference signal generation section, comparison section and counter section to perform a digital integration that repeats an n-bit A/D conversion on the target analog signal W times, where W is a positive integer equal to or greater than 2.

20. An A/D conversion method, comprising:
comparing a reference signal whose level changes gradually and a target analog signal with a comparison section;
performing a counting based on a count clock and a result of the comparison of the target analog signal and the reference signal; and
repeating an n-bit A/D conversion on the target analog signal W times, where W is a positive integer equal to or greater than 2, to obtain digital data of the target analog signal based on output data of the counting.

* * * * *